United States Patent
Tsai et al.

(10) Patent No.: US 11,088,251 B2
(45) Date of Patent: Aug. 10, 2021

(54) SOURCE/DRAIN CONTACTS FOR SEMICONDUCTOR DEVICES AND METHODS OF FORMING

(71) Applicant: Taiwan Semiconductor Manufacturing Company, Ltd., Hsinchu (TW)

(72) Inventors: Ching-Wei Tsai, Hsinchu (TW); Yi-Bo Liao, Hsinchu (TW); Cheng-Ting Chung, Hsinchu (TW); Yu-Xuan Huang, Hsinchu (TW); Kuan-Lun Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 64 days.

(21) Appl. No.: 16/590,128

(22) Filed: Oct. 1, 2019

(65) Prior Publication Data

US 2021/0098583 A1 Apr. 1, 2021

(51) Int. Cl.
| | |
|---|---|
| *H01L 29/417* | (2006.01) |
| *H01L 29/45* | (2006.01) |
| *H01L 29/40* | (2006.01) |
| *H01L 29/66* | (2006.01) |
| *H01L 29/78* | (2006.01) |
| *H01L 29/423* | (2006.01) |

(52) U.S. Cl.
CPC ...... *H01L 29/41791* (2013.01); *H01L 29/401* (2013.01); *H01L 29/456* (2013.01); *H01L 29/6681* (2013.01); *H01L 29/66553* (2013.01); *H01L 29/7853* (2013.01); *H01L 29/42392* (2013.01); *H01L 2029/7858* (2013.01)

(58) Field of Classification Search
CPC .. H01L 29/4179; H01L 29/401; H01L 29/456
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |

*Primary Examiner* — Douglas M Menz
(74) *Attorney, Agent, or Firm* — Slater Matsil, LLP

(57) ABSTRACT

A semiconductor device includes a first source/drain region and a second source/drain region disposed on opposite sides of a plurality of conductive layers. A dielectric layer overlies the first source/drain region, the second source/drain region, and the plurality of conductive layers. An electrical contact extends through the dielectric layer and the first source/drain region, where a first surface of the electrical contact is a surface of the electrical contact that is closest to the substrate, a first surface of the plurality of conductive layers is a surface of the plurality of conductive layers that is closest to the substrate, and the first surface of the electrical contact is closer to the substrate than the first surface of the plurality of conductive layers.

20 Claims, 56 Drawing Sheets

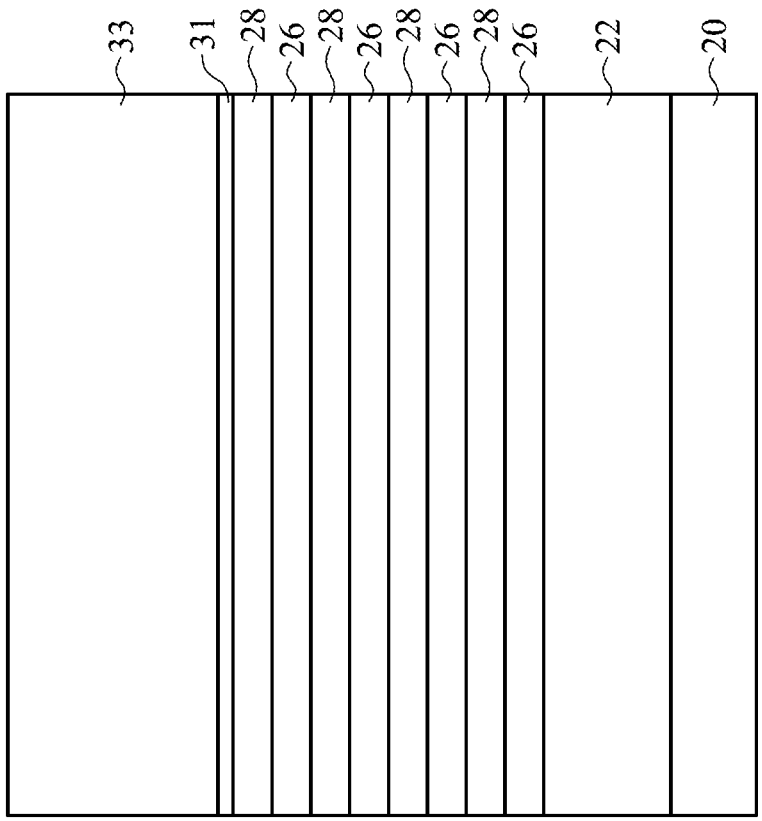
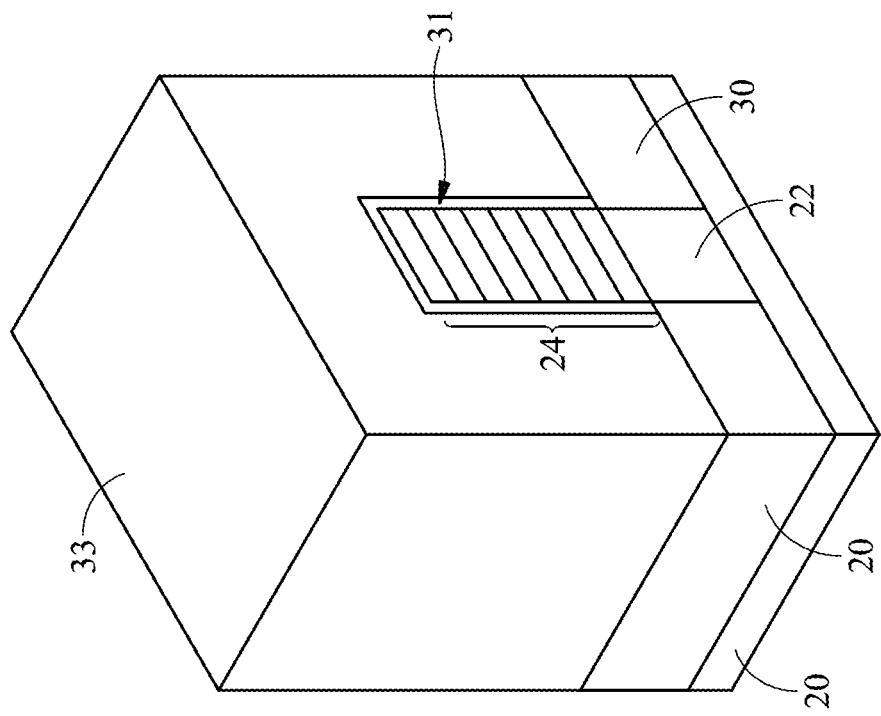
FIG. 6B
FIG. 6A

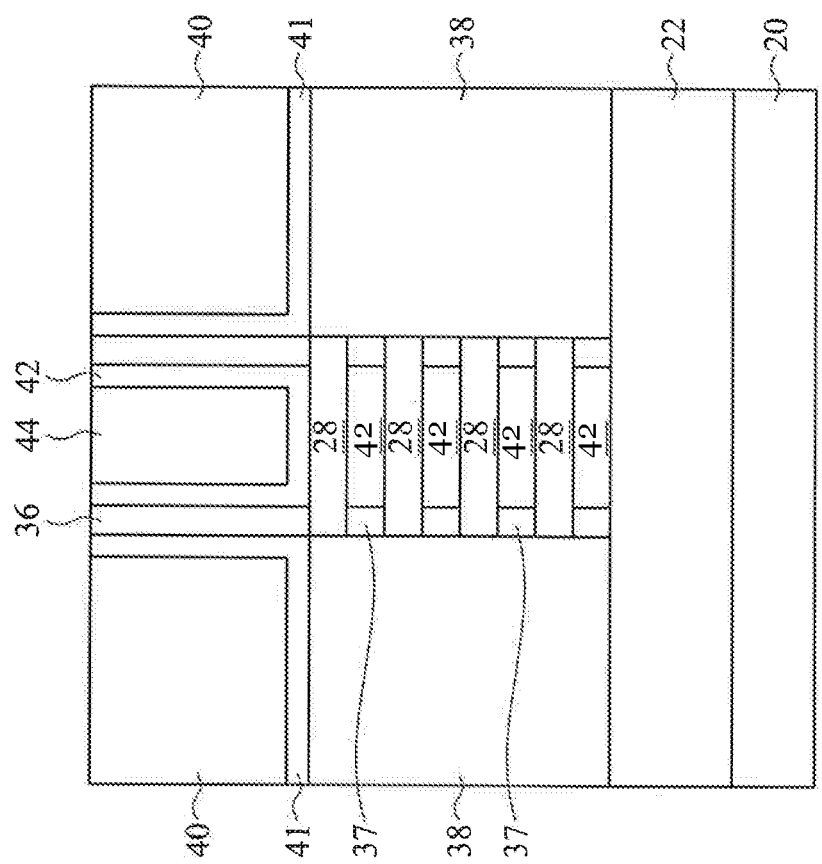
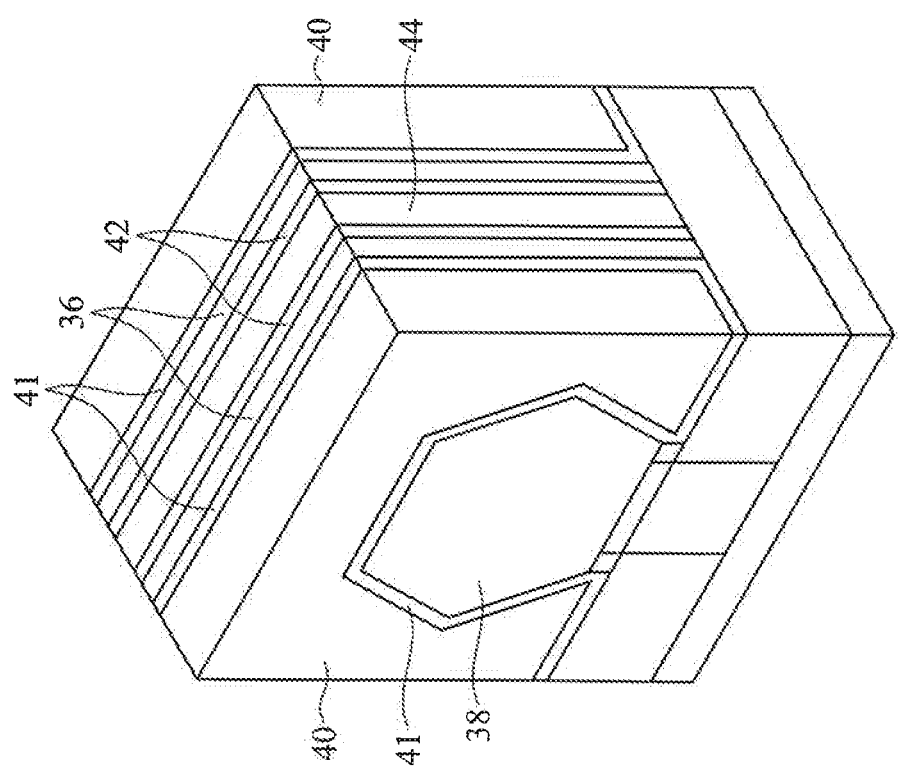
FIG. 15B
FIG. 15A

SOURCE/DRAIN CONTACTS FOR SEMICONDUCTOR DEVICES AND METHODS OF FORMING

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (finFETs) or multiple gate transistors are being researched and implemented. However, with this new device structure and the continuous shrinking of even finFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A, 6B, and 6C are perspective and cross sectional views of an intermediate stage in the forming of a semiconductor device in accordance with some embodiments.

FIGS. 15A, 15B, and 15C are perspective and cross sectional views of an intermediate stage in the forming of a semiconductor device in accordance with some embodiments.

DETAILED DESCRIPTION

Figure 1B:
FIGS. 1A and 1B are perspective and cross sectional views of an intermediate stage in the forming of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and methods of forming the same are provided in accordance with various embodiments. Intermediate stages of forming transistors are illustrated. Some embodiments discussed herein are discussed in the context of transistors formed using a gate-last process. Some embodiments contemplate aspects used in a gate-first process. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Some embodiments contemplate both n-type devices, such as n-type transistors, and p-type devices, such as p-type transistors, being manufactured during a manufacturing process. Hence, some embodiments contemplate the formation of complementary devices. Figures below may illustrate one device, but one of ordinary skill in the art will readily understand that multiple devices, some with a different device type, can be formed during processing. Some aspects of the formation of complementary devices are discussed below, although such aspects may not necessarily be illustrated in the figures.

FIGS. 1A, 2A, 3A, and 4A are various perspective views of intermediate stages in the manufacturing of a fin, which comprises a superlattice that may include strained layers, for a semiconductor device in accordance with some embodiments. FIGS. 1B, 2B, 3B, and 4B are respective cross-sectional views of the cross sectional views of FIGS. 1A, 2A, 3A, and 4A, respectively.

Figure 1A:
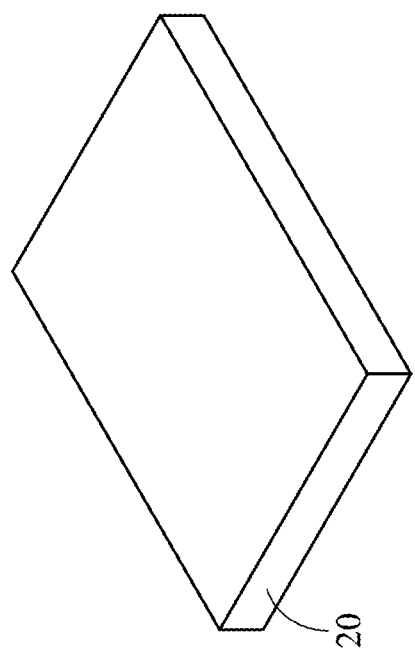

In FIGS. 1A and 1B, a substrate 20 is provided. The substrate 20 may be a semiconductor substrate, such as a bulk semiconductor substrate, a semiconductor-on-insulator (SOI) substrate, a multi-layered or gradient substrate, or the like. The substrate 20 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 20 may be doped or un-doped. In a specific example, the substrate 20 is a bulk silicon substrate, which may be a wafer.

Figure 2B:
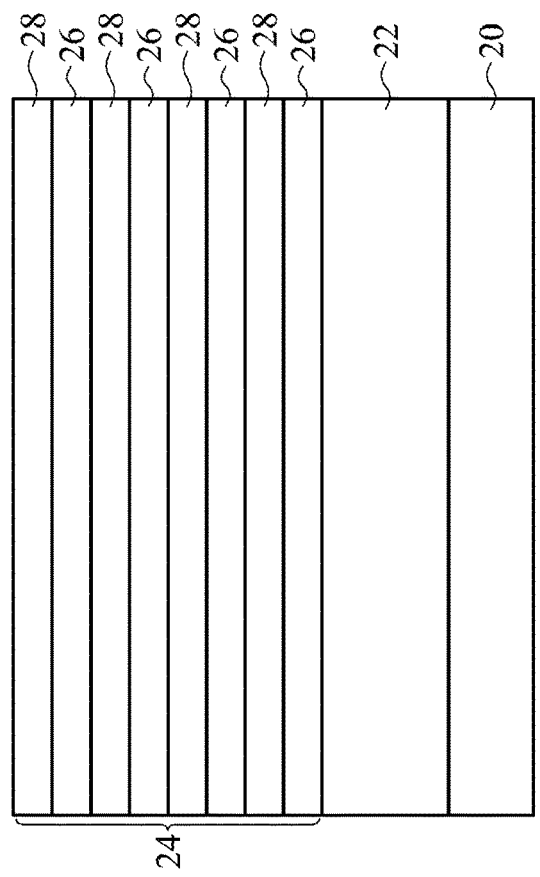
FIGS. 2A and 2B are perspective and cross sectional views of an intermediate stage in the forming of a semiconductor device in accordance with some embodiments.
Figure 2A:
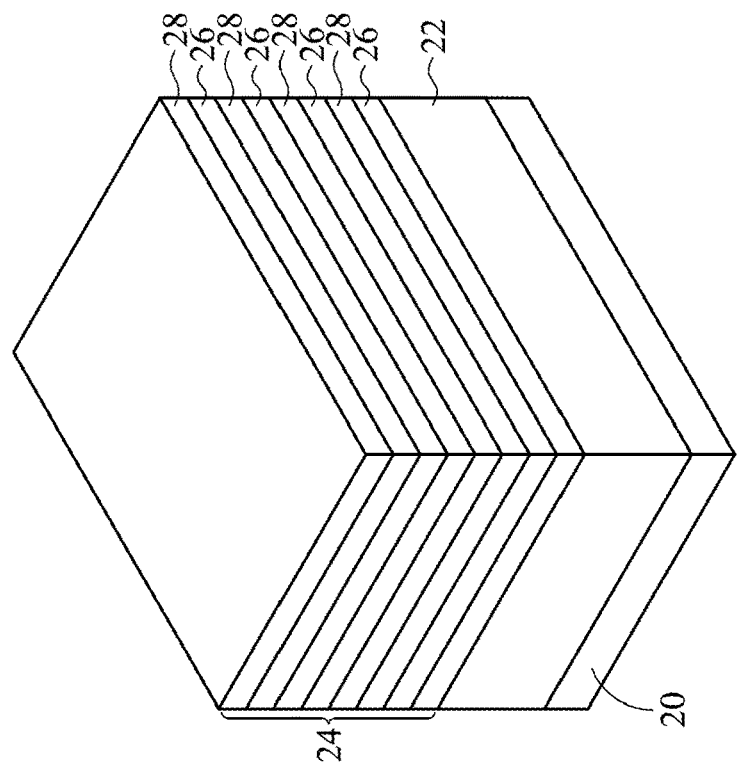

In FIGS. 2A and 2B, a buffer layer 22 is formed on the substrate 20. The buffer layer 22, in some embodiments, is epitaxially grown on the substrate 20. The epitaxial growth can use Metal-Organic Chemical Vapor Deposition (MOCVD), Molecular Beam Epitaxy (MBE), Liquid Phase Epitaxy (LPE), Vapor Phase Epitaxy (VPE), Ultra-High-Vacuum Chemical Vapor Deposition (UHVCVD), the like, or a combination thereof. The buffer layer 22 can be a group IV material, such as Si, Ge, SiGe, SiGeSn, or the like; a group III-group V compound material, such as GaAs, GaP, GaAsP, AlInAs, AlGaAs, GaInAs, InAs, GaInP, InP, InSb, GaInAsP or the like; or the like. The buffer layer 22 can be a crystalline material and can have a natural lattice constant that is mismatched to the natural lattice constant of the crystalline material of the substrate 20 on which the buffer layer 22 is grown. The buffer layer 22 can be a relaxed material, which may result from plastic relaxation, for example. The buffer layer 22 can have a uniform composition or a varying composition, such as a graded composition. A graded composition may be substantially linearly graded or discrete-step graded. The buffer layer 22 can have a thickness greater than a critical thickness such that a surface of the buffer layer 22 distal from the substrate 20 includes a crystalline structure with a relaxed, natural lattice constant. The lattice constant at the surface of the buffer layer 22 distal from the substrate 20 can be as appropriate to induce stress in the superlattice 24. In some embodiments, the buffer layer 22 can be omitted, such as if the substrate 20 is a crystalline material with a lattice constant appropriate to induce a desired stress in the superlattice 24.

Although not specifically illustrated, appropriate wells may be formed in the buffer layer 22 and/or substrate 20. For example, a p-well may be formed in a first region of the substrate 20 where n-type devices, such as n-type transistors, are to be formed, and an n-well may be formed in a second region of the substrate 20 where p-type devices, such as p-type transistors, are to be formed.

For example, to form a p-well in the first region, a photoresist (not shown) can formed over the buffer layer 22 in the second region of the substrate 20. The photoresist can be patterned to expose the first region of the substrate 20. The photoresist can be formed by using a spin-on technique and can be patterned using acceptable photolithography techniques. Once the photoresist is patterned, a p-type impurity implant can be performed in the first region, and the photoresist may act as a mask to substantially prevent p-type impurities from being implanted into the second region. The p-type impurities may be boron, $BF_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process.

Further, to form an n-well in the second region, a photoresist (not shown) can be formed over the buffer layer 22 in the first region of the substrate 20. The photoresist can be patterned to expose the second region of the substrate 20. The photoresist can be formed by using a spin-on technique and can be patterned using acceptable photolithography techniques. Once the photoresist is patterned, an n-type impurity implant may be performed in the second region, and the photoresist may act as a mask to substantially prevent n-type impurities from being implanted into the first region. The n-type impurities may be phosphorus, arsenic, or the like implanted in the second region to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process. After the implants, an anneal may be performed to activate the p-type and n-type impurities that were implanted. The implantations may form a p-well in the first region and an n-well in the second region.

In other embodiments, a p-well and an n-well may be formed in situ during the epitaxial growth of the buffer layer 22. The buffer layer 22 in the different regions where different wells are to be formed can be epitaxially grown in different growth steps to allow for the different doping types to be in the different regions.

Further in FIGS. 2A and 2B, a superlattice 24 is formed on the buffer layer 22. The superlattice 24 includes alternating first layers 26 and second layers 28. Each of the first layers 26 and the second layers 28, in some embodiments, is epitaxially grown on its underlying layer. The epitaxial growth can use MOCVD, MBE, LPE, VPE, UHVCVD, the like, or a combination thereof. Each of the first layers 26 and the second layers 28 can be a group IV material, such as Si, Ge, SiGe, SiGeSn, or the like; a group III-group V compound material, such as GaAs, GaP, GaAsP, AlInAs, AlGaAs, GaInAs, InAs, GaInP, InP, InSb, GaInAsP or the like; or the like. In an embodiment each of the first layers 26 is SiGe and each of the second layers 28 is Si. The superlattice 24 can include any number of first layers 26 and any number of second layers 28. As illustrated, the superlattice 24 has four first layers 26 and four second layers 28.

Each of the first layers 26 and the second layers 28 can be a crystalline material. In some embodiments, a natural lattice constant of one respective group of the first layers 26 or the second layers 28 is larger than the lattice constant of the surface of the buffer layer 22 distal from the substrate 20 (or the substrate 20 if the buffer layer 22 is omitted), and a natural lattice constant of the other one respective group of the first layers 26 or the second layers 28 is smaller than the lattice constant of the surface of the buffer layer 22 distal from the substrate 20 (or the substrate 20 if the buffer layer 22 is omitted). Hence, in these embodiments, the first layers 26 can be strained a first strain type, and the second layers 28 are strained a second strain type opposite from the first strain type. Further in these embodiments, each of the first layers 26 and the second layers 28 can have a thickness less than a critical thickness, such as in a range from about 3 nm to 20 nm.

In some embodiments, a natural lattice constant of the crystalline material of the first layer 26 is larger than the lattice constant of the surface of the buffer layer 22 distal from the substrate 20 (or the substrate 20 if the buffer layer 22 is omitted), and a natural lattice constant of the crystalline material of the second layer 28 is smaller than the lattice constant of the surface of the buffer layer 22 distal from the substrate 20 (or the substrate 20 if the buffer layer 22 is omitted). Hence, in these embodiments, the first layers 26 can be compressively strained, and the second layers 28 can be tensilely strained.

In other embodiments, a natural lattice constant of the crystalline material of the first layer 26 is smaller than the lattice constant of the surface of the buffer layer 22 distal from the substrate 20 (or the substrate 20 if the buffer layer 22 is omitted), and a natural lattice constant of the crystalline material of the second layer 28 is larger than the lattice constant of the surface of the buffer layer 22 distal from the substrate 20 (or the substrate 20 if the buffer layer 22 is omitted). Hence, the first layers 26 can be tensilely strained, and the second layers 28 can be compressively strained.

In further embodiments, one or both of the groups of the first layers 26 or the second layers 28 have a natural lattice constant of the respective crystalline material that is substantially equal to the lattice constant of the surface of the buffer layer 22 distal from the substrate 20 (or the substrate 20 if the buffer layer 22 is omitted). Hence, one or both of the groups of the first layers 26 or the second layers 28 can be relaxed. In some embodiments, the first layers 26 are each relaxed, while the second layers 28 are compressively or tensilely strained. In other embodiments, the second layers 28 are each relaxed, while the first layers 26 are compressively or tensilely strained. In further embodiments, each of the first layers 26 and the second layers 28 is relaxed.

In some embodiments, the material of the first layers 26 is different from the material of the second layers 28. The difference in materials may allow for the different strains as described above, and/or may allow for an etch selectivity between the first layers 26 and second layers 28, as will be apparent below.

Figure 3B:
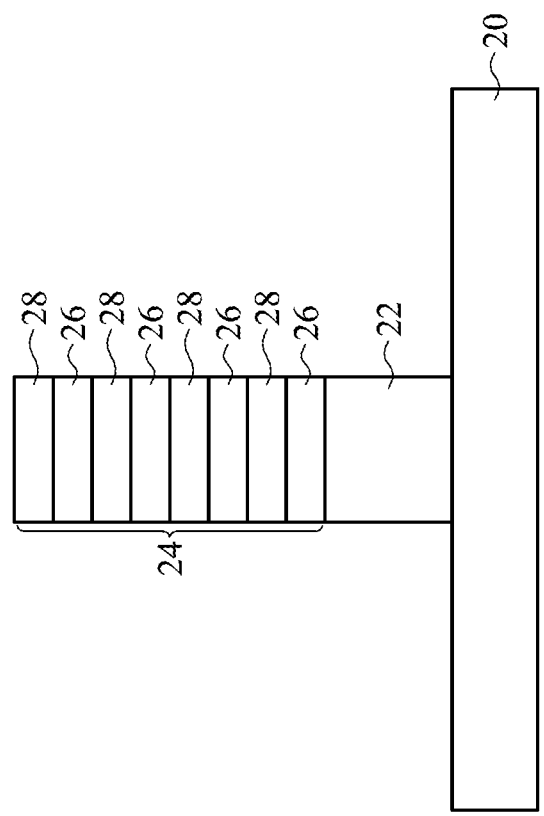
FIGS. 3A and 3B are perspective and cross sectional views of an intermediate stage in the forming of a semiconductor device in accordance with some embodiments.
Figure 3A:
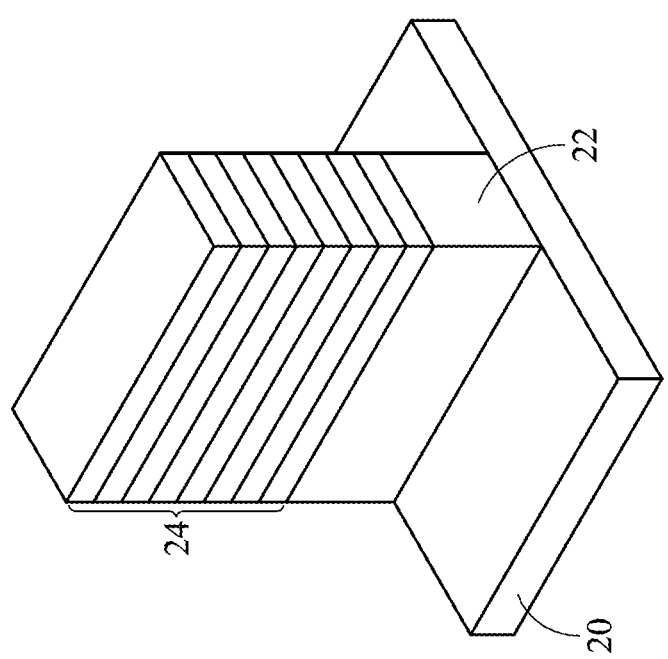

In FIGS. 3A and 3B, a fin that includes the superlattice 24 is formed by forming trenches in the superlattice 24 on opposing sides of the fin. In some embodiments, the fin may be formed by forming a hard mask (not shown) over the superlattice 24, and patterning the hard mask to form a desired fin pattern. Next, trenches on opposing sides of the fin are formed by etching through the superlattice 24. In some embodiments, the trenches may extend into the buffer layer 22, but not completely through the buffer layer 22. In some embodiments, the trenches can extend through the superlattice 24 and the buffer layer 22 but not into the substrate 20. In some embodiments, the trenches can extend through the superlattice 24 and the buffer layer 22 and into the substrate 20. The etching may be any acceptable etch process, such as a reactive ion etch (RIE), neutral beam etch (NBE), the like, or a combination thereof. The etch may be anisotropic.

Figure 4B:
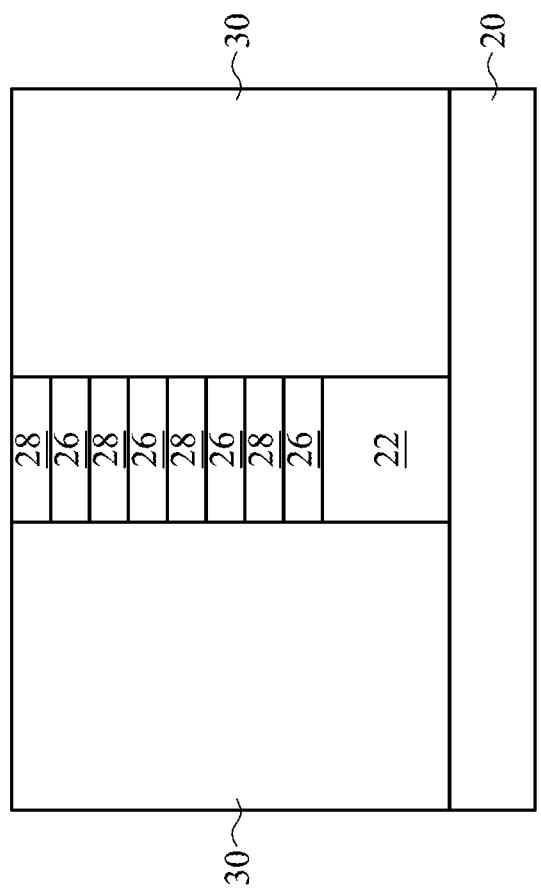
FIGS. 4A and 4B are perspective and cross sectional views of an intermediate stage in the forming of a semiconductor device in accordance with some embodiments.
Figure 4A:
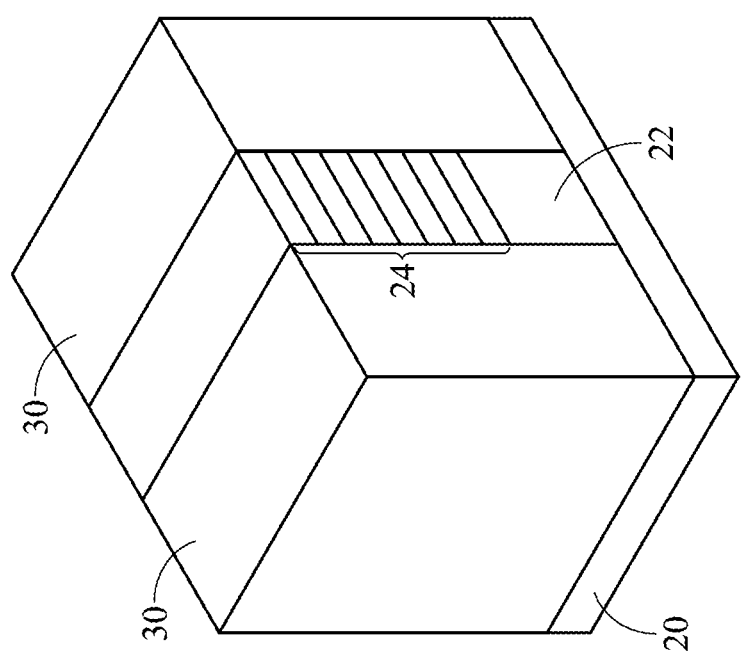

In FIGS. 4A and 4B, the trenches are filled with an insulation material 30. The insulation material 30 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 30 is silicon oxide formed by a FCVD process. An anneal process may be performed once the insulation material 30 is formed. Further, a planarization process, such as a chemical mechanical polish (CMP), may remove any excess insulation material and form top surfaces of the insulation material 30 and a top surface of the fin that are co-planar.

In some embodiments, before the insulation material 30 is formed, a liner (not shown) may be formed lining the trenches. The liner may be formed of any suitable material. In an embodiment, the liner is formed of silicon nitride (SiN). The insulation material 30 is then formed over the liner.

FIGS. 5A, 6A, 7A, 8A, 9A, 10A, 11A, 12A, 13A, 14A, 15A, 16A, and 17A are various perspective views of intermediate stages in the manufacturing of a semiconductor device, which comprises a superlattice channel region, in accordance with some embodiments. FIGS. 5B, 5C, 6B, 6C, 7B, 7C, 8B, 8C, 9B, 9C, 10B, 10C, 11B, 11C, 12B, 12C, 13B, 13C, 14B, 14C, 15B, 15C, 16B, 16C, 17B, and 17C are various cross-sectional views of the intermediate stages in the manufacturing of the semiconductor device. FIGS. 5B, 6B, 7B, 8B, 9B, 10B, 11B, 12B, 13B, 14B, 15B, 16B, and 7B are of the cross section "B" shown in FIG. 5A. FIGS. 5C, 6C, 7C, 8C, 9C, 10C, 11C, 12C, 13C, 14C, 15C, 16C, and 17C are of cross section "C" shown in FIG. 5A.

Figure 5B:
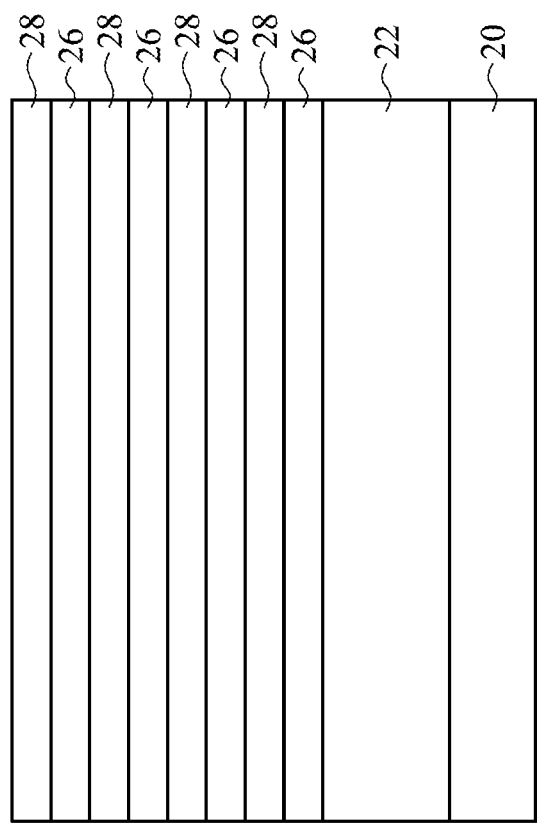
FIGS. 5A, 5B, and 5C are perspective and cross sectional views of an intermediate stage in the forming of a semiconductor device in accordance with some embodiments.
Figure 5A:
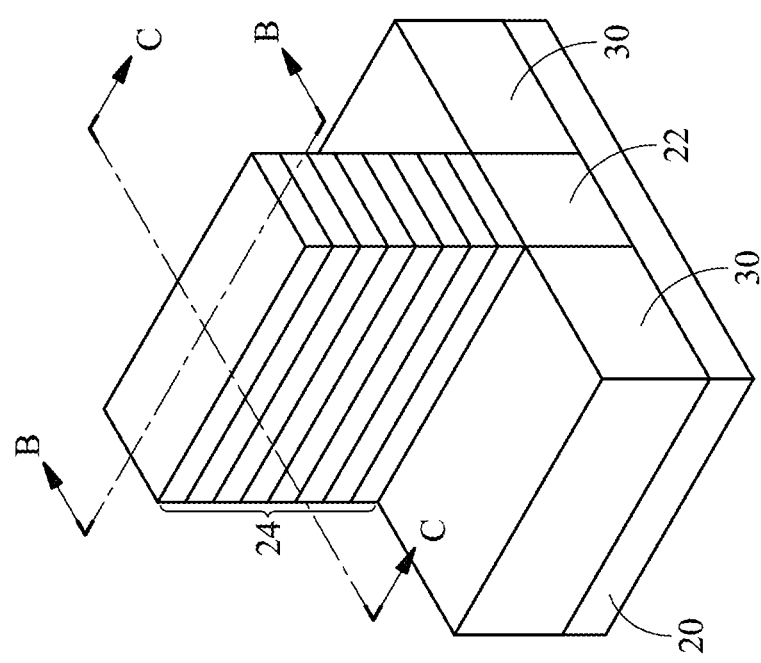
Figure 5C:
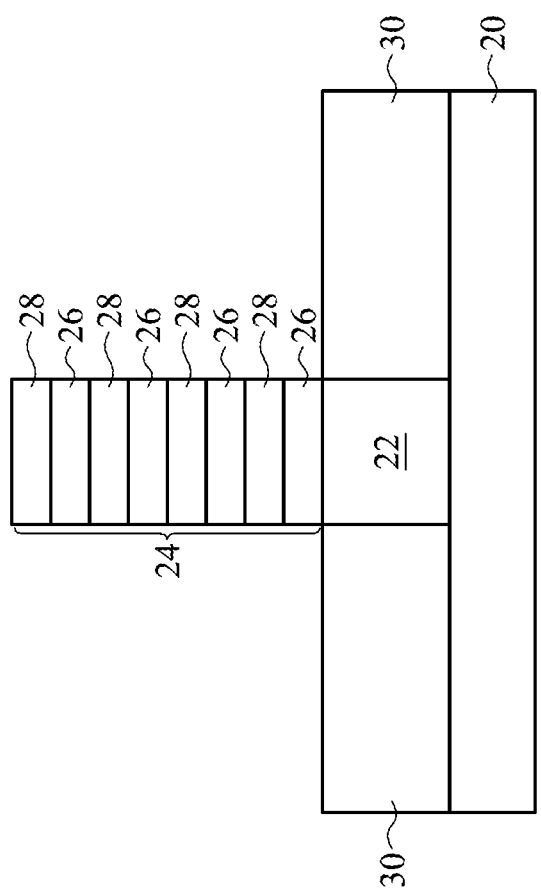

In FIGS. 5A, 5B, and 5C, the insulation material 30 is recessed to cause the fin, e.g., one or more of the first layers 26 and second layers 28 of the superlattice 24, to protrude from between neighboring isolation regions 30, which may be referred to as Shallow Trench Isolation (STI) regions. The isolation regions 30 may be recessed using an acceptable etching process, such as one that is selective to the insulation material 30. For example, a chemical oxide removal using a CERTAS® etch or an Applied Materials SICONI tool or dilute hydrofluoric (dHF) acid may be used.

A person having ordinary skill in the art will readily understand that the processes described above are just examples of how a fin may be formed. In other embodiments, a dielectric layer can be formed over a top surface of the substrate 20; a trench can be etched through the dielectric layer; the buffer layer 22 and the superlattice 24 can be epitaxially grown in the trench; and the dielectric layer can be recessed such that at least a portion of the superlattice 24 and/or buffer layer 22 protrude from the dielectric layer to form a fin.

Figure 6C:
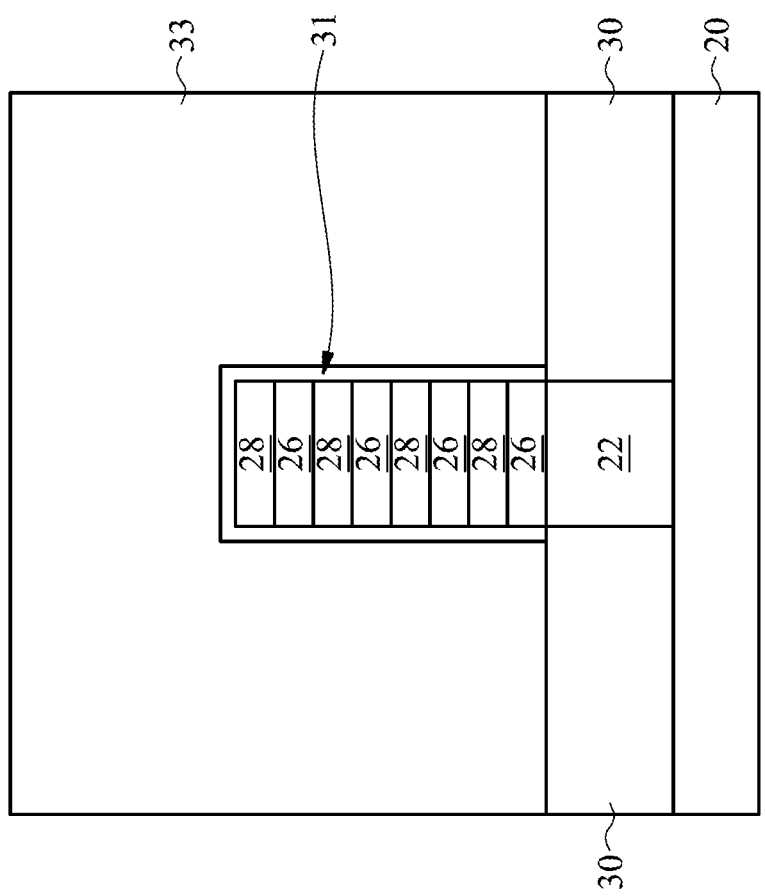

In FIGS. 6A, 6B, and 6C, a dummy dielectric layer 31 is formed on the fin. The dummy dielectric layer 31 may be, for example, silicon oxide, silicon nitride, a combination thereof, or the like, and may be deposited or thermally grown according to acceptable techniques, such as CVD, thermal oxidation, or the like. Further in FIGS. 6A, 6B, and 6C, a dummy gate layer 33 is formed over the dummy dielectric layer 31. The dummy gate layer 33 may be deposited, such as by using CVD or the like, over the dummy dielectric layer 31 and then planarized, such as by a CMP. The dummy gate layer 33 may comprise, for example, polysilicon, although other materials that have a high etching selectivity may also be used. Although not specifically illustrated, a mask layer may be formed over the dummy gate layer 33. The mask layer may be deposited, such as by using CVD or the like, over the dummy gate layer 33. The mask layer may comprise, for example, silicon nitride, silicon oxynitride, silicon carbon nitride, or the like.

Figure 7B:
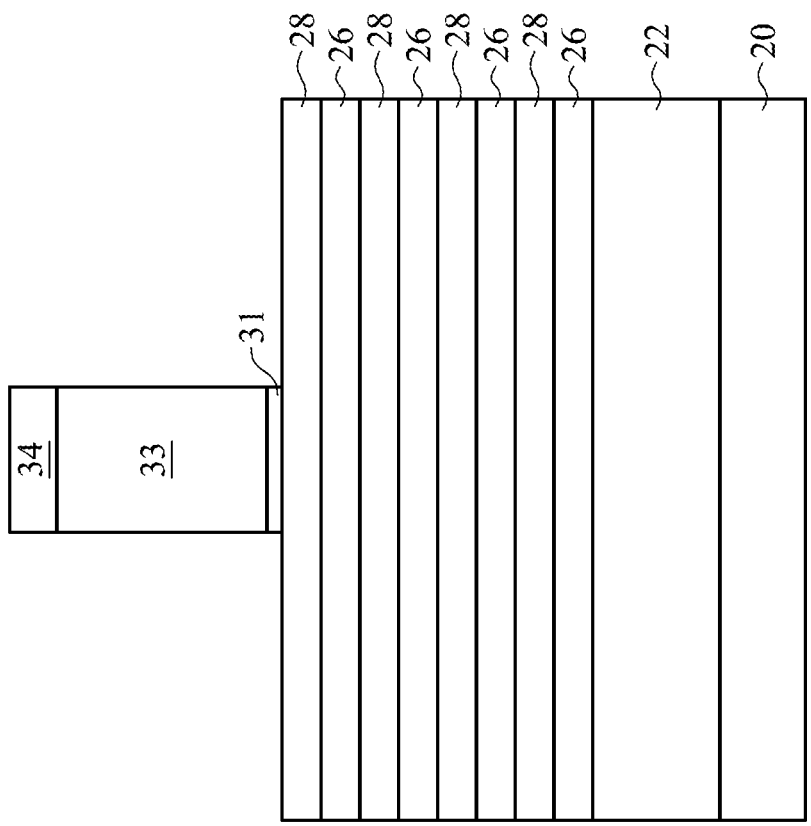
FIGS. 7A, 7B, and 7C are perspective and cross sectional views of an intermediate stage in the forming of a semiconductor device in accordance with some embodiments.
Figure 7A:
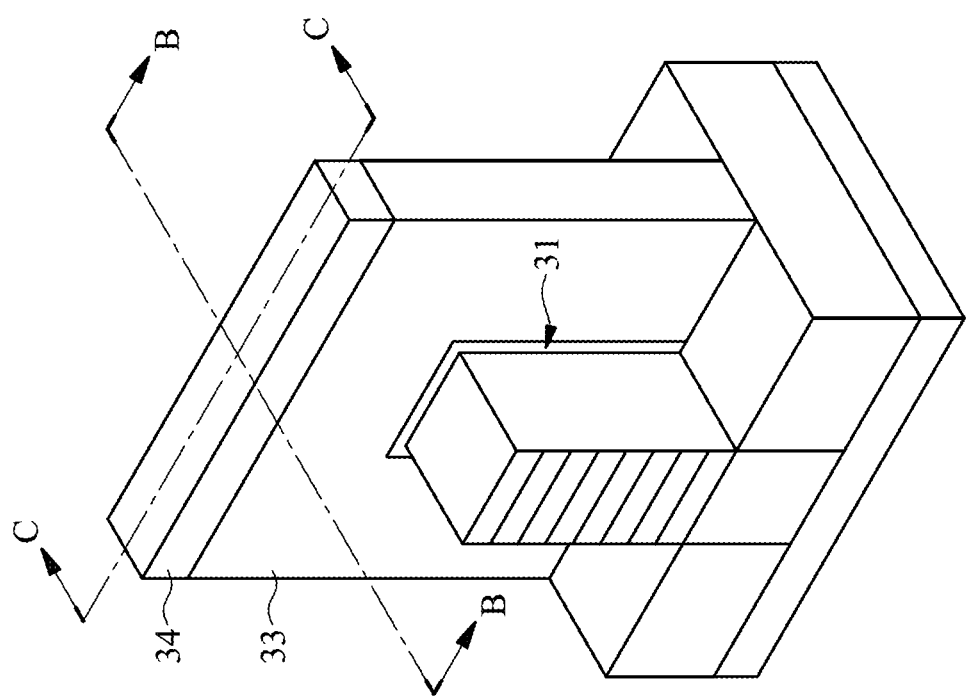
Figure 7C:
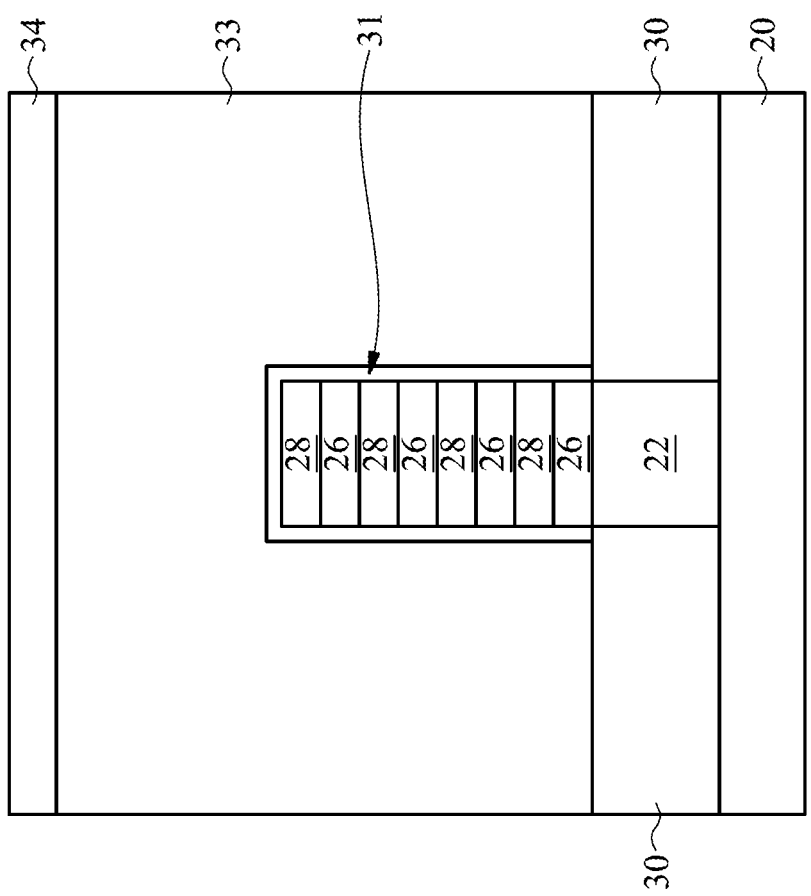

In FIGS. 7A, 7B, and 7C, the mask layer (if used) may be patterned using acceptable photolithography and etching techniques to form a mask 34. Further, the dummy gate layer 33 and dummy dielectric layer 31 may be patterned, such as by transferring the pattern of the mask, by using an acceptable etching technique to form a dummy gate 33 and dummy gate dielectric 31 from the dummy gate layer 33 and the dummy dielectric layer 31, respectively. The etching may comprise an acceptable anisotropic etching, such as RIE, NBE, or the like. The dummy gate 33 covers a channel region of the fin. The dummy gate 33 may also have a lengthwise direction substantially perpendicular to the lengthwise direction of the fin.

Although not specifically illustrated, implants or plasma doping (PLAD) for lightly doped source/drain (LDD) regions may be performed. Similar to the implants discussed above, a mask, such as a photoresist (not shown), may be formed over the second region, e.g., for p-type devices, while exposing the first region, e.g., for n-type devices, and n-type impurities may be implanted or introduced by a plasma into an exposed fin in the first region. The mask may then be removed. Subsequently, a mask, such as a photoresist (not shown), may be formed over the first region while exposing the second region, and p-type impurities may be implanted or introduced by a plasma into an exposed fin in the second region. The mask may then be removed. The n-type impurities may be any of the n-type impurities previously discussed, and the p-type impurities may be any of the p-type impurities previously discussed. The lightly doped source/drain regions may have a concentration of impurities from about $10^{15}$ cm$^{-3}$ to about $10^{16}$ cm$^{-3}$. An anneal may be used to activate the implanted impurities.

For clarity, the cross sections "B" and "C" shown in FIG. 5A are also depicted in FIG. 7A.

Figure 8B:
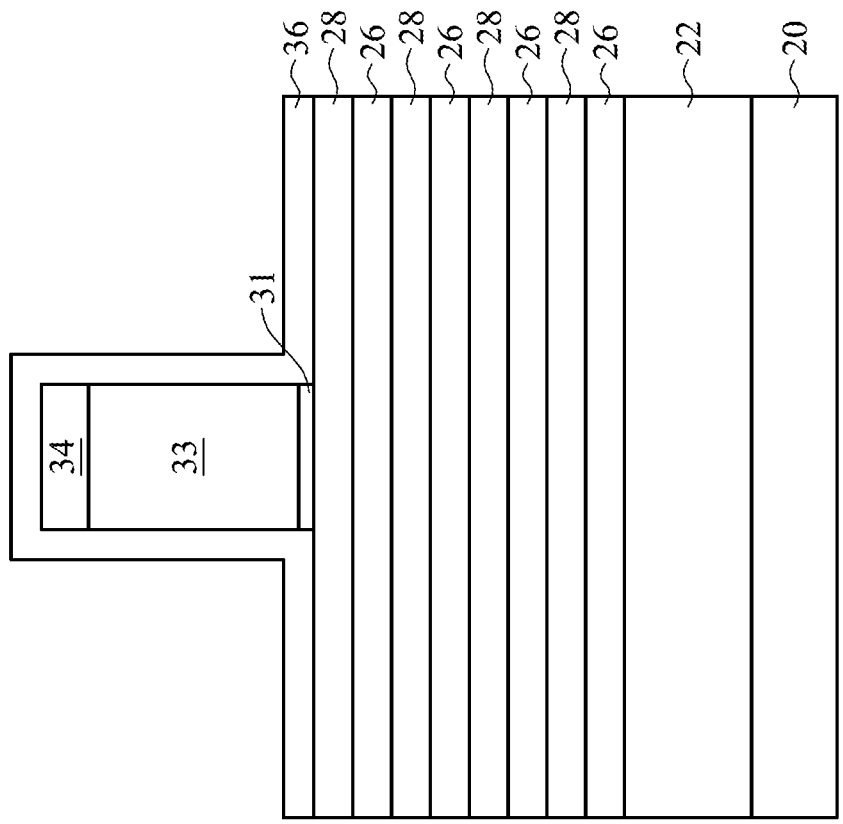
FIGS. 8A, 8B, and 8C are perspective and cross sectional views of an intermediate stage in the forming of a semiconductor device in accordance with some embodiments.
Figure 8A:
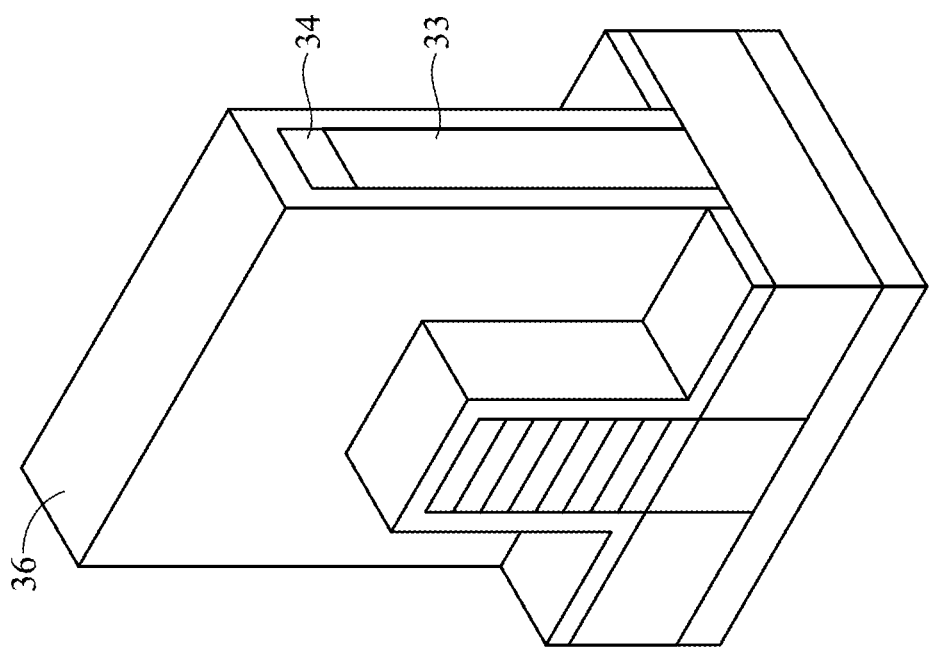
Figure 8C:
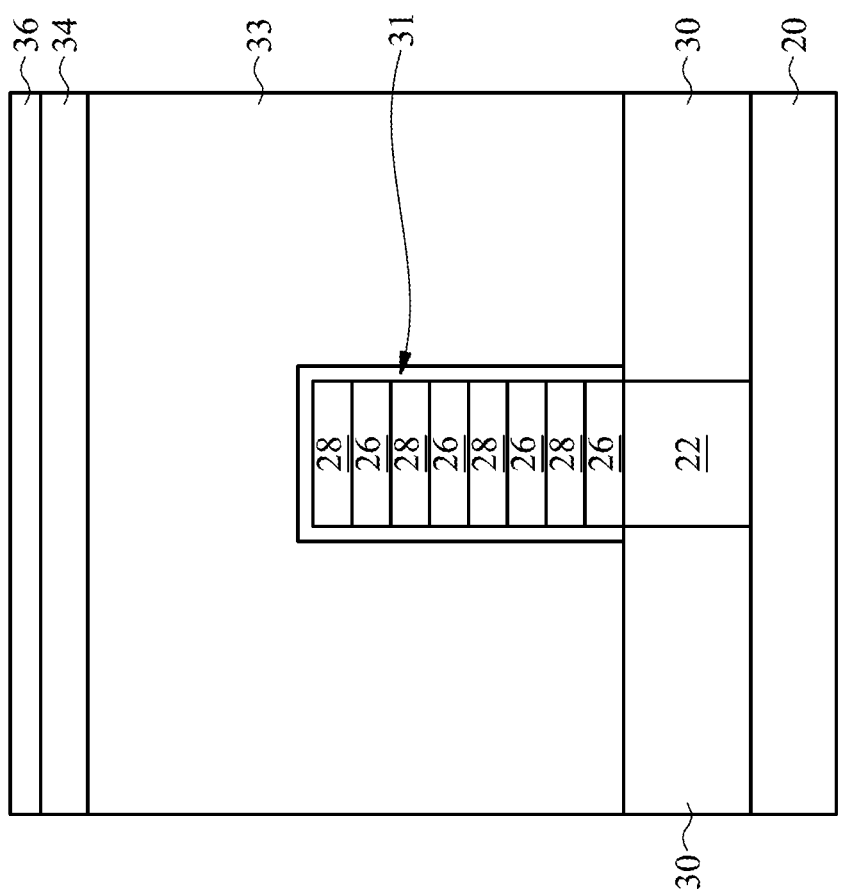

In FIGS. 8A, 8B, and 8C, gate spacers 36 are formed along sidewalls of the dummy gate 33 and dummy gate dielectric 31 and along surfaces of the fin. The gate spacers 36 may be formed by conformally depositing, such as by CVD or the like, a material. The material of the gate spacers 36 may be silicon nitride, silicon carbon nitride, a combination thereof, or the like.

Figure 9B:
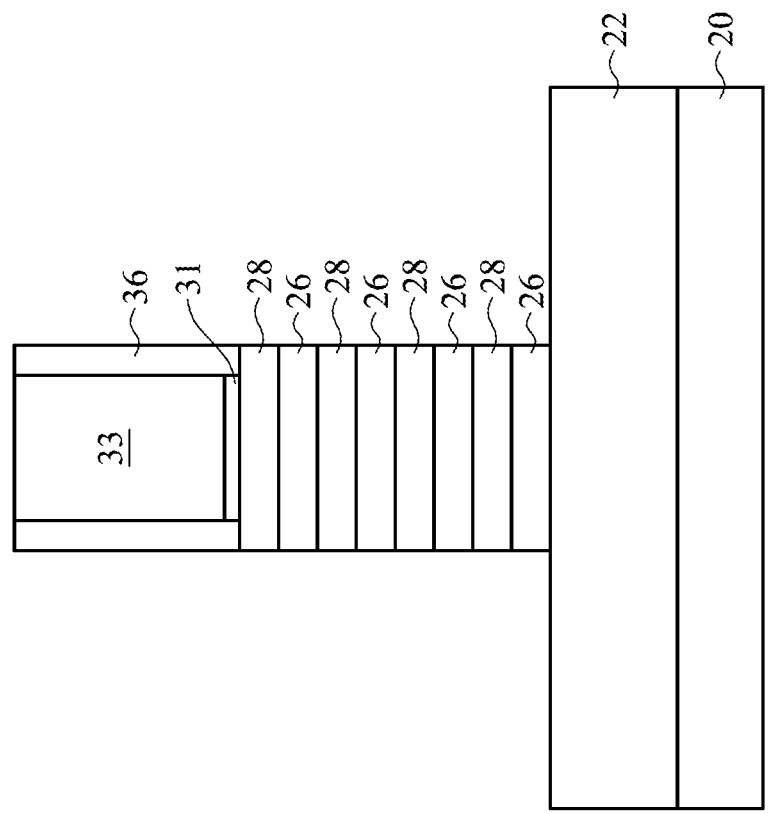
FIGS. 9A, 9B, and 9C are perspective and cross sectional views of an intermediate stage in the forming of a semiconductor device in accordance with some embodiments.
Figure 9A:
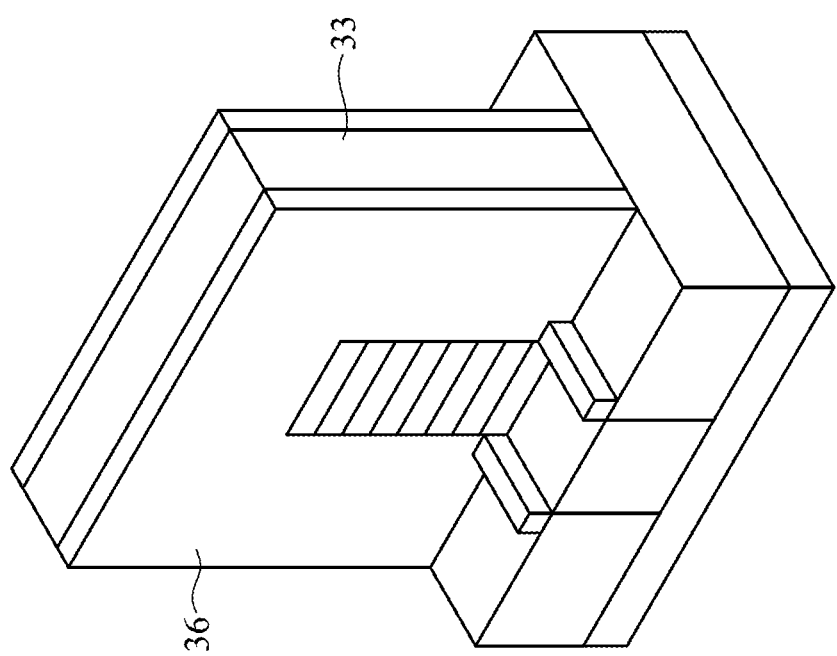
Figure 9C:
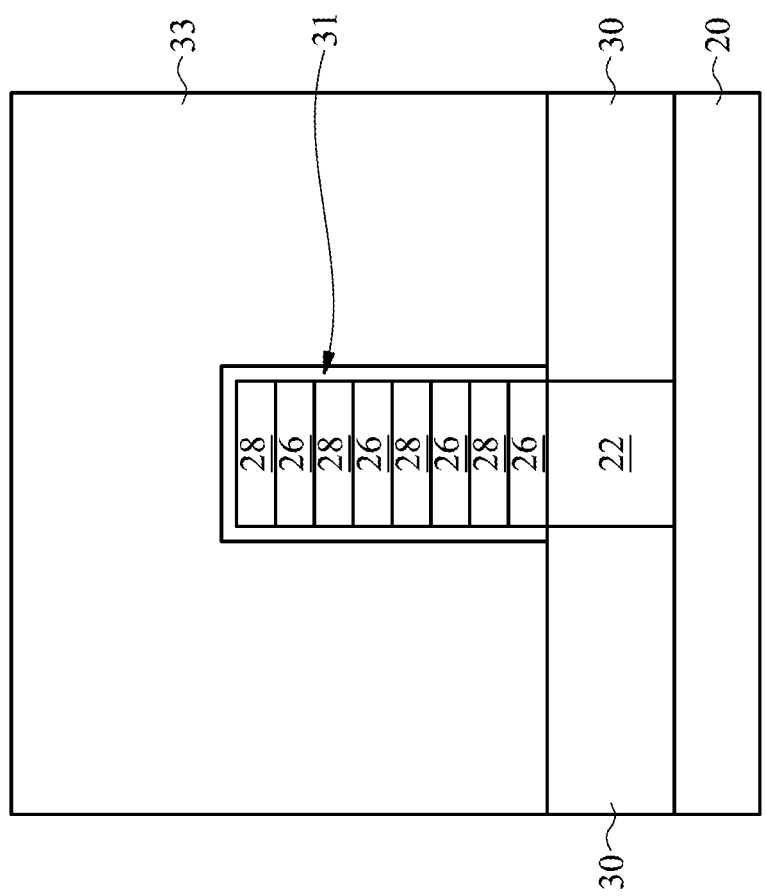

In FIGS. 9A, 9B, and 9C, the portion of the gate spacers 36 overlying the dummy gate 33, and any remaining portions of mask 34, are removed, for example using a planarization process (such as a CMP process) or an etching process. Further, recesses are formed in the source/drain regions of the fin. The recesses are formed in the source/drain regions of the fin such that the dummy gate 33 is disposed between the recesses. The recesses may be formed using any appropriate etch selective to the fin, e.g., layers of the superlattice 24 protruding from between the isolation regions 30, which may also be anisotropic. Portions of the gate spacers 36 may be etched as well, forming the structure depicted in FIGS. 9A, 9B, and 9C.

Figure 10B:
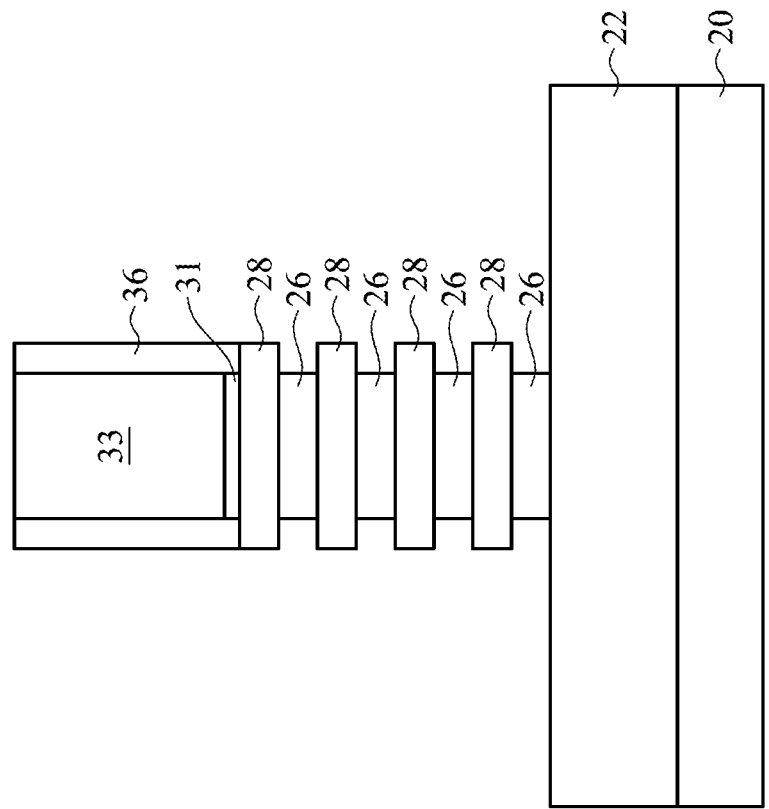
FIGS. 10A, 10B, and 10C are perspective and cross sectional views of an intermediate stage in the forming of a semiconductor device in accordance with some embodiments.
Figure 10A:
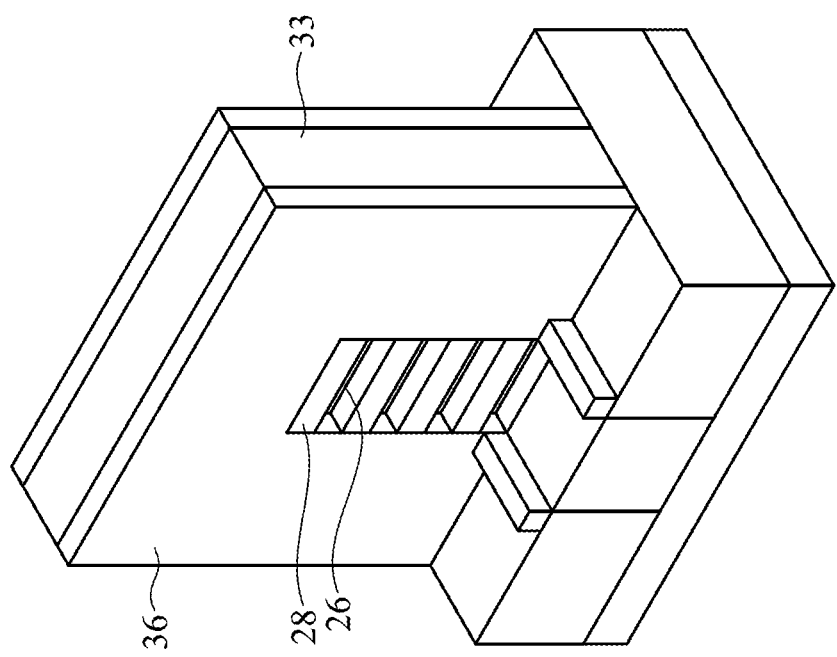
Figure 10C:
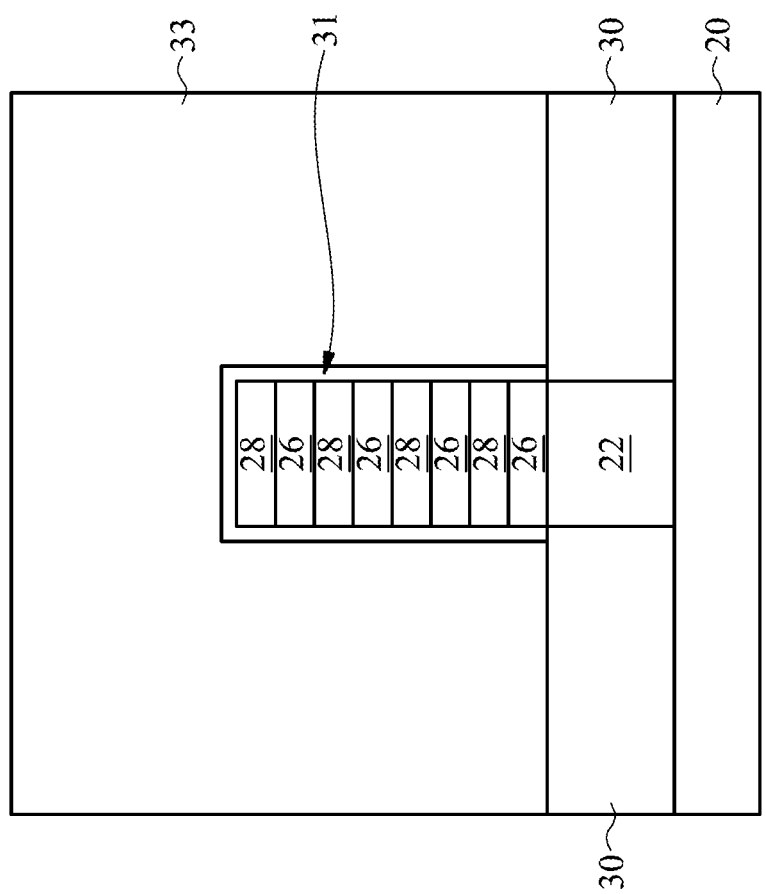

Referring to FIGS. 10A, 10B, and 10C, an etching process is performed, where substantially only the first layers 26 of the superlattice 24 that are exposed by the forming of the recesses are etched. As a result of this etching process, sidewalls of the etched first layers 26 are offset inwardly to the fin from sidewalls of the second layers 28 on a respective side. In some embodiments, the result of the etching process can be a function of the materials of the first layers 26 and the second layers 28, the orientation of the sidewalls, and the etchant used for etching. The etchant can be a wet etchant, such as a diluted ammonium hydroxide-hydrogen peroxide mixture (APM), sulfuric acid-hydrogen peroxide mixture (SPM), or the like, which is selective to the surfaces of the first layers 26.

Figure 11B:
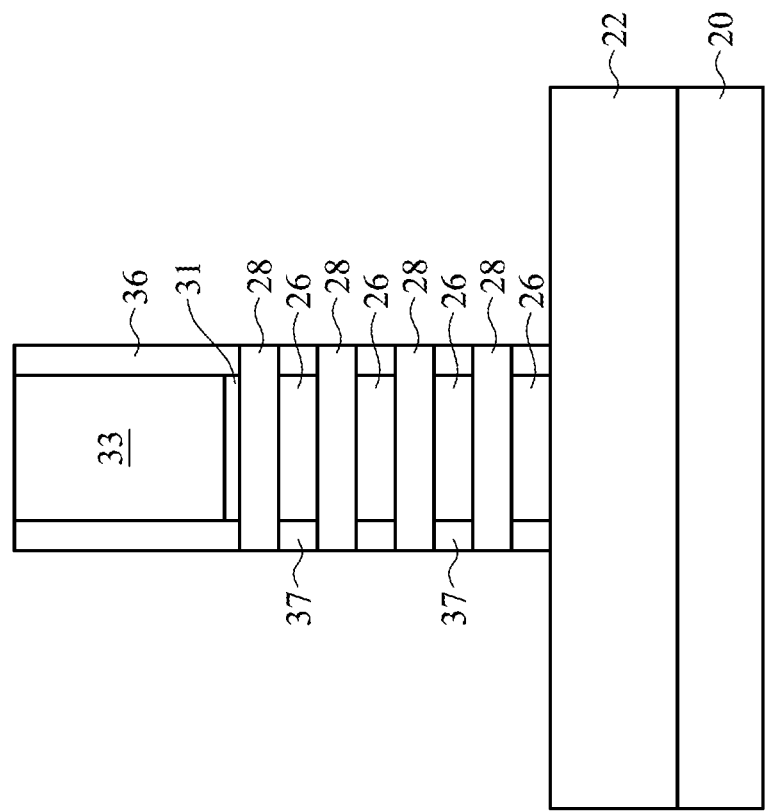
FIGS. 11A, 11B, and 11C are perspective and cross sectional views of an intermediate stage in the forming of a semiconductor device in accordance with some embodiments.
Figure 11A:
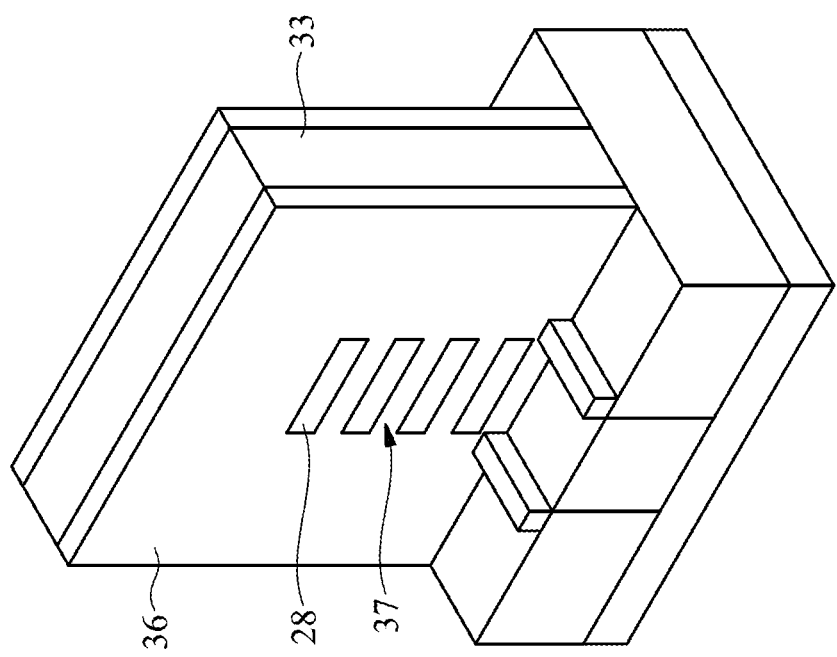
Figure 11C:
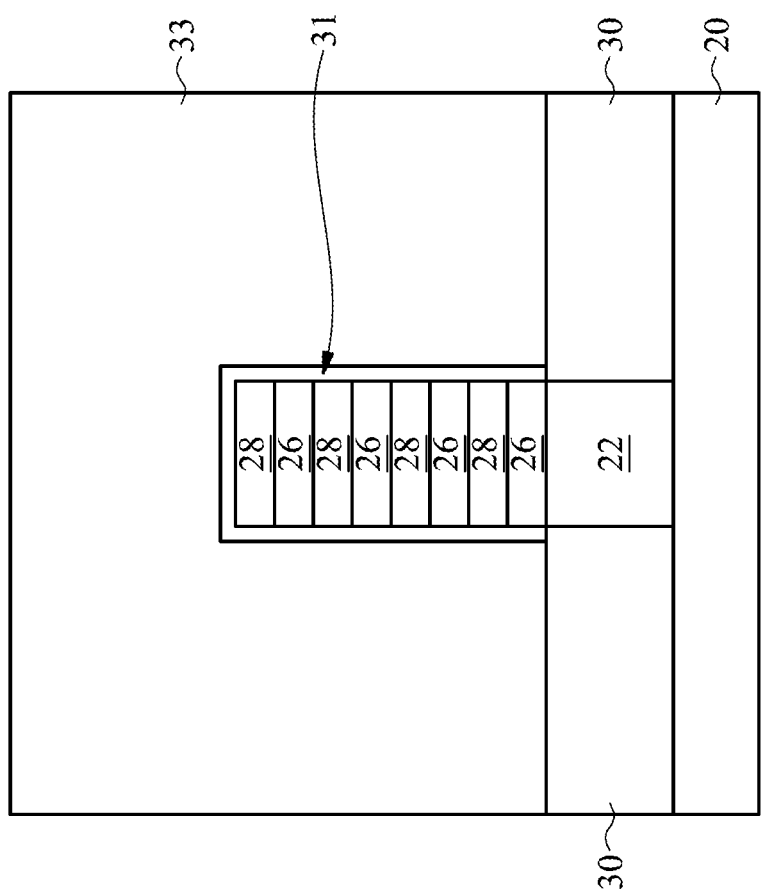

Referring to FIGS. 11A, 11B, and 11C, spacers 37 are formed in the spaces between adjacent second layers 28 formed by the etching of the sidewalls of first layers 26. In some embodiments, spacers 37 may be used to physically secure each of the second layers 28 to the device when the remaining portions of the first layers 26 are subsequently removed (see FIGS. 14A, 14B, and 14C below). Spacers 37 may be formed by conformally depositing a material over the structure shown in FIGS. 10A, 10B, and 10C, where the deposited material extends into the spaces between adjacent layers 28. Next, portions of the deposited material that do not extend in the spaces are etched away, resulting in the structure depicted in FIGS. 11A, 11B, and 11C. In some embodiments, the material of the spacers 37 may be silicon nitride, silicon carbon nitride, a combination thereof, or the like.

Figure 12B:
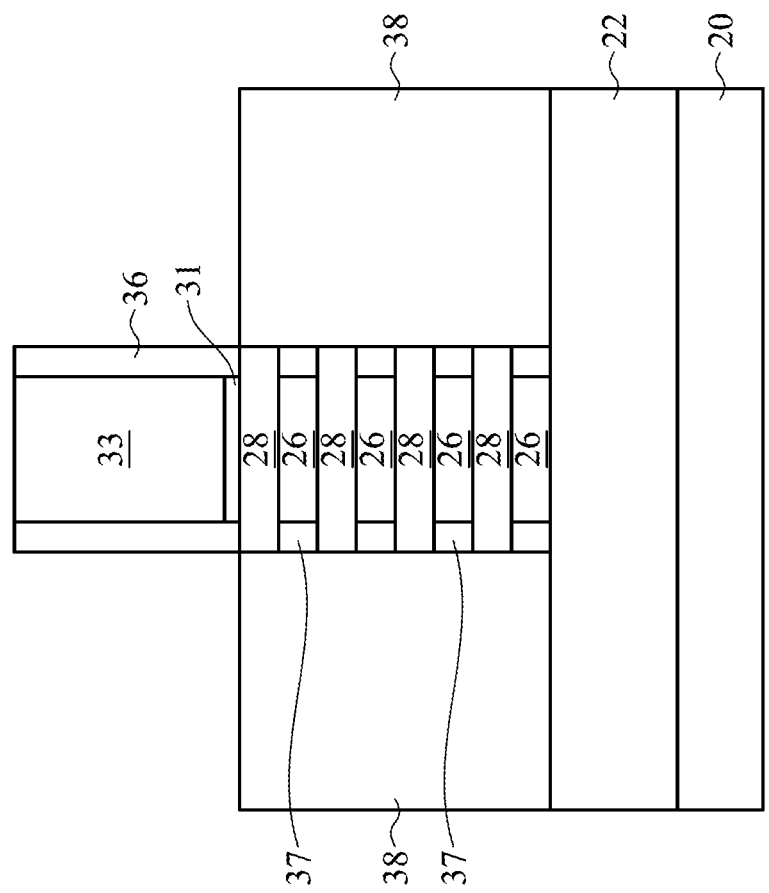
FIGS. 12A, 12B, and 12C are perspective and cross sectional views of an intermediate stage in the forming of a semiconductor device in accordance with some embodiments.
Figure 12A:
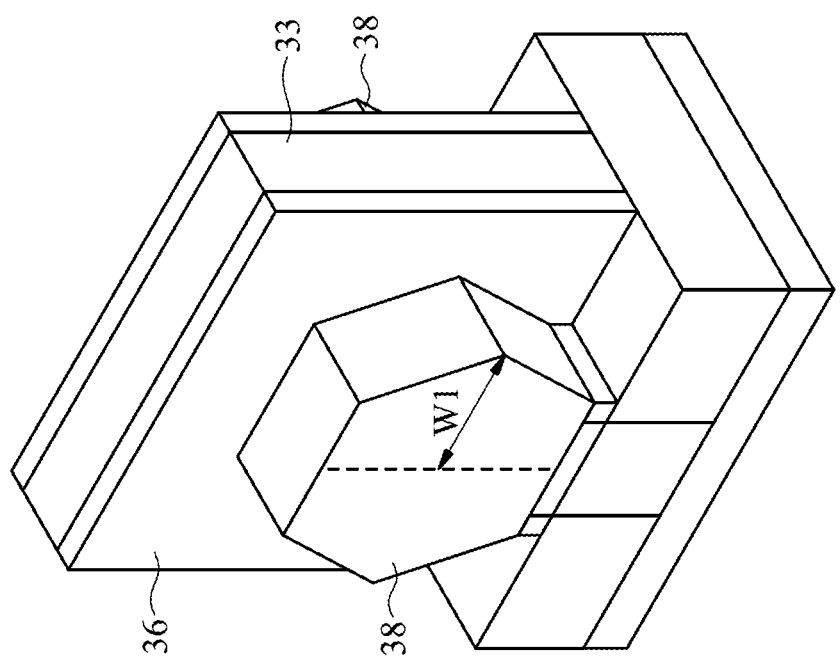
Figure 12C:
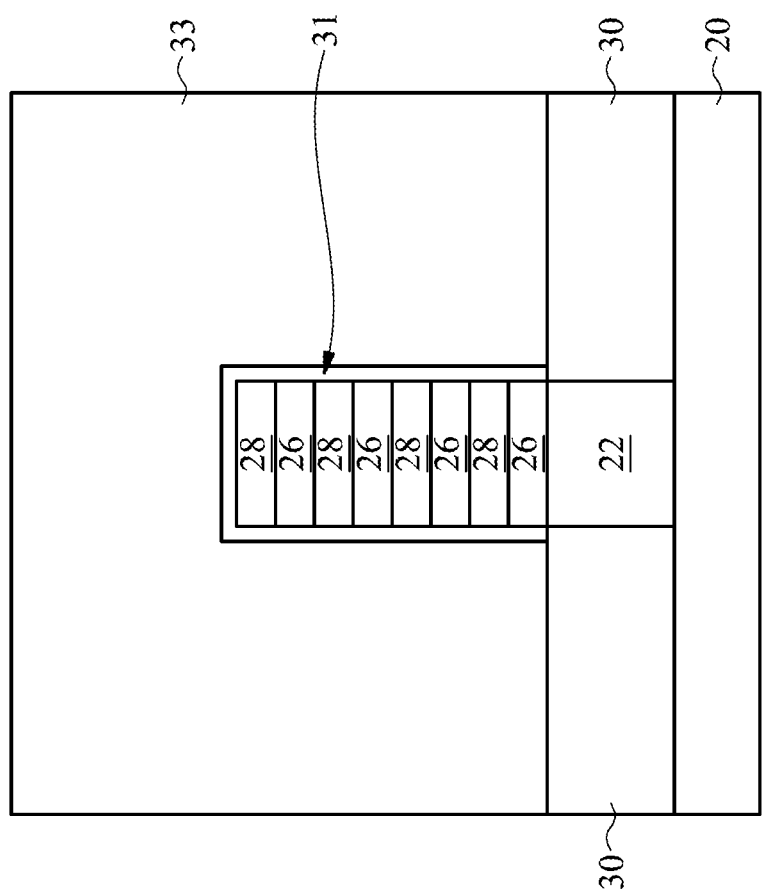

FIGS. 12A-C through 21 depict embodiments of forming contacts for making electrical connections to epitaxial source/drain regions. Referring to FIGS. 12A, 12B, and 12C, epitaxial source/drain regions 38 are epitaxially grown in the recesses. The epitaxial growth may be by using MOCVD, MBE, LPE, VPE, the like, or a combination thereof. The epitaxial source/drain regions 38 may comprise any acceptable material, such as appropriate for the device type, e.g., n-type or p-type. For example, the epitaxial source/drain regions 38 for an n-type device may comprise silicon, SiC, SiCP, SiGeP, SiP, SiGeSnP, or the like, and the epitaxial source/drain regions 38 for a p-type device may comprise SiGe, SiGeB, Ge, GeB, GeSn, GeSnB, a boron-doped III-V compound material, or the like. The epitaxial source/drain regions 38 may have surfaces raised from respective outer surfaces of the fin and may have facets. In some embodiments, the structure of the fin, including superlattice 24, allows for the epitaxial source/drain regions 38 to have shorter lateral widths W1 (shown in FIG. 12A). In some embodiments, W1 is about 15 nm to about 45 nm. Because of the shorter lateral width W1, the capacitance between the gate and the drain ($C_{GD}$) may be reduced, allowing for the semiconductor device to have better performance. However, when a conventional contact is used to provide an electrical connection to the epitaxial source/drain regions 38, the shorter lateral width W1 may increase the resistance of the source/drain ($R_{SD}$), thereby degrading the performance of the semiconductor device. As will be described in detail below, contacts formed in accordance with some embodiments described herein allow for a reduction of the resistance of the source/drain contacts ($R_{CSD}$), thereby allowing for improved performance.

Although not specifically illustrated, different materials may be used for epitaxial source/drain regions 38 of a p-type device and epitaxial source/drain regions 38 of an n-type device in a complementary device. For example, a first region of the substrate 20 (e.g., where the n-type device is to be formed) can be masked by a first hard mask while a second region of the substrate 20 (e.g., where the p-type device is to be formed) is exposed and processed to form the epitaxial source/drain regions 38. The first hard mask can then be removed, and a second hard mask can be formed. The second region can be masked by the second hard mask while the first region is exposed and processed to form the epitaxial source/drain regions 38 in steps 150 and 152. The second hard mask can then be removed.

The epitaxial source/drain regions 38 of the fin may be implanted with dopants, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type impurities for source/drain regions for an n-type device in the first region may be any of the n-type impurities previously discussed, and the p-type impurities for source/drain regions in for the p-type device in the second region may be any of the p-type impurities previously discussed. In other embodiments, the epitaxial source/drain regions 38 may be in situ doped during growth.

Figure 13B:
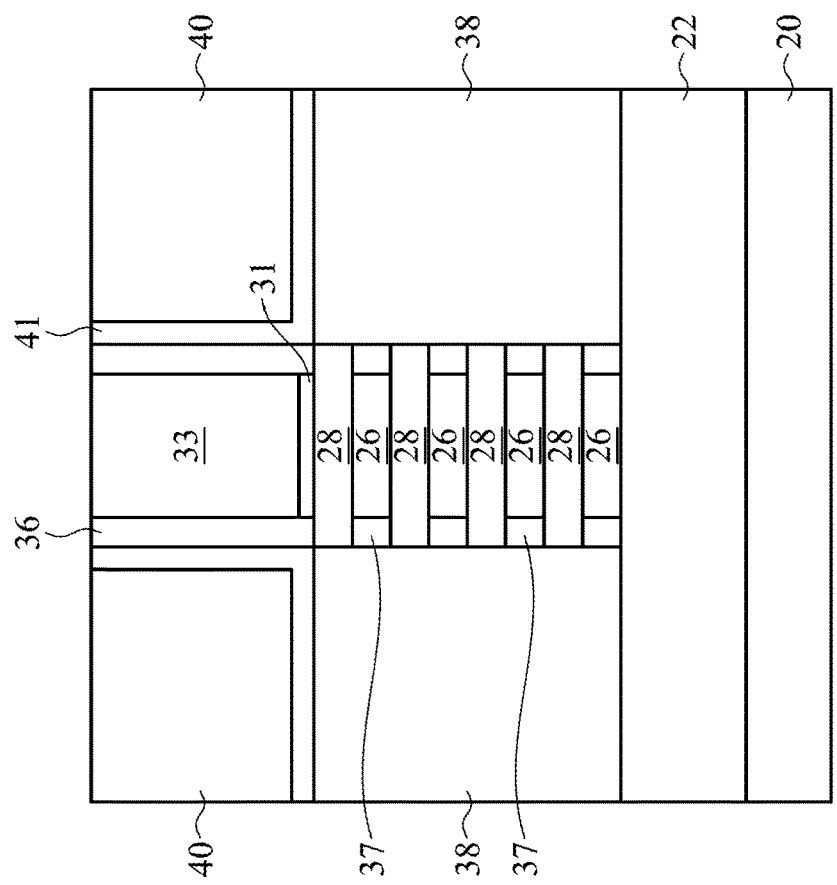
FIGS. 13A, 13B, and 13C are perspective and cross sectional views of an intermediate stage in the forming of a semiconductor device in accordance with some embodiments.
Figure 13A:
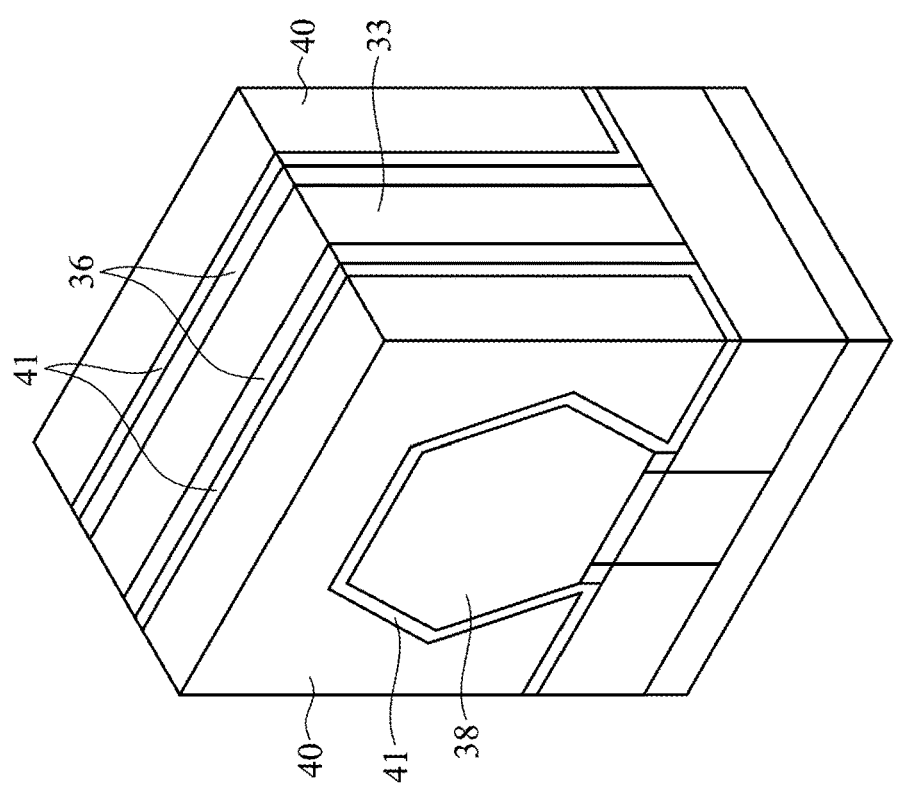
Figure 13C:
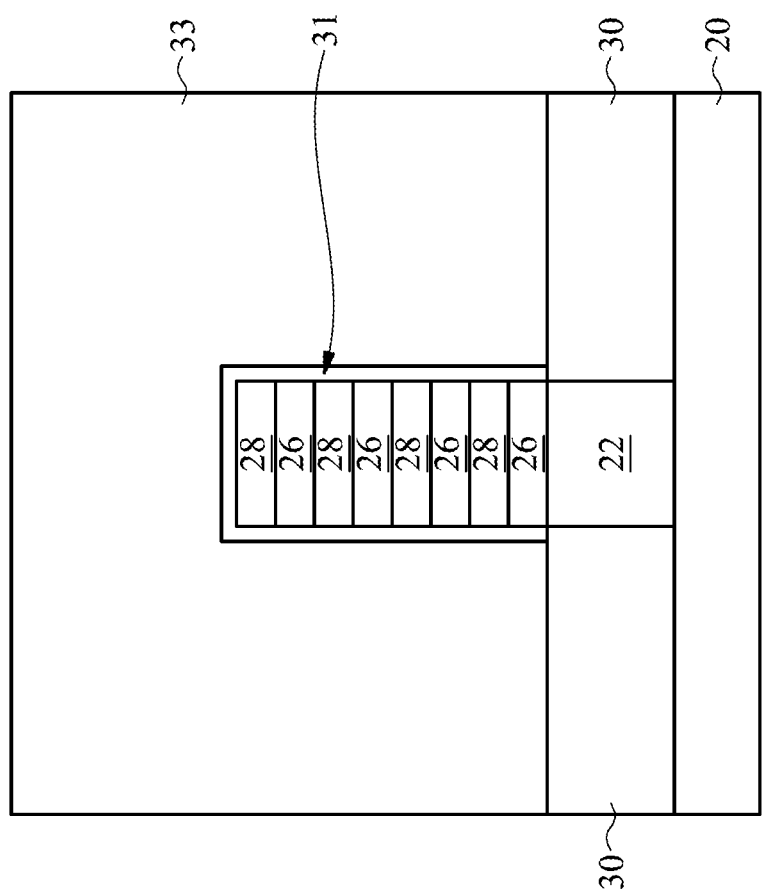

In FIGS. 13A, 13B, and 13C, an etch stop layer (ESL) 41 is conformally formed on the epitaxial source/drain regions 38, the gate spacers 36, the dummy gate 33, and the isolation regions 30. In some embodiments, the ESL 41 may comprise silicon nitride, silicon carbonitride, or the like, and may be formed using Atomic Layer Deposition (ALD), chemical vapor deposition (CVD), the like, or a combination thereof. A bottom inter-layer dielectric (ILD0) 40 is formed over the ESL 41. The ILD0 40 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Further in FIGS. 13A, 13B, and 13C, a planarization process, such as a CMP, is performed to level the top surface of ILD0 40 with the top surfaces of the dummy gate 33. Accordingly, a top surface of the dummy gate 33 is exposed through the ILD0 40.

Figure 14B:
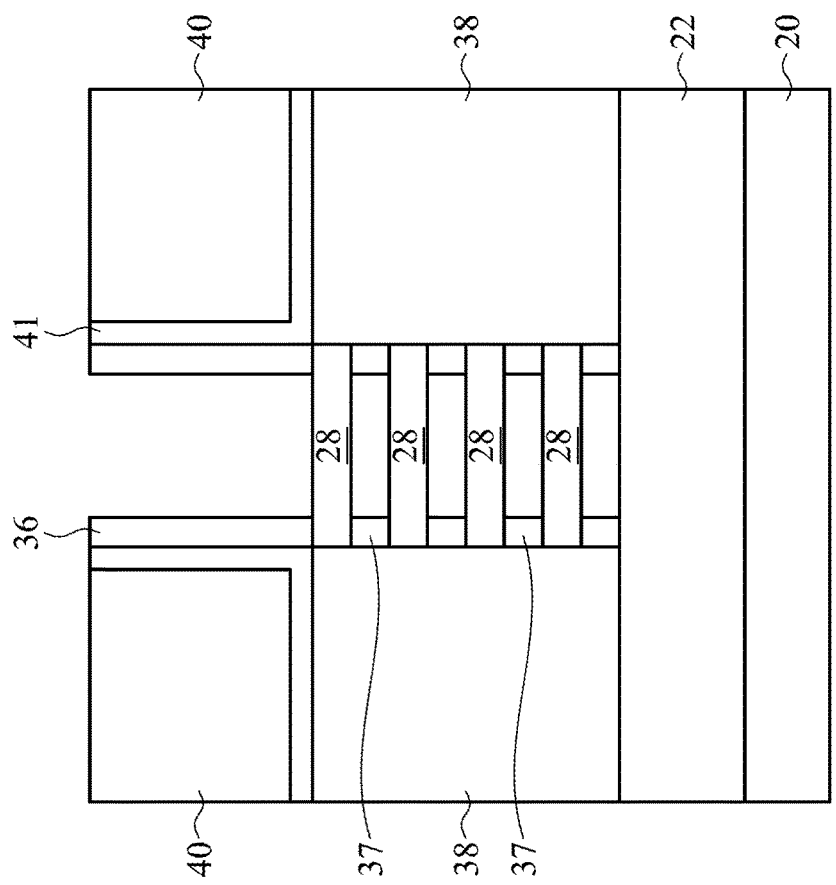
FIGS. 14A, 14B, and 14C are perspective and cross sectional views of an intermediate stage in the forming of a semiconductor device in accordance with some embodiments.
Figure 14A:
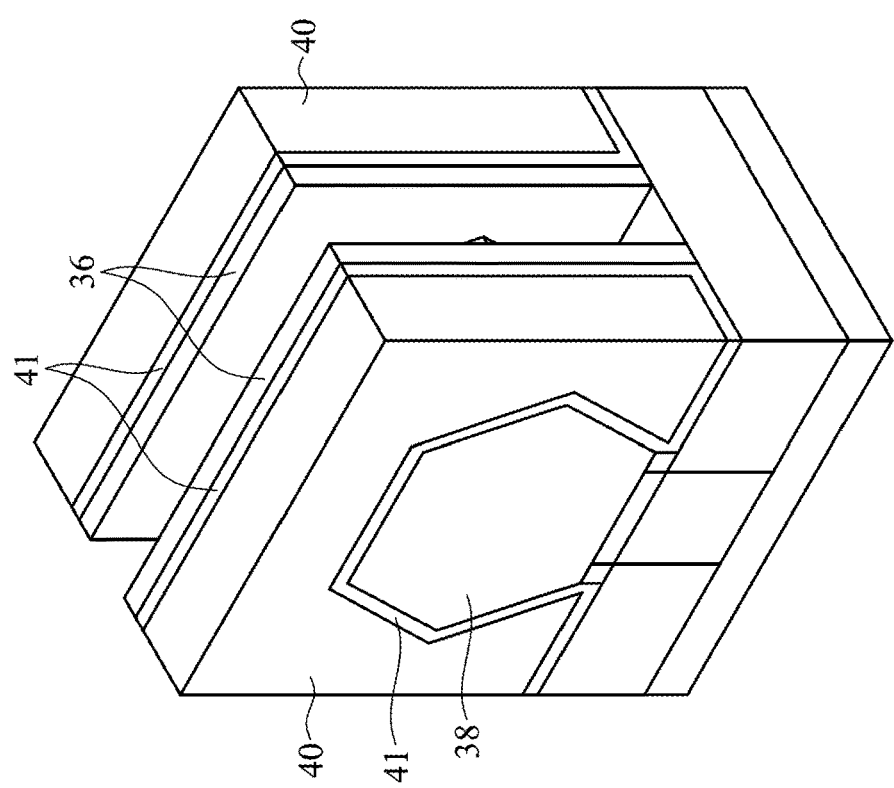
Figure 14C:
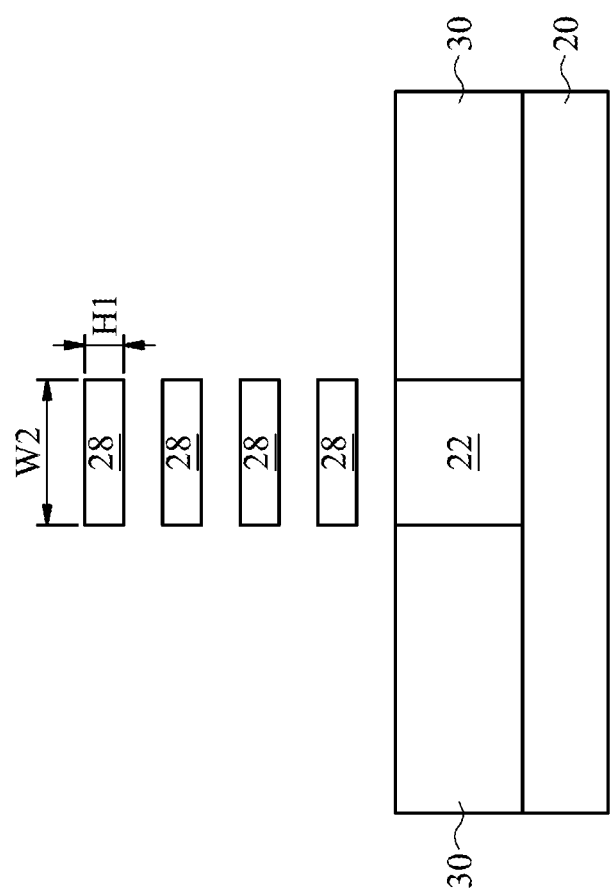

In FIGS. 14A, 14B, and 14C, the dummy gate 33 and the dummy gate dielectric 31 are removed in an etching step(s), so that an opening through the ILD0 40 and defined by the gate spacers 36 is formed to the fin, e.g., the superlattice 24. The opening exposes a channel region of the fin, e.g., the superlattice 24. The channel region is disposed between the neighboring pair of epitaxial source/drain regions 38. The etching step(s) may be selective to the materials of the dummy gate 33 and the dummy gate dielectric 31, which etching may be a dry or wet etching. During the etching, the dummy gate dielectric 31 may be used as an etch stop layer when the dummy gate 33 is etched. The dummy gate dielectric 31 may then be etched after the removal of the dummy gate 33.

Further in FIGS. 14A, 14B, and 14C, remaining portions of first layers 26 are removed, for example using one or more selective etching steps so that substantially only the first layers 26 of the superlattice 24 are etched. As shown in FIG. 14C, a width W2 of each of the second layers 28 is in a range of 5 nm to 40 nm. A height H1 of each of the second layers 28 is in a range of 5 nm to 10 nm.

Figure 15C:
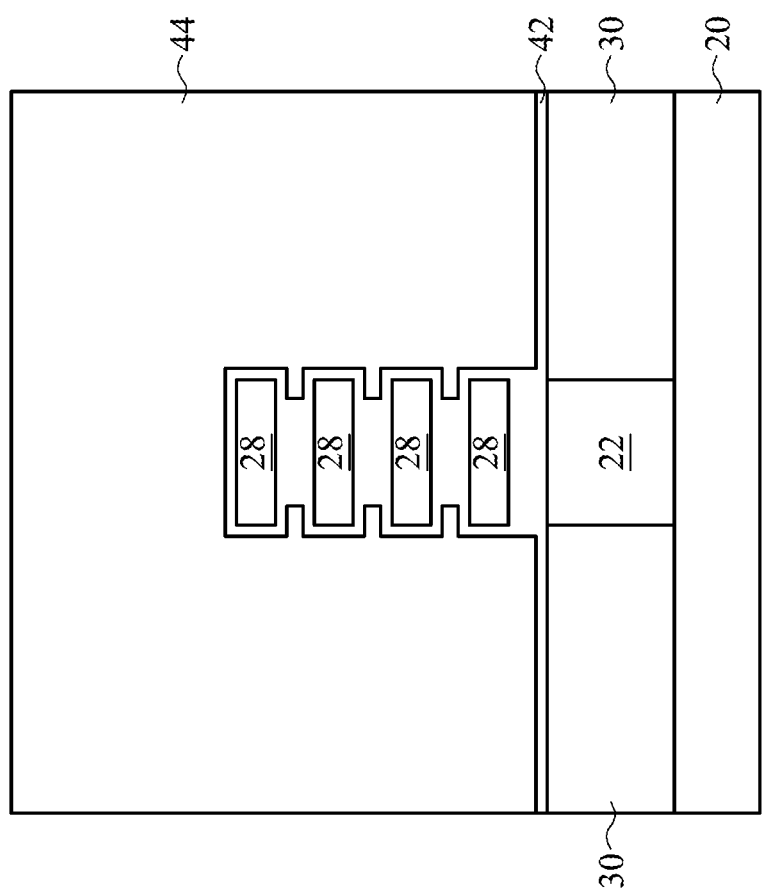

In FIGS. 15A, 15B, and 15C, a gate dielectric 42 and a gate electrode 44 are formed in the opening through the ILD0 40. The gate dielectric 42 can include a high-k dielectric layer formed conformally on the top surface of the ILD0 40 and in the opening along sidewalls of the gate spacers 36. The high-k dielectric layer may have a k value greater than about 7.0, and may include a metal oxide or a silicate of Hf, Al, Zr, La, Mg, Ba, Ti, Pb, and combinations thereof. The formation methods of high-k dielectric layer may include ALD, CVD, Molecular-Beam Deposition (MBD), the like, or a combination thereof. Other embodiments contemplate other materials for the gate dielectric 42, such as materials that are not high-k.

As illustrated in FIGS. 15B and 15C, the gate dielectric 42 is conformal to the second layers 28. Depending on the distance between neighboring second layers 28, the gate dielectric 42 may coalesce between the neighboring second layers 28, as illustrated. In other embodiments, the gate dielectric 42 may not coalesce between neighboring second layers 28.

The gate electrode 44 is formed on the gate dielectric 42. The gate electrode 44 can be a multi-layered structure. For example, the gate electrode 44 can include a capping layer conformally formed on the gate dielectric 42, one or more work function tuning layers conformally formed on the capping layer, and a metal-containing material, such as a metal, formed on the work function tuning layers and filling the opening. In an example, the capping layer can comprise a first sub-layer on the gate dielectric 42 formed of TiN or the like using ALD, CVD, or the like, and a second sub-layer on the first sub-layer formed of TaN or the like using ALD, CVD, or the like. The work function tuning layer(s) can be formed of TiAl, TiN, or the like using ALD, CVD, or the like. The metal-containing material can be tungsten (W), aluminum (Al), cobalt (Co), ruthenium (Ru), a combination thereof or the like deposited using CVD, physical vapor deposition (PVD), the like, or a combination thereof.

Further, as described above in connection with the gate dielectric 42, the gate electrode 44 can extend at least partially between surfaces of the second layers 28 because the first layers 26 have been removed. A device according to some of these embodiments can be a gate all-around (GAA) device. The resulting configuration of the gate dielectric 42 and gate electrode 44 depicted in FIGS. 15A, 15B, and 15C can result in a larger electrical field generated by the gate electrode 44 affecting current flow in the channel region in the second layers 28. This larger electrical field can increase short channel control even at small technology nodes, such as less than 14 nm.

Next, a planarization process, such as a CMP, may be performed to remove the excess portions of gate electrode 44 and the gate dielectric 42, which excess portions are over the top surface of ILD0 40. The resulting structure is depicted in FIGS. 15A-C.

Figure 16B:
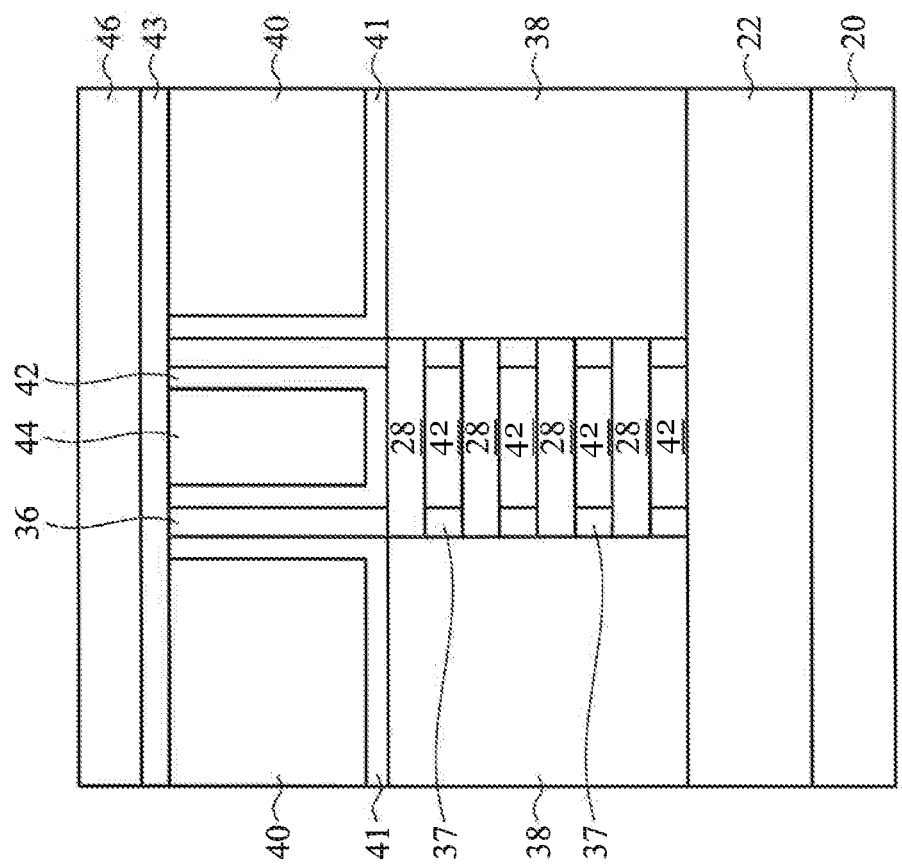
FIGS. 16A, 16B, and 16C are perspective and cross sectional views of an intermediate stage in the forming of a semiconductor device in accordance with some embodiments.
Figure 16A:
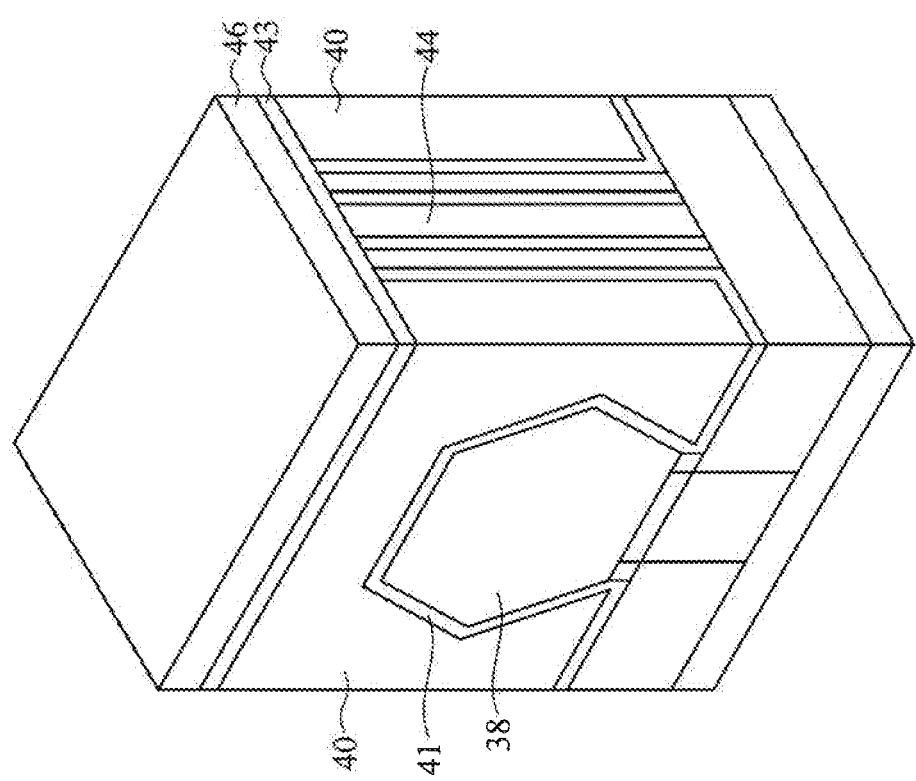
Figure 16C:
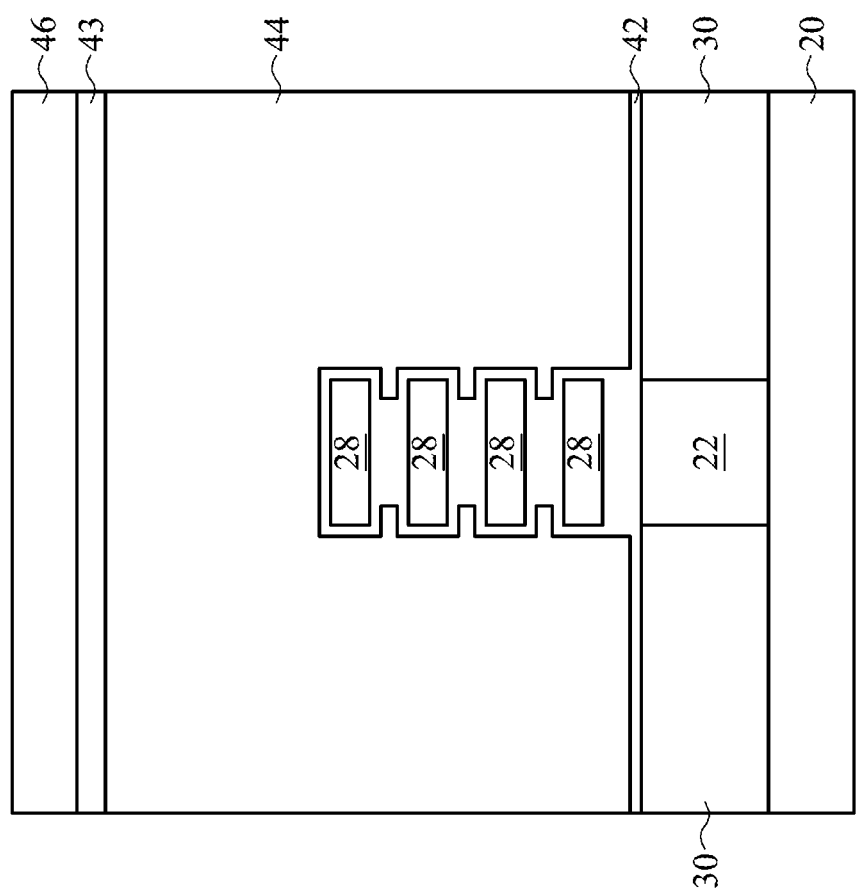

In FIGS. 16A, 16B, and 16C, an etch stop layer (ESL) 43 is conformally formed on the ILD0 40 and the gate electrode 44. In some embodiments, the ESL 43 may comprise silicon nitride, silicon carbonitride, or the like, and may be formed using Atomic Layer Deposition (ALD), chemical vapor deposition (CVD), the like, or a combination thereof. Further, an ILD1 46 is deposited over the ILD0 40 and the gate electrode 44. The ILD1 46 is formed of a dielectric material such as PSG, BSG, BPSG, USG, or the like, and may be deposited by any suitable method, such as CVD and PECVD.

Figure 17B:
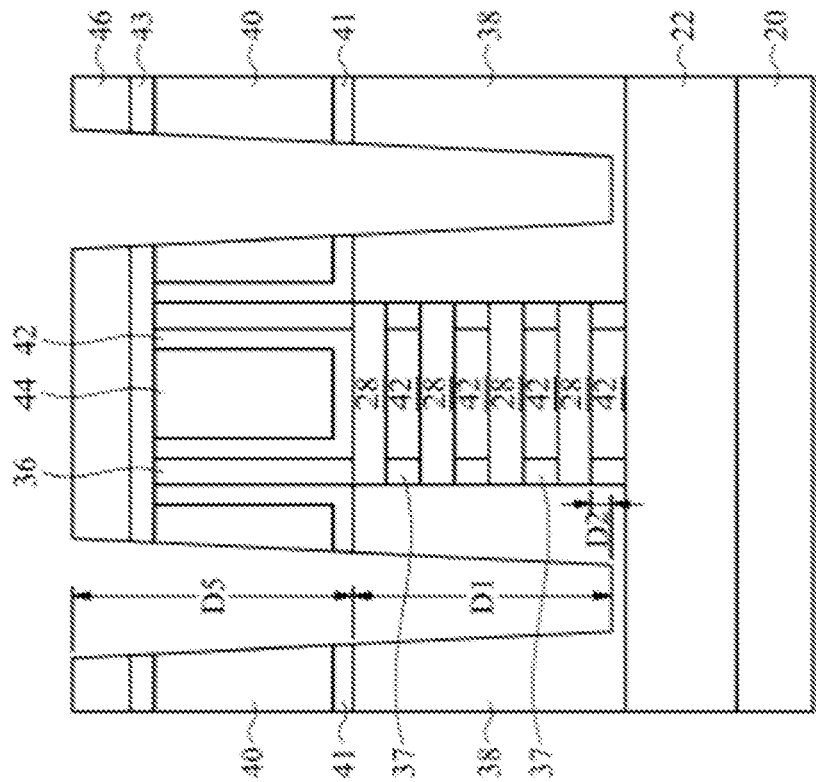
FIGS. 17A, 17B, and 17C are perspective and cross sectional views of an intermediate stage in the forming of a semiconductor device in accordance with some embodiments.
Figure 17A:
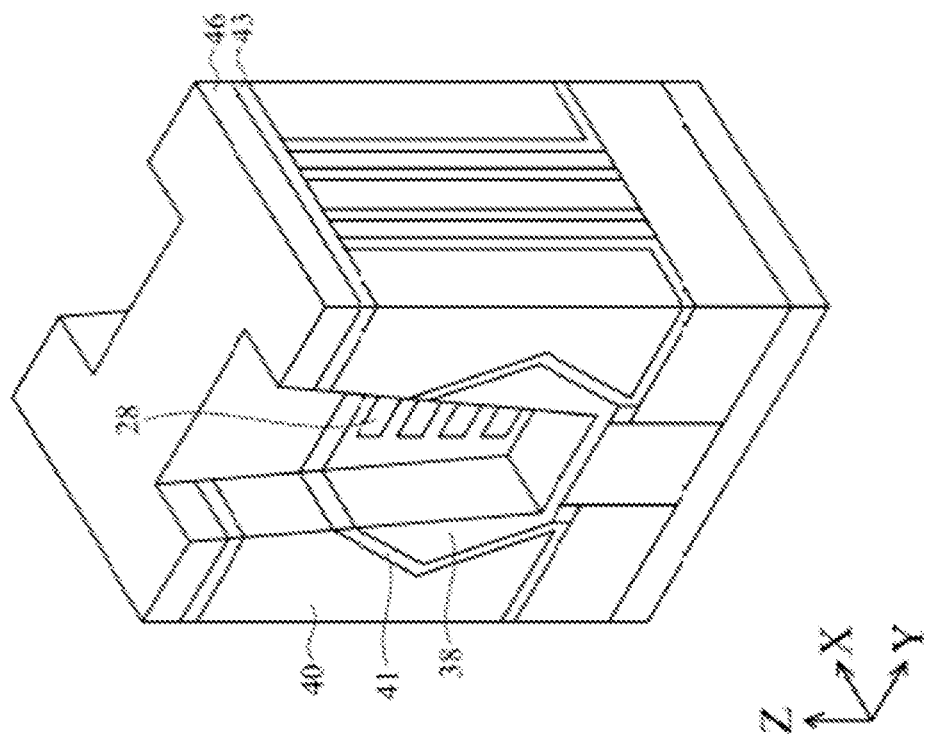
Figure 17C:
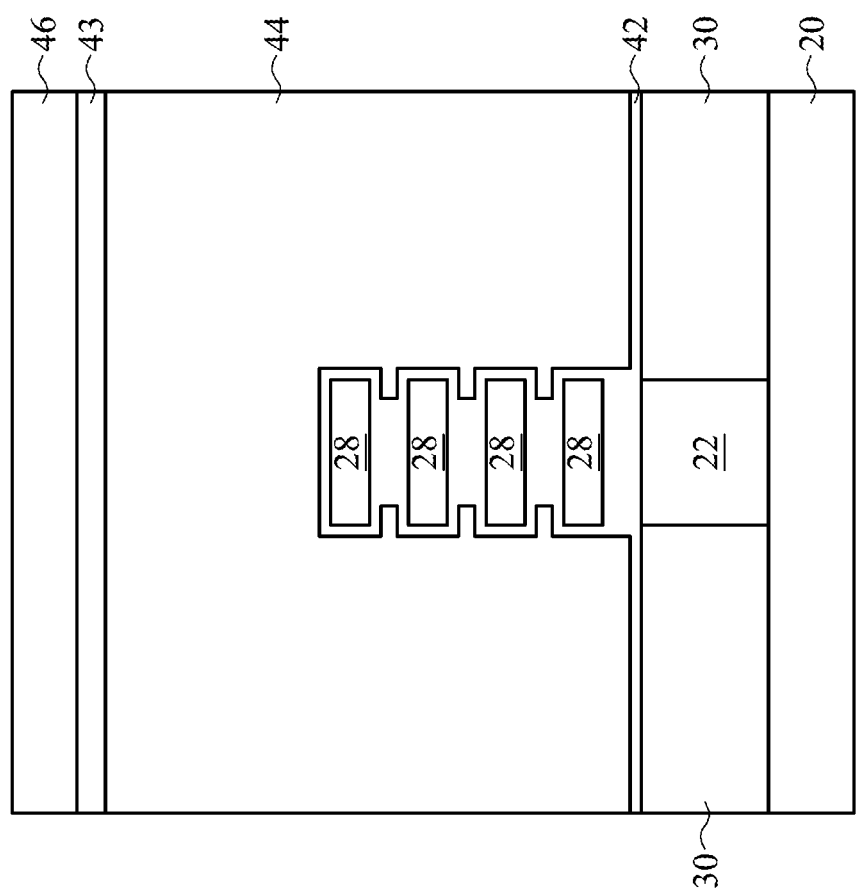

Next, in FIGS. 17A, 17B, and 17C, openings for contacts are formed through the ILD1 46, ILD0 40 and into the epitaxial source/drain regions 38. The openings may be formed using acceptable photolithography and etching techniques. Each opening has a respective depth D1 in one of the epitaxial source/drain regions 38 and a respective depth D5 over one of the epitaxial source/drain regions 38. When a device has four second layers 28, depth D1 may be in a range of about 23 nm to about 70 nm, and depth D5 may be in a range of about 20 nm to about 50 nm. A bottom surface of each opening is disposed in one of the epitaxial source/drain regions 38, and is below a bottom surface of the bottom second layer 28. A distance D2 between a bottom surface of each opening and the bottom surface of the bottom second layer 28 is 3 nm or more, for example between about 3 nm and about 5 nm. For each opening, the depth D1 is determined by adding the height of each layer of the second layers 28, the spacing between each layer of the second layers 28, and the distance D2.

FIGS. 18 through 21 depict embodiments of contacts that are formed in the openings created in FIGS. 17A-C for making electrical connections to the epitaxial source/drain regions 38. Contacts formed in accordance with some embodiments penetrate relatively deeply into the epitaxial source/drain regions 38 compared to contacts formed using conventional methods. As described above in connection with FIGS. 12A, 12B, and 12C, epitaxial source/drain regions 38 formed as described herein may have relatively short lateral widths, which can reduce the capacitance between the gate and the drain ($C_{GD}$), leading to improved performance. However, the shorter lateral widths may also increase the resistance of the epitaxial source/drain regions ($R_{SD}$) thereby degrading the performance of the device. In some embodiments, contacts as depicted in FIGS. 18-21 may penetrate relatively deeply into the epitaxial source/drain regions 38, thereby increasing the surface area of contact between the contacts and the epitaxial source/drain regions 38. In some embodiments, the surface area of contact between the contacts depicted in FIGS. 18 through 21 and the epitaxial source/drain regions 38 may be increased by four times or more compared to contacts formed using conventional methods. Additionally, a material composition of the contacts may be selected to have a low resistivity. Accordingly, the resistance $R_{CSD}$ of the contacts may be reduced, which may lead to improved performance of the device.

Figure 18:
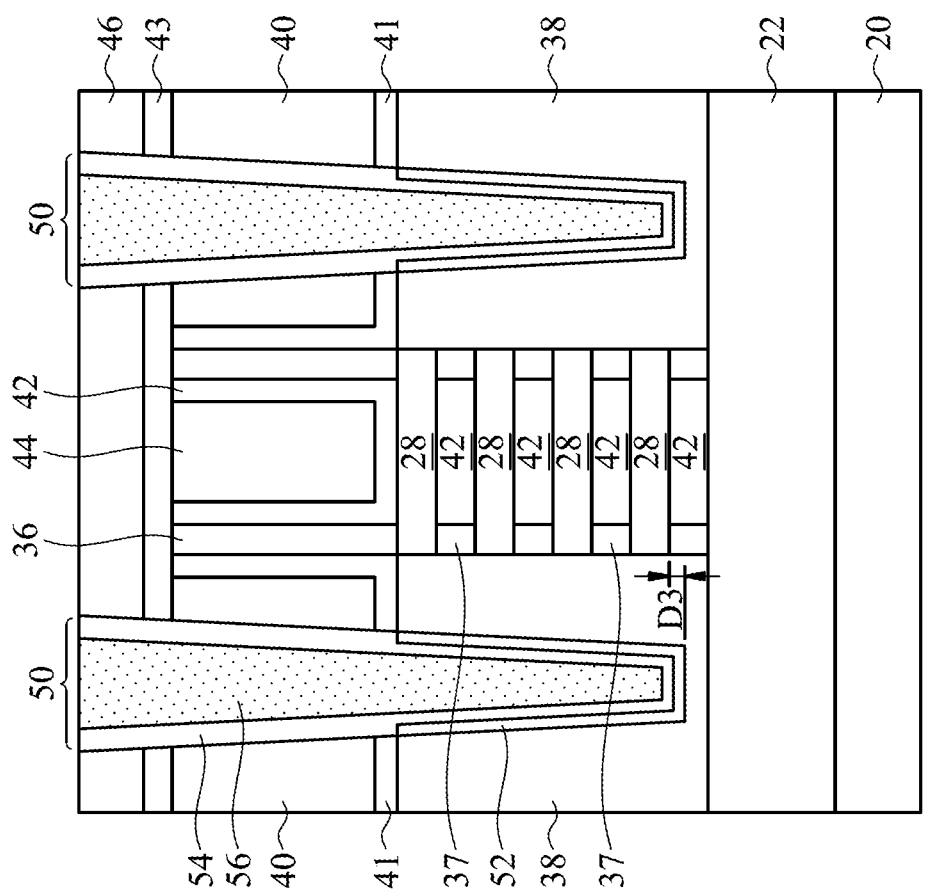
FIGS. 18-21 are cross sectional views of intermediate stages in the manufacturing of various semiconductor devices in accordance with some embodiments.

Referring to FIG. 18, contacts 50 are formed in the openings formed in FIGS. 17A-C. In some embodiments, a silicide 52 is formed in the openings lining the epitaxial source/drain regions 38. To form silicide 52, a metal layer may be deposited in the openings in which the contacts 50 are formed, and an anneal process may be performed, to form the silicide 52. Unreacted metal, if any, may be subsequently removed. Any suitable metal layer may be deposited, such as Ti, Ni, Co, or the like. Next, a barrier layer 54 may be formed. In some embodiments, the barrier layer 54 may be formed using a suitable deposition process, such as ALD, PVD, or the like. The barrier layer 54 may include any suitable material. In an embodiment, the barrier layer 54 is formed of TiN. Optionally, the barrier layer 54 has a resistivity of about 500 μΩ-cm to about 1000 μΩ-cm. Next, a metal 56 is formed over the barrier layer 54. The metal 56 may be formed by electroplating or by using a suitable deposition process. Metal 56 may include any suitable metal containing material. Optionally, metal 56 includes one or more low resistivity metals, such as iridium (Ir), rhodium (Rh), tungsten (W), cobalt (Co), ruthenium (Ru), or the like. Next, a planarization process may be performed, such as a chemical mechanical polishing process. The resulting structure is shown in FIG. 18. Contacts 50 comprise silicide 52, barrier layer 54, and metal 56.

As discussed in connection with FIGS. 17A-C, bottom surfaces of the openings in which the contacts 50 are formed each extend a distance D2 lower than the bottom surface of the bottom second layer 28, where D2 is 3 nm or more, for example between about 3 nm and about 5 nm. Accordingly, the bottom surfaces of each contact 50 is a distance D3 lower than the bottom surface of the bottom second layer 28, where D3 is 3 nm or more, for example between about 3 nm and about 5 nm. In some embodiments, distance D3 being 3 nm or more allows for the reduction in the source/drain contact resistance $R_{CSD}$ described herein.

As shown in FIG. 18, contacts 50 may each have a first region and a second region, where the second region is the portion of the contact 50 that extends through a respective epitaxial source/drain region 38, and the first region is the portion of the contact 50 that overlies the second region. In a contact that is formed using conventional methods, the first region may have a thickness that is greater than a thickness of the second region. In FIG. 18, the thickness of contacts 50 is greater in the second region than in the first region. Further, although not specifically shown in FIG. 18, in the direction that extends along the axis C-C of FIG. 5A, the width of each contact 50 exceeds the width W2 of the second layers 28 (shown in FIG. 14C).

The resistance of each contact 50 may be determined according to the material composition of the contacts 50. A three dimensional coordinate system X-Y-Z is shown in FIG. 17A. In the X-Z plane of FIG. 17A, and in the second region, the contacts 50 of FIG. 18 may be composed of 30% silicide 52, 20% barrier layer 54, and 50% metal 56. In the X-Z plane of FIG. 17A, and in the first region, the contacts 50 of FIG. 18 may be composed of 20% barrier layer 54 and 80% metal 56. As used herein, percentages are volume percentages.

Figure 19:
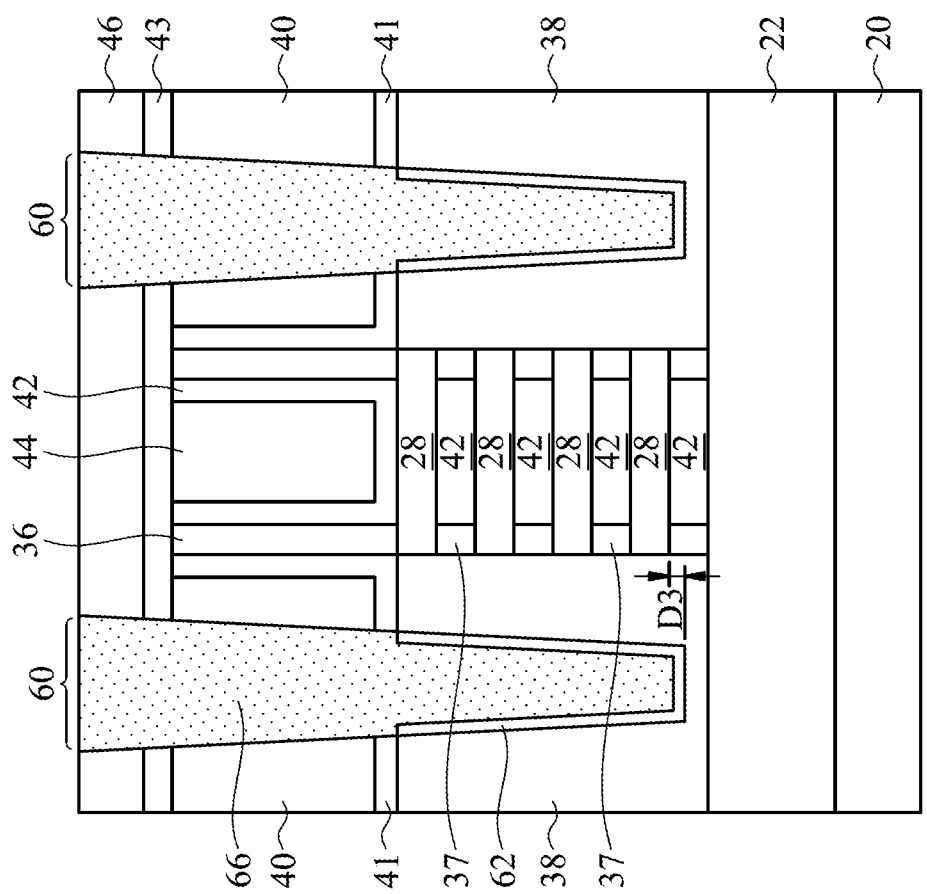

FIG. 19 depicts contacts 60 formed in the openings formed in FIGS. 17A-C. In some embodiments, a silicide 62 is formed lining the epitaxial source/drain regions 38. To form silicide 62, a metal layer may be deposited in the openings in which the contacts 50 are formed, and an anneal process may be performed to form the silicide 62. Subsequently, any unreacted metal, if any, may be removed. Any suitable metal layer may be deposited, such as Ti, Ni, Co, or the like. Next, a metal 66 is formed directly over the silicide 62, without any intervening barrier layer. The metal 66 may be formed by electroplating, or by using a suitable deposition process. Optionally, metal 66 includes one or more low resistivity metals, such as Ir, Rh, W, Co, Ru, or the like. Next, a planarization process may be performed, such as a chemical mechanical polishing process. The resulting structure is shown in FIG. 19. Contacts 6o comprise silicide 62 and metal 66.

As discussed in connection with FIGS. 17A-C, bottom surfaces of the openings in which the contacts 60 are formed each extend a distance D2 lower than the bottom surface of the bottom second layer 28, where D2 is 3 nm or more, for example between about 3 nm and about 5 nm. Accordingly, the bottom surfaces of each contact 60 is a distance D3 lower than the bottom surface of the bottom second layer 28, where D3 is 3 nm or more, for example between about 3 nm and about 5 nm. In some embodiments, distance D3 being 3 nm or more allows for the reduction in the source/drain contact resistance $R_{CSD}$ described herein.

As shown in FIG. 19, contacts 60 may each have a first region and a second region, where the second region is the portion of the contact 60 that extends through a respective epitaxial source/drain region 38, and the first region is the portion of the contact 60 that overlies the second region. In a contact that is formed using conventional methods, the first region may have a thickness that is greater than a thickness of the second region. In FIG. 19, the thickness of contacts 60 is greater in the second region than in the first region. Further, although not specifically shown in FIG. 19, in the direction that extends along the axis C-C of FIG. 5A, the width of each contact 60 exceeds the width W2 of the second layers 28 (width W2 is shown in FIG. 14C).

A three dimensional coordinate system X-Y-Z is shown in FIG. 17A. In the X-Z plane of FIG. 17A, and in the second region, the contacts 60 of FIG. 19 may be composed of 30% silicide 62, and 70% of metal 66. In the X-Z plane of FIG. 17A, and in the first region, the contacts 60 of FIG. 19 may be composed 100% of metal 66.

Figure 20:
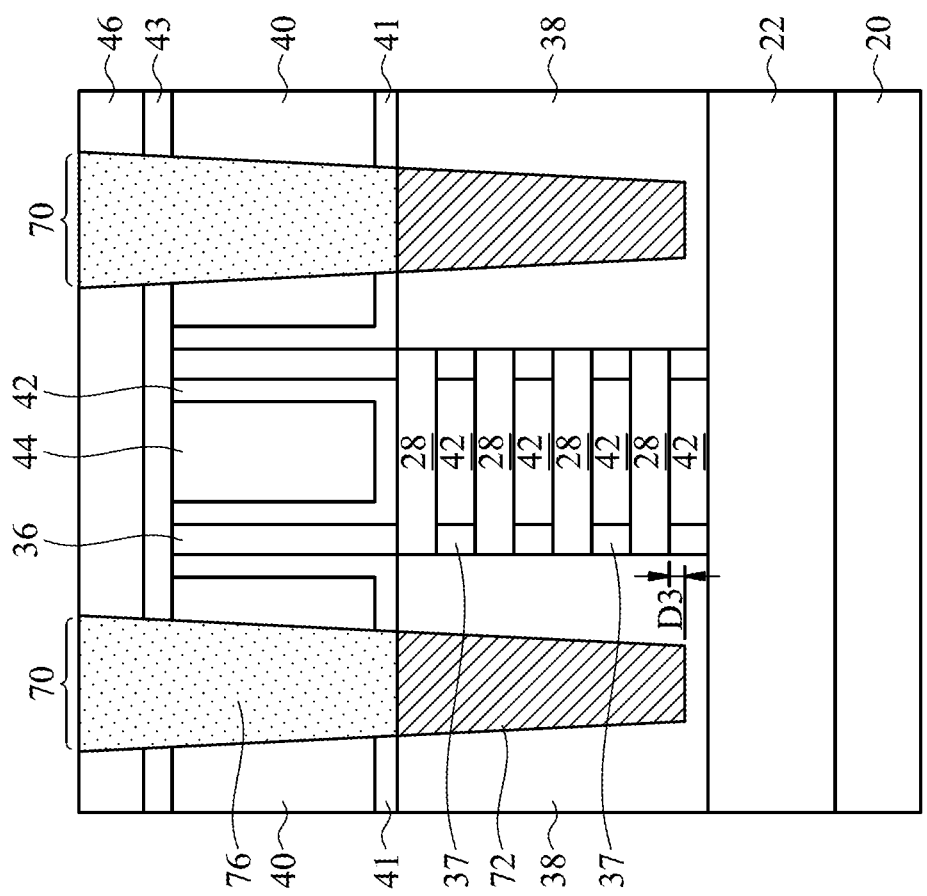

FIG. 20 depicts contacts 70 formed in the openings formed in FIGS. 17A-C. In some embodiments, a silicide 72 is deposited in the portions of the openings extending through the epitaxial source/drain regions 38. As shown in FIG. 20, the silicide 72 fills the openings in the epitaxial source/drain regions 38, and a top surface of the silicide 72 may be level with a top surface of an epitaxial source/drain region 38. The silicide 72 may comprise a low resistivity silicide material. In some embodiments, silicide 72 may be formed of TiSi, NiSi, CoSi, or the like. Silicide 72 can be formed using ALD, CVD or the like. In some embodiments SiH4 may be used as a co-flow to form silicide 72. Next, a metal 76 is formed directly over the silicide 72. The metal 76 may be formed by electroplating, or by using a suitable deposition process. Optionally, metal 76 includes one or more low resistivity metals, such as Ir, Rh, W, Co, Ru, or the like. Next, a planarization process may be performed, such as a chemical mechanical polishing process. The resulting structure is shown in FIG. 20. Contacts 70 comprise silicide 72 and metal 76.

As discussed in connection with FIGS. 17A-C, bottom surfaces of the openings in which the contacts 70 are formed each extend a distance D2 lower than the bottom surface of the bottom second layer 28, where D2 is 3 nm or more, for example between about 3 nm and about 5 nm. Accordingly, the bottom surfaces of each contact 70 is a distance D3 lower than the bottom surface of the bottom second layer 28, where D3 is 3 nm or more, for example between about 3 nm and about 5 nm. In some embodiments, distance D3 being 3 nm or more allows for the reduction in the source/drain contact resistance $R_{CSD}$ described herein.

As shown in FIG. 20, contacts 70 may each have a first region and a second region, where the second region is the portion of the contact 70 that extends through a respective epitaxial source/drain region 38, and the first region is the portion of the contact 70 that overlies the second region. In a contact that is formed using conventional methods, the first region may have a thickness that is greater than a thickness of the second region. In FIG. 20, the thickness of contacts 70 is greater in the second region than in the first region. Further, although not specifically shown in FIG. 20, in the direction that extends along the axis C-C of FIG. 5A, the width of each contact 70 exceeds the width W2 of the second layers 28 (width W2 is shown in FIG. 14C).

A three dimensional coordinate system X-Y-Z is shown in FIG. 17A. In the X-Z plane of FIG. 17A, and in the second region, the contacts 70 of FIG. 20 may be composed 100% of silicide 72. In the X-Z plane of FIG. 17A, and in the first region, the contacts 70 of FIG. 20 may be composed 100% of metal 76.

Figure 21:
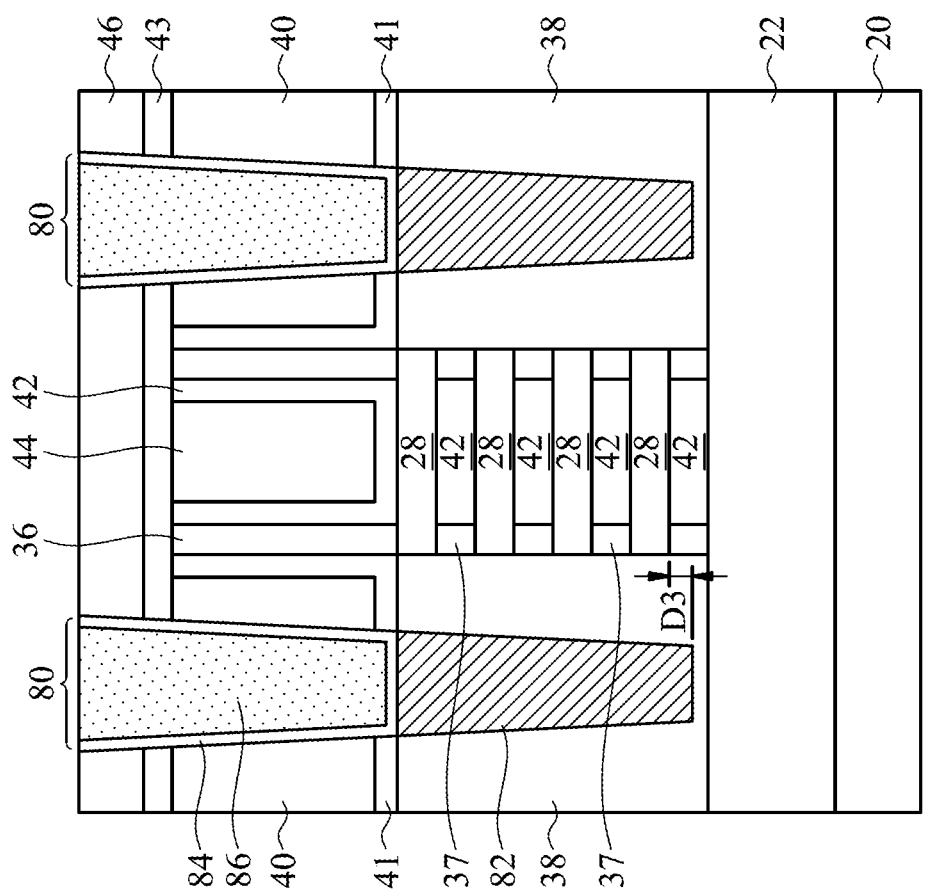

FIG. 21 depicts contacts 80 formed in the openings formed in FIGS. 17A-C. In some embodiments, a silicide 82 is deposited in the portions of the openings extending through the epitaxial source/drain regions 38. As shown in FIG. 21, the silicide 82 fills the openings in the epitaxial source/drain regions 38, and a top surface of the silicide 82 may be level with a top surface of an epitaxial source/drain region 38. The silicide 82 may comprise a low resistivity silicide material. In some embodiments, silicide 82 may be formed of TiSi, NiSi, CoSi, or the like. Silicide 82 can be formed using ALD, CVD or the like. In some embodiments SiH4 may be used as a co-flow to form silicide 82. Next, a barrier layer 84 may be formed along sidewalls of the remaining openings and along a top surface of the silicide 82. In some embodiments, the barrier layer 84 may be formed using a suitable deposition process, such as ALD, PVD, or the like. The barrier layer 84 may include any suitable material. In an embodiment, the barrier layer 84 is formed of TiN. Optionally, the barrier layer 84 has a resistivity of about 500 μΩ-cm to about 1000 μΩ-cm. Next, metal 86 is formed over the barrier layer 84. The metal 86 may be formed by electroplating, or by using a suitable deposition process. Optionally, metal 86 includes one or more low resistivity metals, such as Ir, Rh, W, Co, Ru, or the like. Next, a planarization process may be performed, such as a chemical mechanical polishing process. The resulting structure is shown in FIG. 21. Contacts 80 comprise silicide 82, barrier layer 84, and metal 86.

As discussed in connection with FIGS. 17A-C, bottom surfaces of the openings in which the contacts 80 are formed each extend a distance D2 lower than the bottom surface of the bottom second layer 28, where D2 is 3 nm or more, for example between about 3 nm and about 5 nm. Accordingly, the bottom surfaces of each contact 80 is a distance D3 lower than the bottom surface of the bottom second layer 28, where D3 is 3 nm or more, for example between about 3 nm and about 5 nm. In some embodiments, distance D3 being 3 nm or more allows for the reduction in the source/drain contact resistance $R_{CSD}$ described herein.

As shown in FIG. 21, contacts 80 may each have a first region and a second region, where the second region is the portion of the contact 80 that extends through a respective epitaxial source/drain region 38, and the first region is the portion of the contact 80 that overlies the second region. In a contact that is formed using conventional methods, the first region may have a thickness that is greater than a thickness of the second region. In FIG. 21, the thickness of contacts 80 is greater in the second region than in the first region. Further, although not specifically shown in FIG. 21, in the direction that extends along the axis C-C of FIG. 5A, the width of each contact 80 exceeds the width W2 of the second layers 28 (width W2 is shown in FIG. 14C).

A three dimensional coordinate system X-Y-Z is shown in FIG. 17A. In the X-Z plane of FIG. 17A, and in the second region, the contacts 80 of FIG. 21 may be composed 100% of silicide 82. In the X-Z plane of FIG. 17A, and in the first region, the contacts 80 of FIG. 21 may be composed 80% of metal 86 and 20% of barrier layer 84.

Figure 22B:
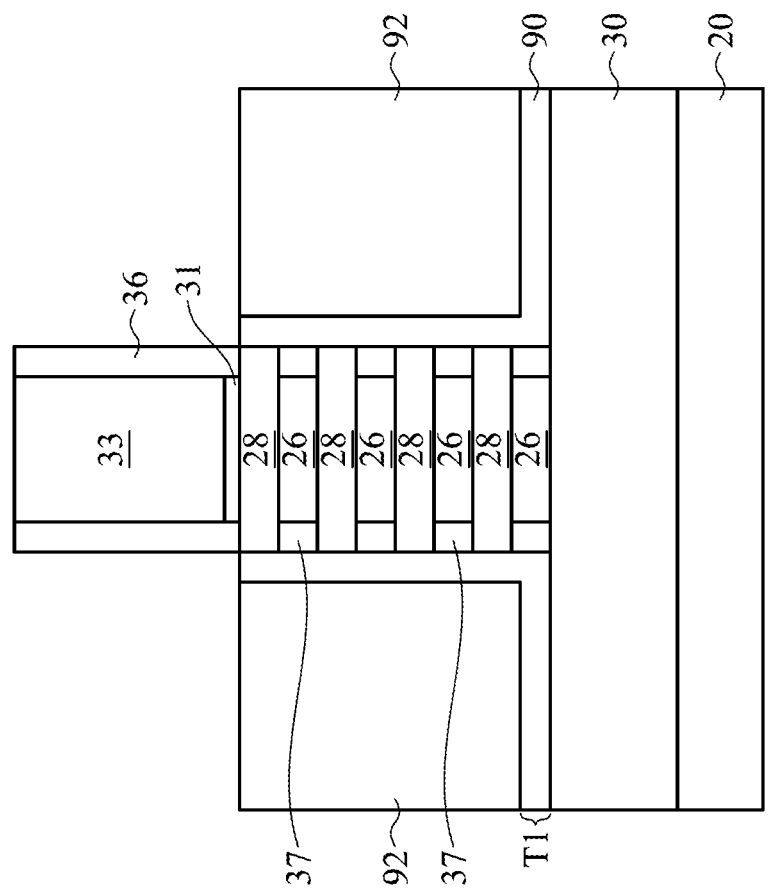
FIGS. 22A, 22BA, 22BB, and 22C are perspective and cross sectional views of an intermediate stage in the forming of a semiconductor device in accordance with some embodiments.

FIGS. 22A-C through 32 depict forming source/drain contacts extending through a silicide filled region in accordance with some embodiments. FIGS. 22A, 23A, 24A, 25A, 26A, 27A, and 28A are various perspective views of intermediate stages in the manufacturing of a semiconductor device in accordance with some embodiments. FIGS. 22BA, 22BB, 22C, 23B, 23C, 24B, 24C, 25B, 25C, 26B, 26C, 27B, 27C, and 28B are various cross-sectional views of the intermediate stages in the manufacturing of the finFET. FIGS. 22BA, 23B, 24B, 25B, 26B, 27B, and 28B are of the cross section "B" shown in FIG. 5A. FIGS. 22C, 23C, 24C, 25C, 26C, 27C, and 28C are of cross section "C" shown in FIG. 5A. FIG. 22BB is of the cross section "B" shown in FIG. 5A, but for multiple transistors.

Figure 22A:
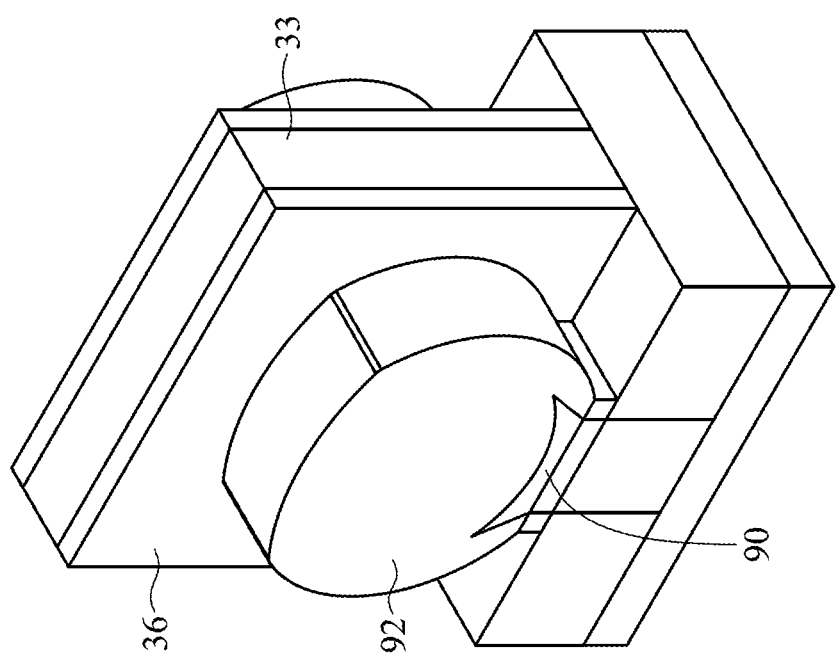
Figure 22B:
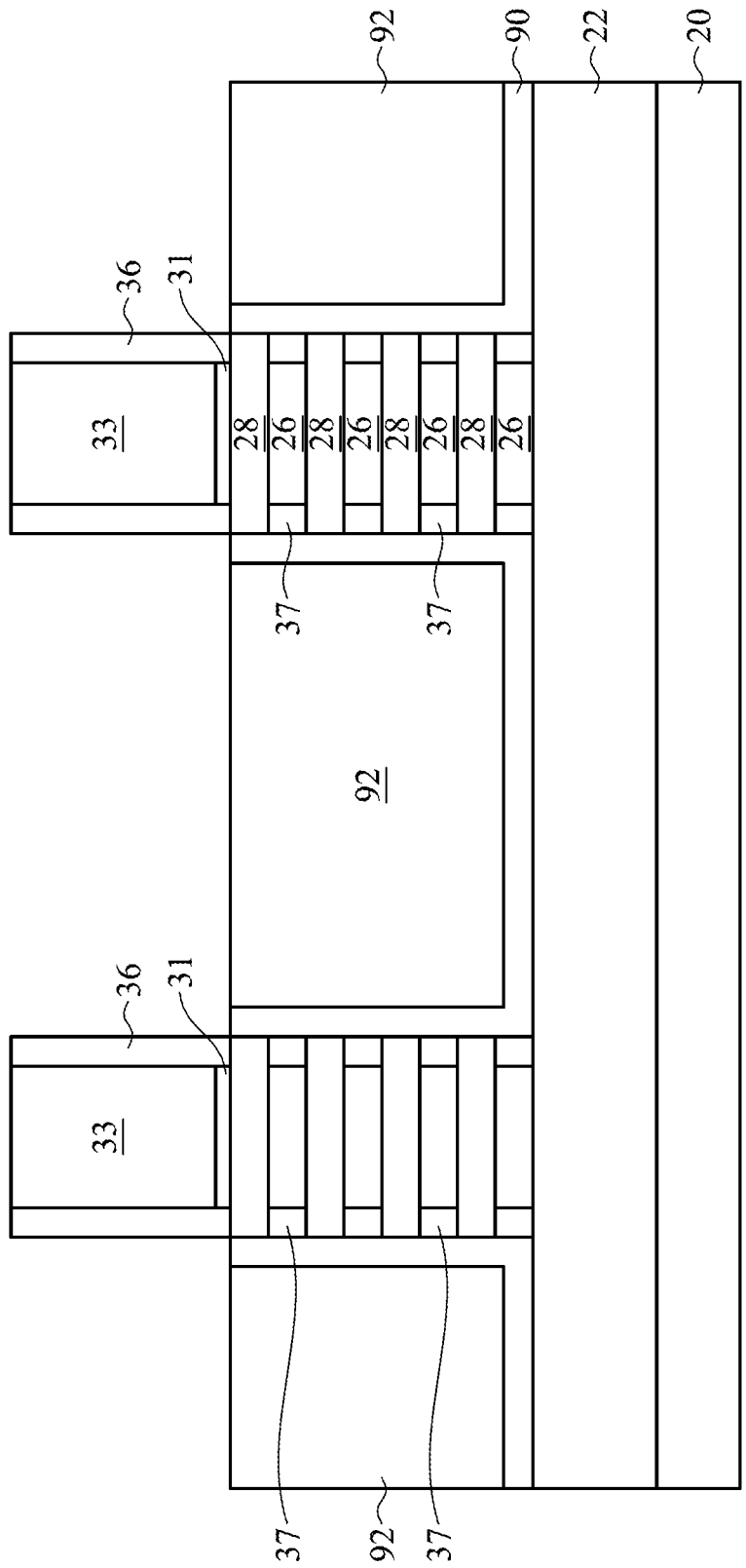
Figure 22C:
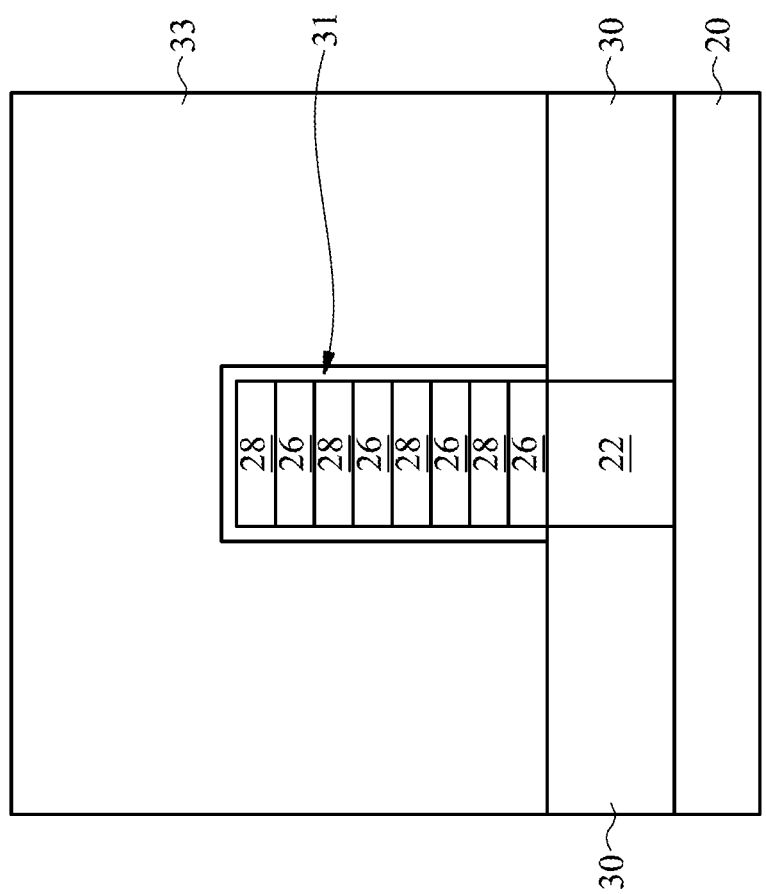

As discussed above in connection with FIGS. 11A, 11B, and 11C, spacers 37 are formed in the spaces between adjacent second layers 28 formed by the etching of the sidewalls of first layers 26. In some embodiments, spacers 37 may be used to physically secure each of the second layers 28 to the device when the remaining portions of the first layers 26 are subsequently removed (see FIGS. 24A, 24B, and 24C). Next, in accordance with some embodiments and referring to FIGS. 22A, 22BA, 22BB, and 22C, a first epitaxial source/drain layer 90 is epitaxially grown in the recesses that were formed in the source/drain regions of the fin (see FIGS. 9A-C)). First epitaxial source/drain layers 90 may be epitaxially grown using the same or similar methods as described above in connection with epitaxial source/drain regions 38 depicted in FIGS. 12A-C, although as shown in FIGS. 22A, 22BA, 22BB, and 22C, only a relatively thin layer is grown. First epitaxial source/drain layers 90 may be formed from suitable materials as described earlier, for example SiP, SiAs, SiGeB, or the like. In some embodiments, a thickness T1 of a first epitaxial source/drain layer 90 is about 3 nm to about 10 nm, such as about 5 nm. Thickness T1 is depicted in FIG. 22BA. In some embodiments, thickness T1 has about the same thickness as bottom first layer 26. In some embodiments, thickness T1 is in a range of about the same thickness as bottom first layer 26 to about the same thickness as a sum of the thickness of bottom first layer 26 and bottom second layer 28. As shown in FIG. 22BA, the first epitaxial source/drain layer 90 extends over the substrate 20 and buffer layer 22 (if formed), and along sidewalls of the superlattice 24. When multiple transistors are being formed on substrate 20, the first epitaxial source/drain layer 90 extends continuously along a recess formed between two adjacent superlattices 24 as shown in FIG. 22BB.

As described above in connection with FIGS. 12A-C, the first epitaxial source/drain layer 90 may be implanted with dopants, followed by an anneal process. The implantation processes may be the same as discussed above in connection with FIGS. 12A-C.

Next, a dummy material 92 is formed over the first epitaxial source/drain layer 90. Dummy material 92 may be epitaxially grown over the first epitaxial source/drain layer 90. A material composition of dummy material 92 is different than a material composition of the first epitaxial source/drain layer 90. As will be described in connection with FIGS. 27A-C, the different material compositions of dummy material 92 and first epitaxial source/drain layer 90 allows for dummy material 92 to be selectively etched in subsequent processing. In some embodiments dummy material 92 may be formed of similar materials and using similar processing as described above in connection with epitaxial source/drain regions 38, for example germanium or the like. In other embodiments, dummy material 92 may comprise AlOx. When dummy material 92 is formed of AlOx, dummy material 92 may be formed using a suitable deposition process, such as ALD or CVD. As shown in FIG. 22BB, the dummy material 92 fills the remaining portions of the recesses that are formed between two adjacent superlattices 24 that are not filled by first epitaxial source/drain layer 90.

Figure 23B:
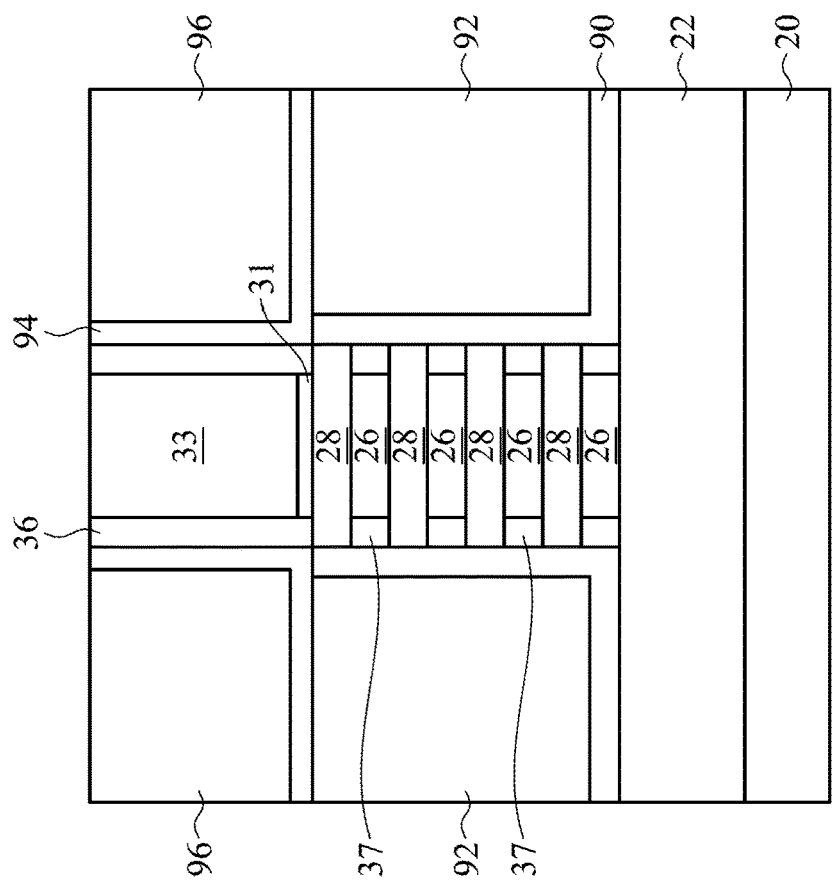
FIGS. 23A, 23B, and 23C are perspective and cross sectional views of an intermediate stage in the forming of a semiconductor device in accordance with some embodiments.
Figure 23A:
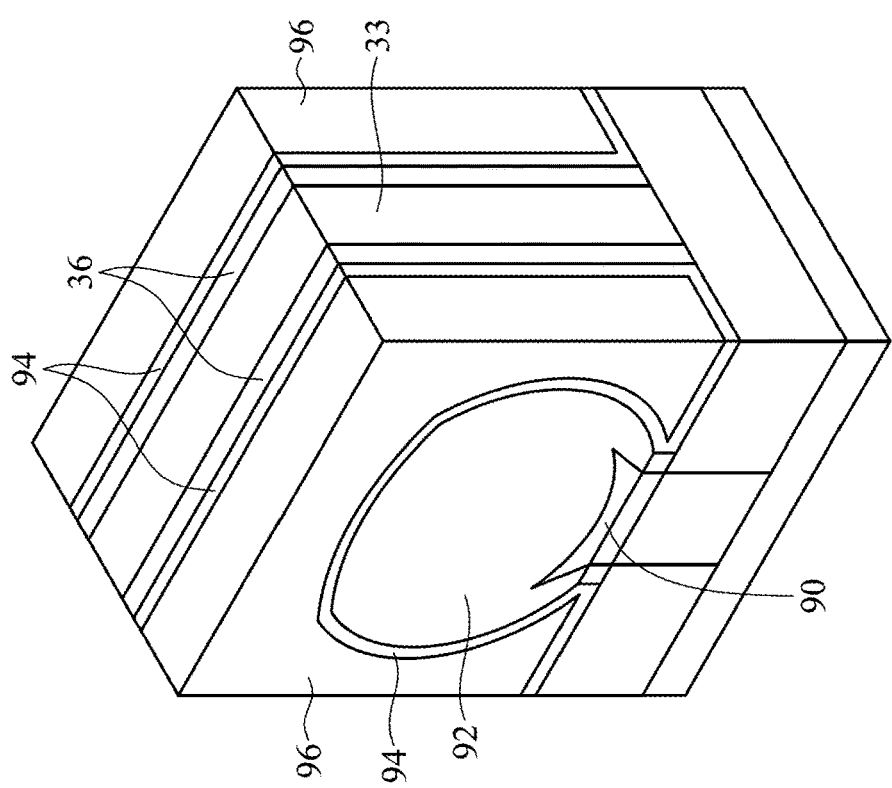
Figure 23C:
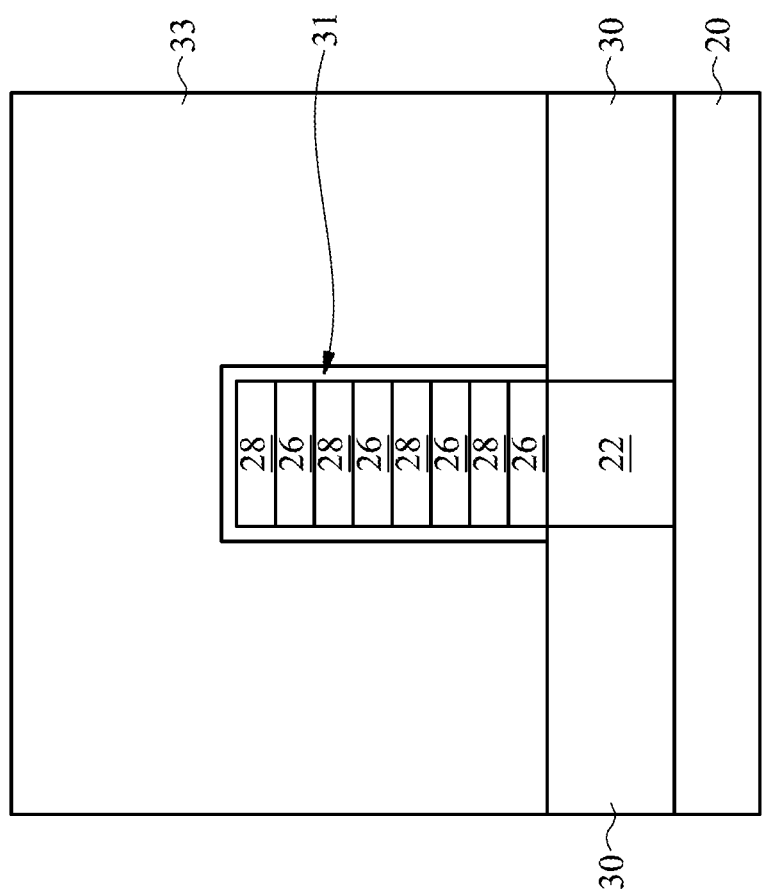

Referring to FIGS. 23A-C, an etch stop layer (ESL) 94 is conformally formed on the first epitaxial source/drain layer 90, the gate spacers 36, the dummy gate 33, and the dummy material 92. In some embodiments, the ESL 94 may comprise silicon nitride, silicon carbonitride, or the like, formed using Atomic Layer Deposition (ALD), Chemical Vapor Deposition (CVD), the like, or a combination thereof. A bottom inter-layer dielectric (ILD0) 96 is formed over the ESL 94. The ILD0 96 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Further in FIGS. 23A, 23B, and 23C, a planarization process, such as a CMP, is performed to level the top surface of ILD0 96 with the top surfaces of the dummy gate 33. Accordingly, a top surface of the dummy gate 33 is exposed through the ILD0 96.

Figure 24B:
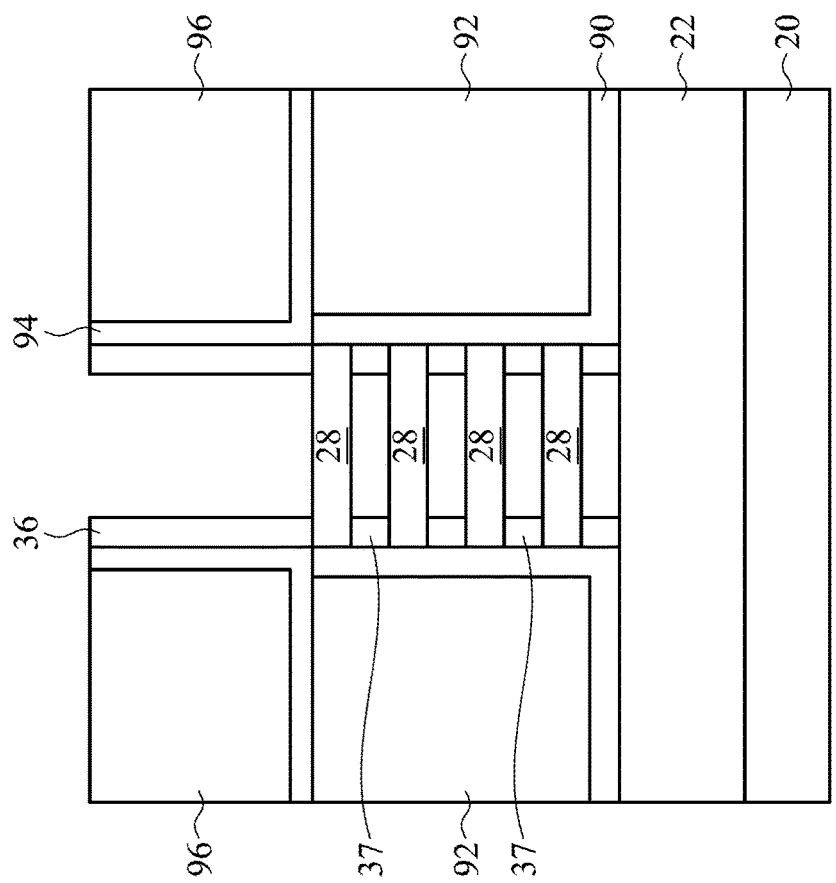
FIGS. 24A, 24B, and 24C are perspective and cross sectional views of an intermediate stage in the forming of a semiconductor device in accordance with some embodiments.
Figure 24A:
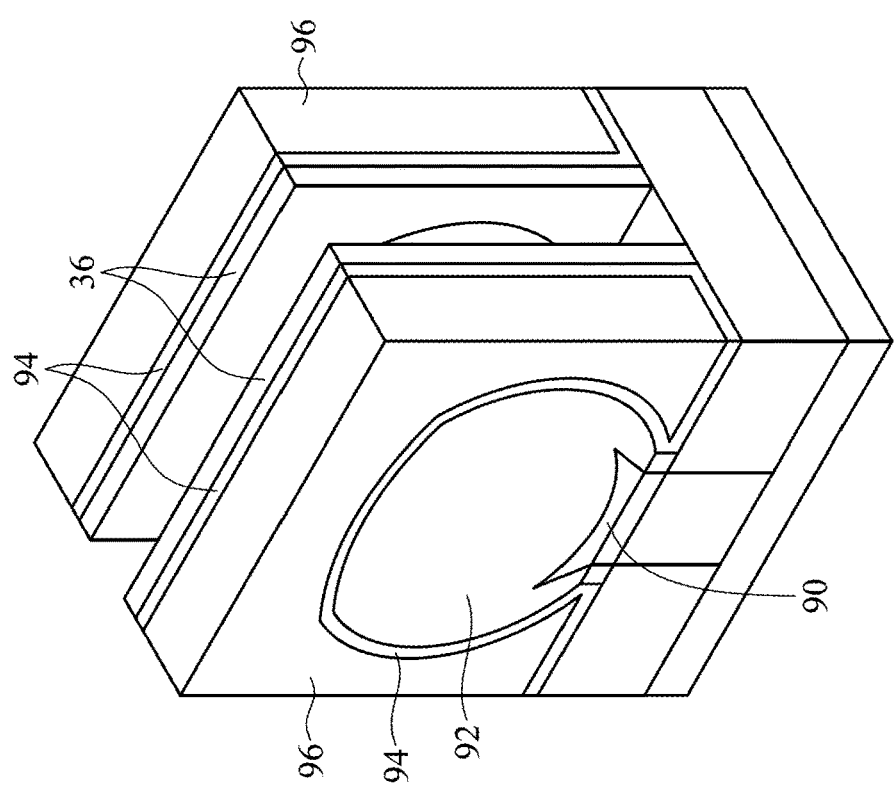
Figure 24C:
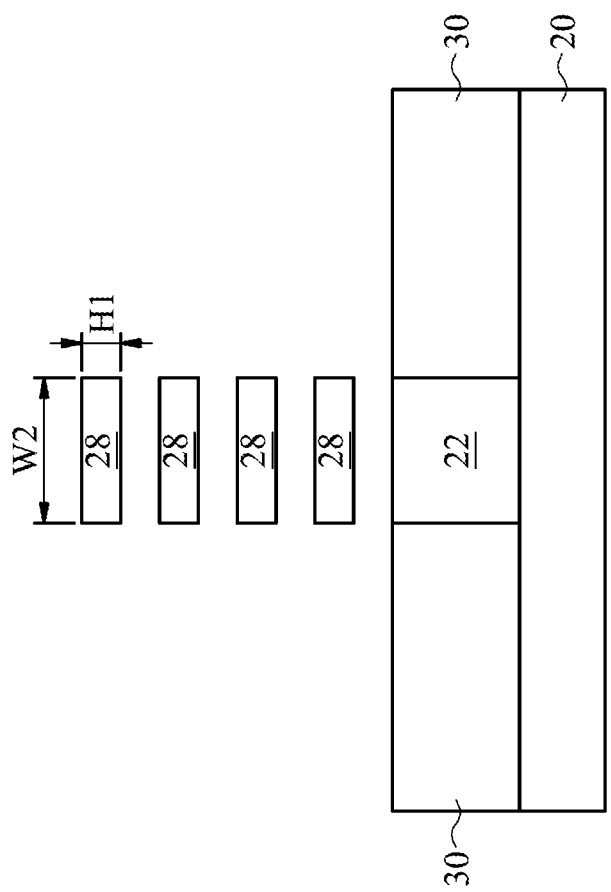

In FIGS. 24A, 24B, and 24C, the dummy gate 33 and the dummy gate dielectric 31 are removed in an etching step(s), so that an opening through the ILD0 96 and defined by the gate spacers 36 is formed to the fin, e.g., the superlattice 24. The opening exposes a channel region of the fin, e.g., the superlattice 24. The channel region is disposed between the neighboring pair of dummy material 92 and first epitaxial source/drain regions 90. The etching step(s) may be selective to the materials of the dummy gate 33 and the dummy gate dielectric 31, which etching may be a dry or wet etching. During the etching, the dummy gate dielectric 31 may be used as an etch stop layer when the dummy gate 33 is etched. The dummy gate dielectric 31 may then be etched after the removal of the dummy gate 33.

Further in FIGS. 24A, 24B, and 24C, remaining portions of first layers 26 are removed, for example using one or more selective etching steps so that substantially only the first layers 26 of the superlattice 24 are etched. As shown in FIG. 24C (similarly to FIG. 14C) a width W2 of each of the second layers 28 is in a range of about 5 nm to about 40 nm. A height H1 of each of the second layers 28 is in a range of about 5 nm to about 10 nm.

Figure 25B:
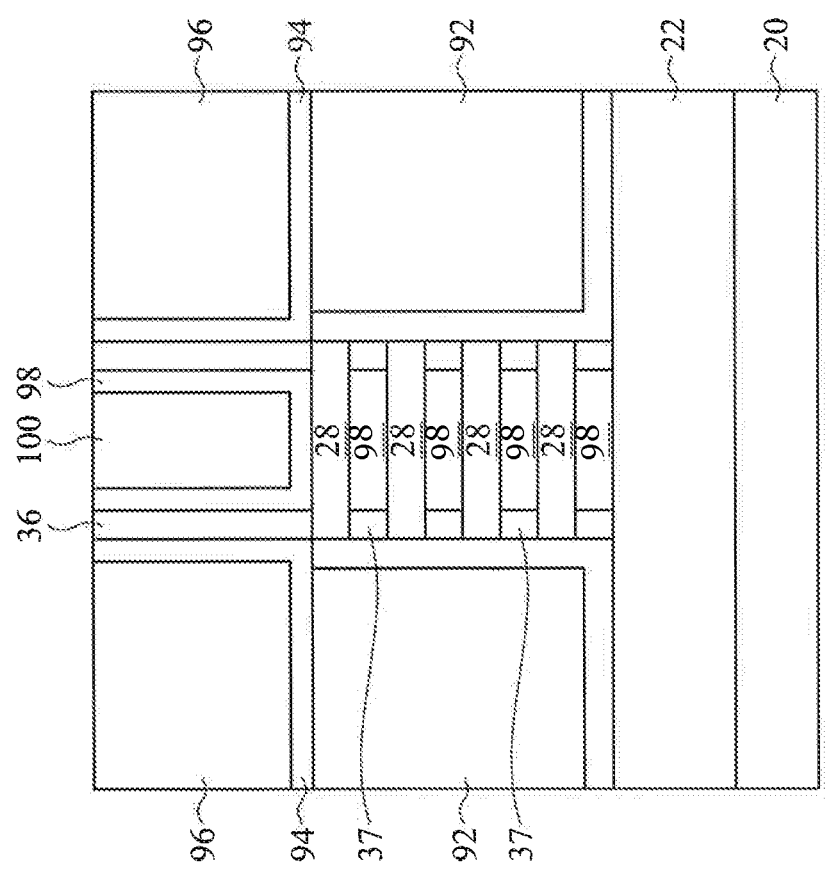
FIGS. 25A, 25B, and 25C are perspective and cross sectional views of an intermediate stage in the forming of a semiconductor device in accordance with some embodiments.
Figure 25A:
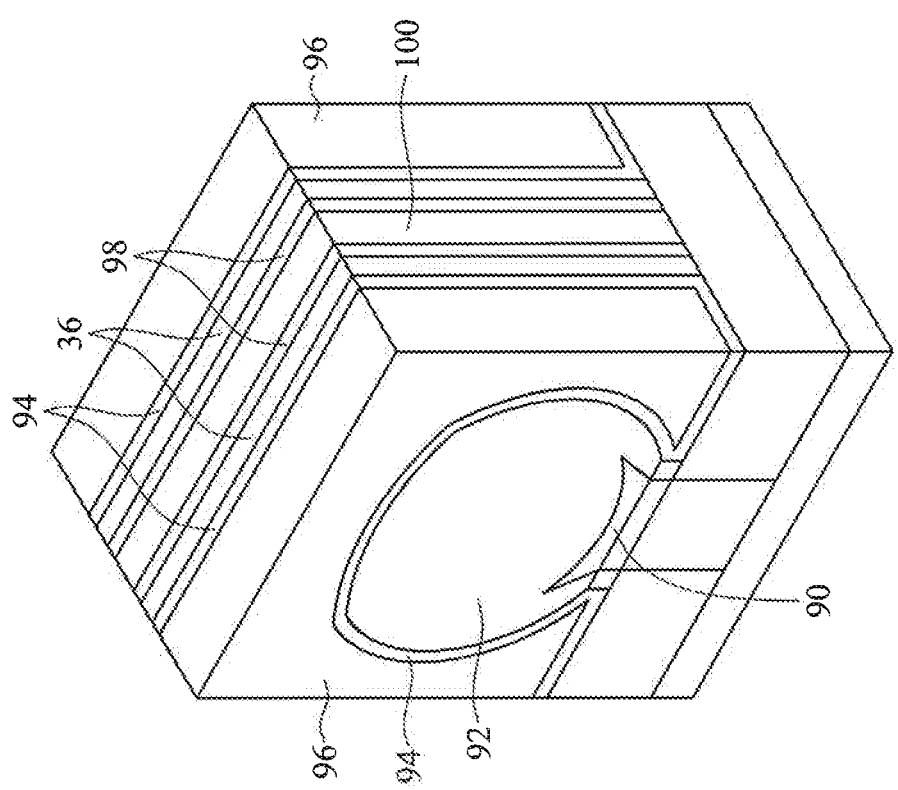
Figure 25C:
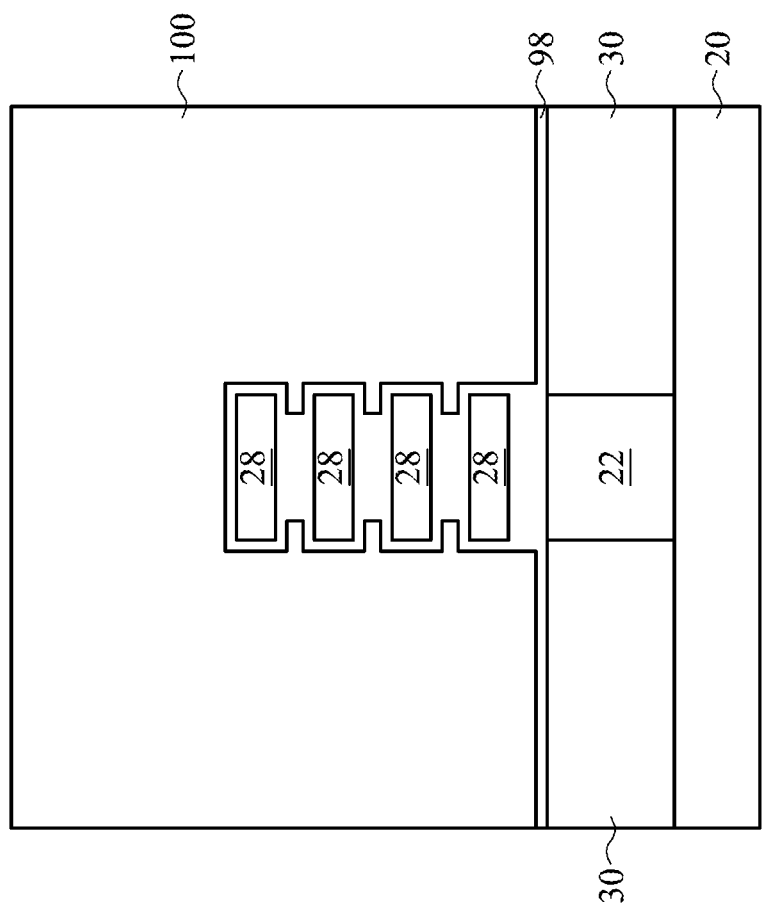

In FIGS. 25A, 25B, and 25C, a gate dielectric 98 and a gate electrode 100 are formed in the opening through the ILD0 96. The gate dielectric 98 can include a high-k dielectric layer formed conformally on the top surface of the ILD0 96 and in the opening along sidewalls of the gate spacers 36. The high-k dielectric layer may have a k value greater than about 7.0, and may include a metal oxide or a silicate of Hf, Al, Zr, La, Mg, Ba, Ti, Pb, and combinations thereof. The formation methods of high-k dielectric layer may include ALD, CVD, Molecular-Beam Deposition (MBD), the like, or a combination thereof. Other embodiments contemplate other materials for the gate dielectric 98, such as materials that are not high-k.

As illustrated in FIGS. 25B and 25C, the gate dielectric 98 is conformal to the second layers 28. Depending on the distance between neighboring second layers 28, the gate dielectric 98 may coalesce between the neighboring second layers 28, as illustrated. In other embodiments, the gate dielectric 98 may not coalesce between neighboring second layers 28.

The gate electrode 100 is formed on the gate dielectric 98. The gate electrode 100 can be a multi-layered structure. For example, the gate electrode 100 can include a capping layer conformally formed on the gate dielectric 98, one or more work function tuning layers conformally formed on the capping layer, and a metal-containing material, such as a metal, formed on the work function tuning layers and filling the opening. In an example, the capping layer can comprise a first sub-layer on the gate dielectric 98 formed of TiN or the like using ALD, CVD, or the like, and a second sub-layer on the first sub-layer formed of TaN or the like using ALD, CVD, or the like. The work function tuning layer(s) can be formed of TiAl, TiN, or the like using ALD, CVD, or the like. The metal-containing material can be tungsten (W), aluminum (Al), cobalt (Co), ruthenium (Ru), a combination thereof or the like deposited using CVD, physical vapor deposition (PVD), the like, or a combination thereof.

Further, as described above in connection with the gate dielectric 98, the gate electrode 100 can extend at least partially between surfaces of the second layers 28 because the first layers 26 have been removed. A device according to some of these embodiments can be a gate all-around (GAA) device. The resulting configuration of the gate dielectric 98 and gate electrode 100 depicted in FIGS. 25A, 25B, and 25C can result in a larger electrical field generated by the gate electrode 100 affecting current flow in the channel region in the second layers 28. This larger electrical field can increase short channel control even at small technology nodes, such as less than 14 nm.

Next, a planarization process, such as a CMP, may be performed to remove the excess portions of gate electrode 100 and the gate dielectric 98, which excess portions are over the top surface of ILD0 96.

Figure 26B:
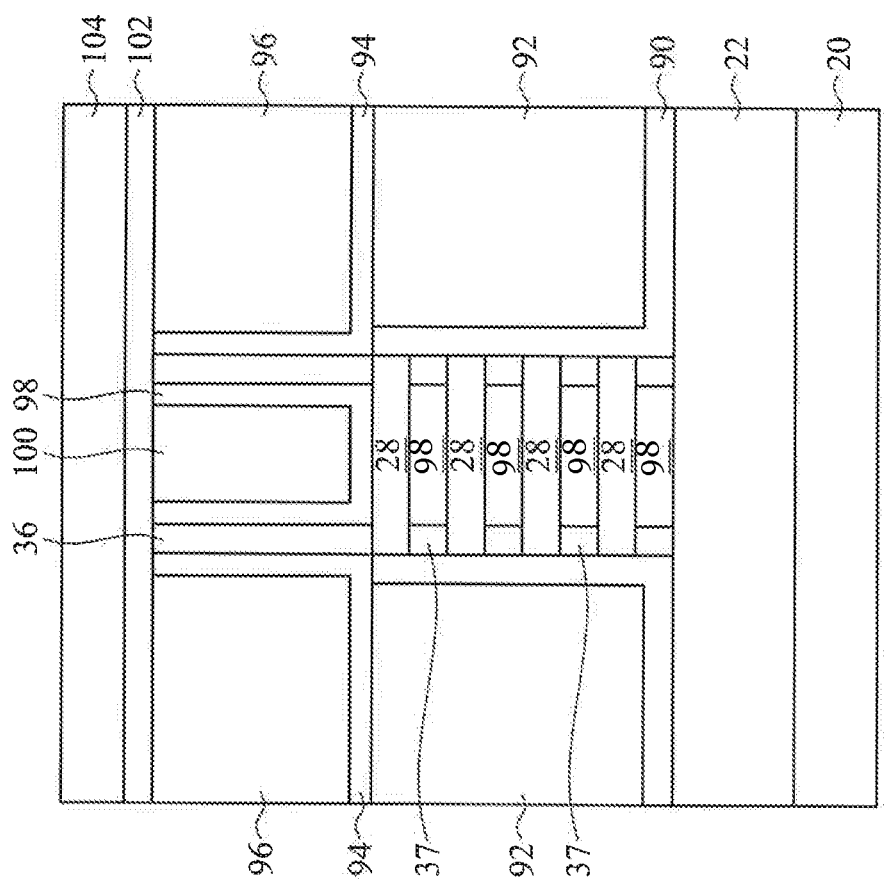
FIGS. 26A, 26B, and 26C are perspective and cross sectional views of an intermediate stage in the forming of a semiconductor device in accordance with some embodiments.
Figure 26A:
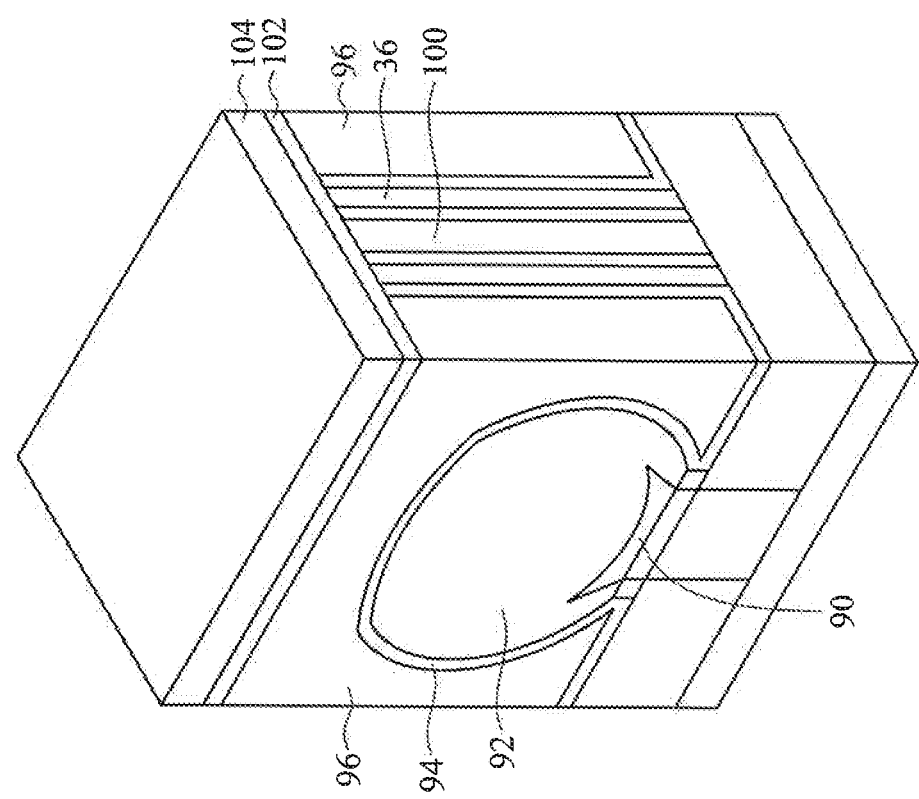
Figure 26C:
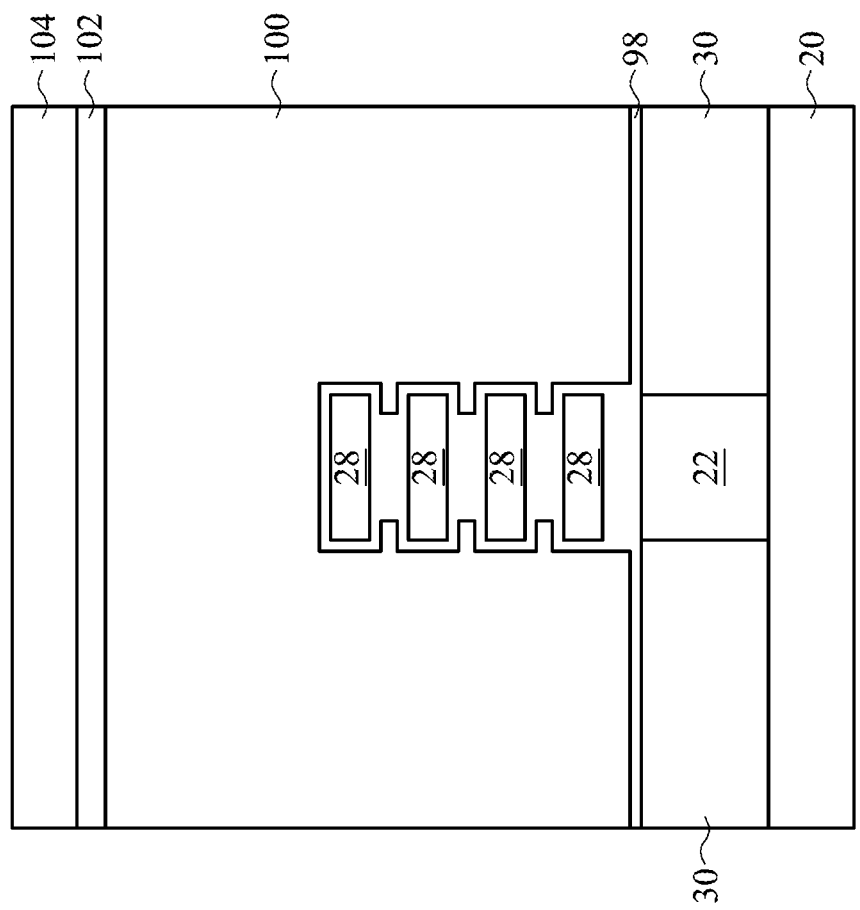

In FIGS. 26A, 26B, and 26C, an etch stop layer (ESL) 102 is conformally formed on the ILD0 96 and the gate electrode 100. In some embodiments, the ESL 102 may comprise silicon nitride, silicon carbonitride, or the like, formed using Atomic Layer Deposition (ALD), chemical vapor deposition (CVD), the like, or a combination thereof. Further, an ILD1 104 is deposited over the ILD0 96 and the gate electrode 100. The ILD1 104 is formed of a dielectric material such as PSG, BSG, BPSG, USG, or the like, and may be deposited by any suitable method, such as CVD and PECVD.

Figure 27B:
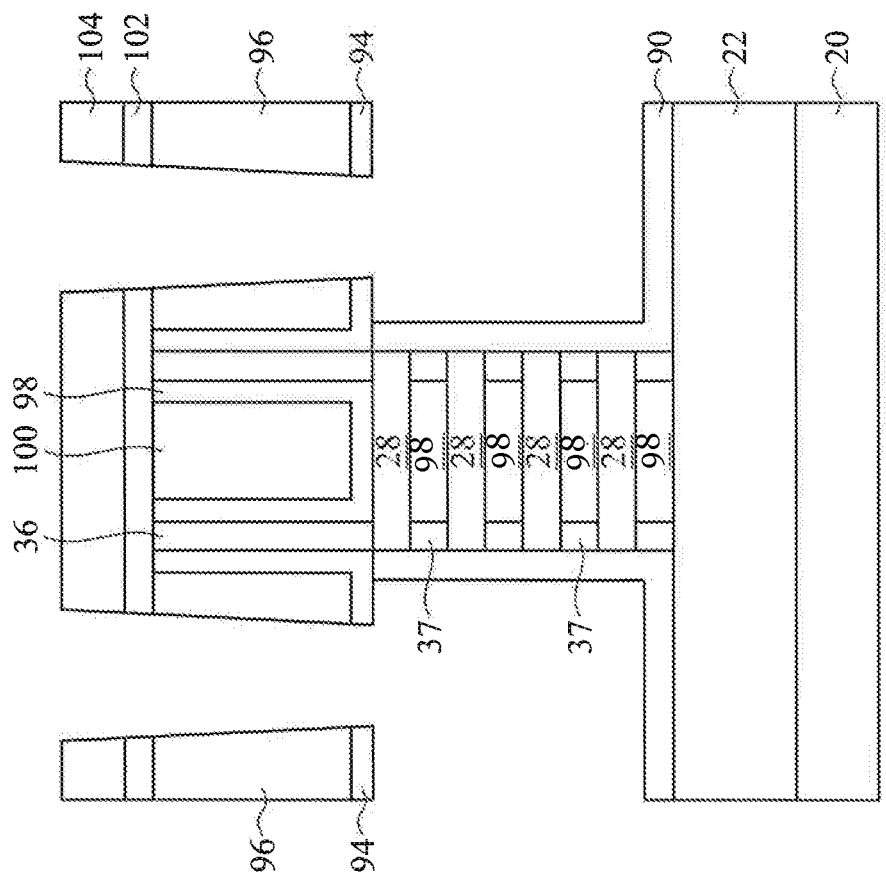
FIGS. 27A, 27B, and 27C are perspective and cross sectional views of an intermediate stage in the forming of a semiconductor device in accordance with some embodiments.
Figure 27A:
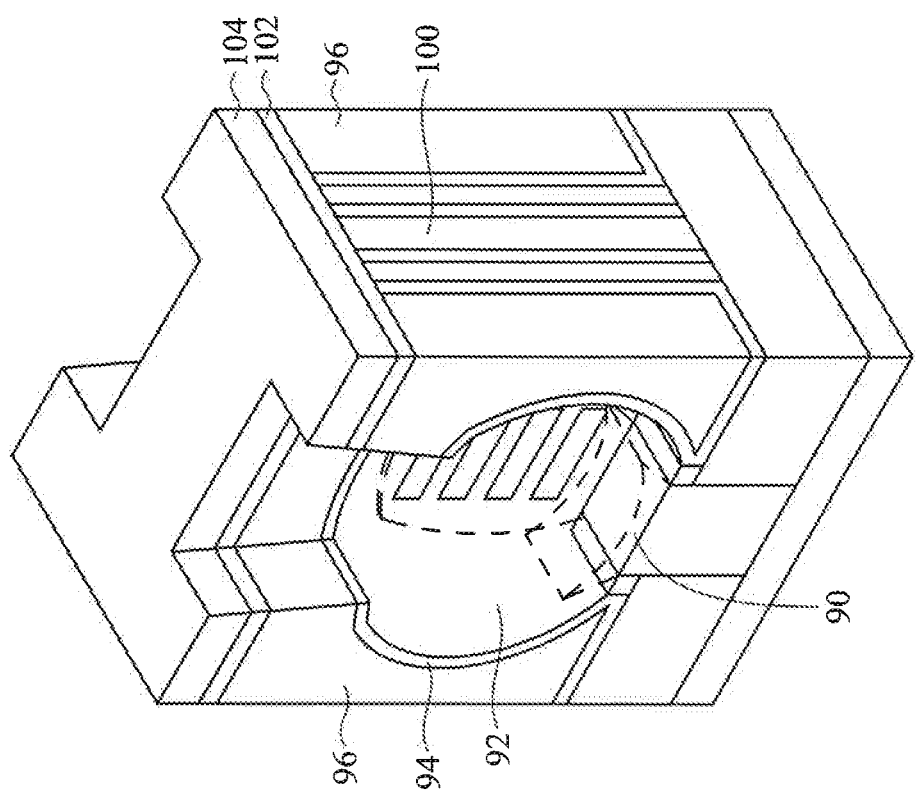
Figure 27C:
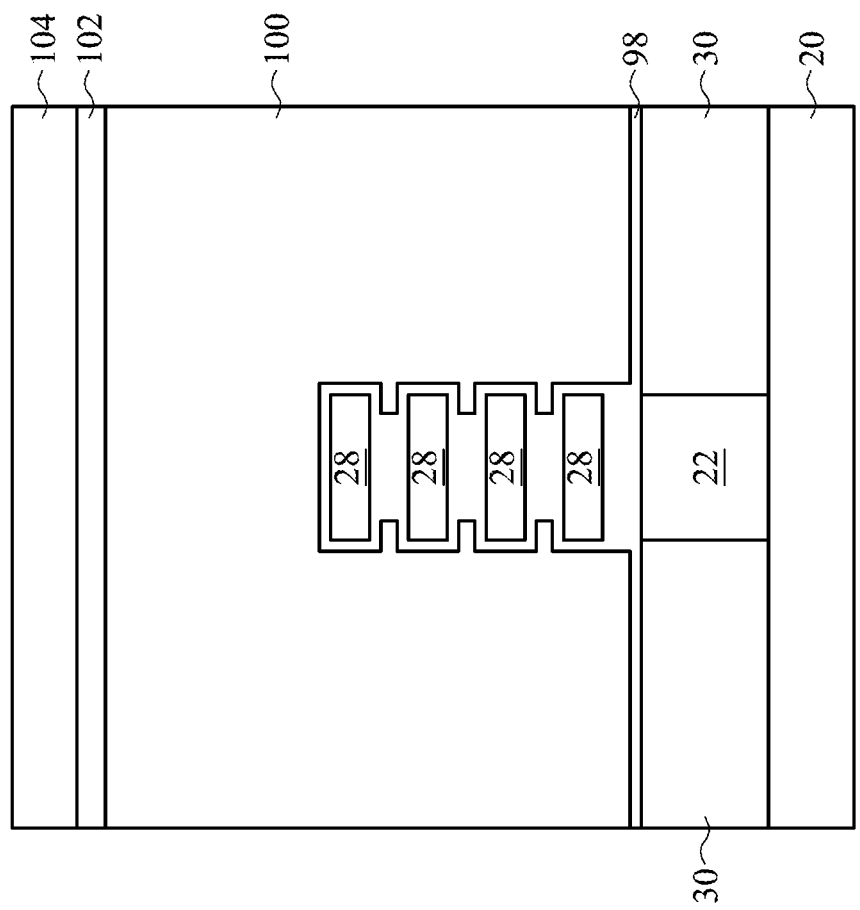

Referring to FIGS. 27A, 27B, and 27C, one or more etching processes may be performed to form an opening extending through the ESL 102, ILD1 104 and dummy material 92. In some embodiments, a mask (not shown) may be formed over the ILD1 104, and the mask may be patterned (for example using lithography) to expose a portion of the ILD1 104 in which the opening will be formed. Next, an etching process may be performed using the mask as an etch mask. The etching process may terminate when a surface of dummy material 92 is exposed. Next, the dummy material 92 may be removed to form the structure depicted in FIGS. 27A-C. In some embodiments, dummy material 92 may be removed by performing an etching process that selectively etches the material of dummy material 92 while leaving the ESL 94, the first epitaxial source/drain layer 90, and portions of the spacer 36 substantially un-etched. A suitable etchant may be used. In some embodiments, when dummy material 92 is formed of AlOx, the one or more etching processes may include dilute hydrofluoric acid (dHF) and/or a sulfuric acid-hydrogen peroxide mixture (SPM) as an etchant. In some embodiments, when dummy material 92 is formed of Ge, the one or more etching processes may include hydrochloric acid (HCl) or SPM as an etchant.

Figure 28B:
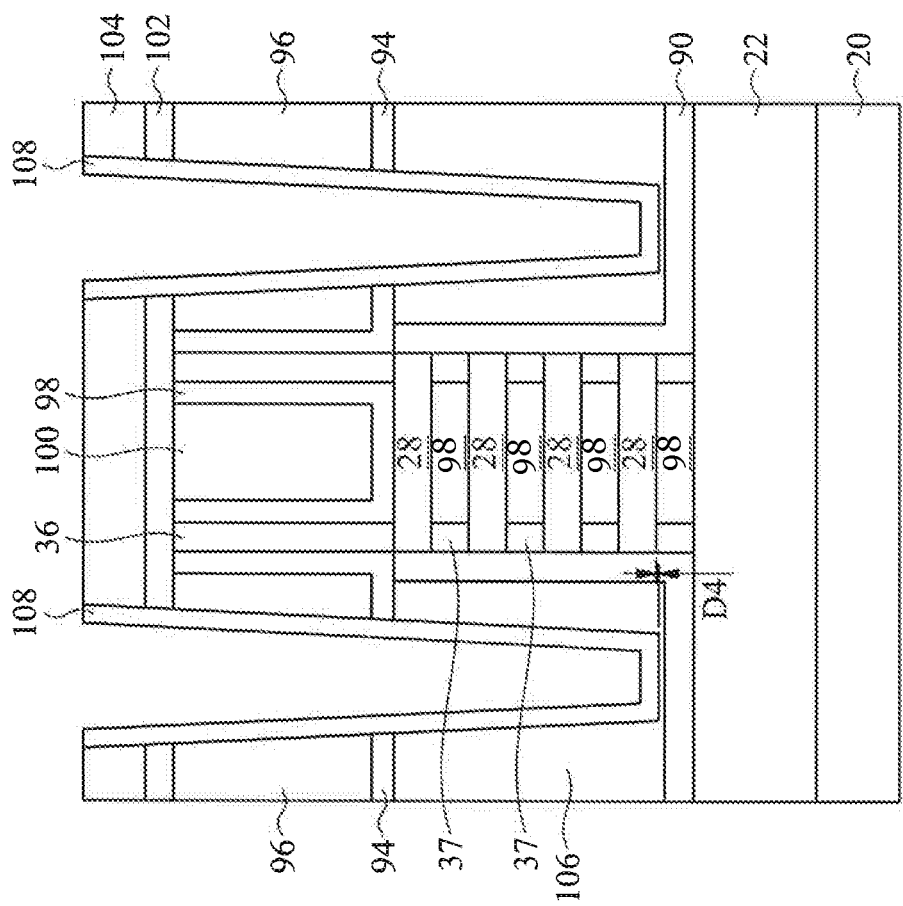
FIGS. 28A and 28B are perspective and cross sectional views of an intermediate stage in the forming of a semiconductor device in accordance with some embodiments.
Figure 28A:
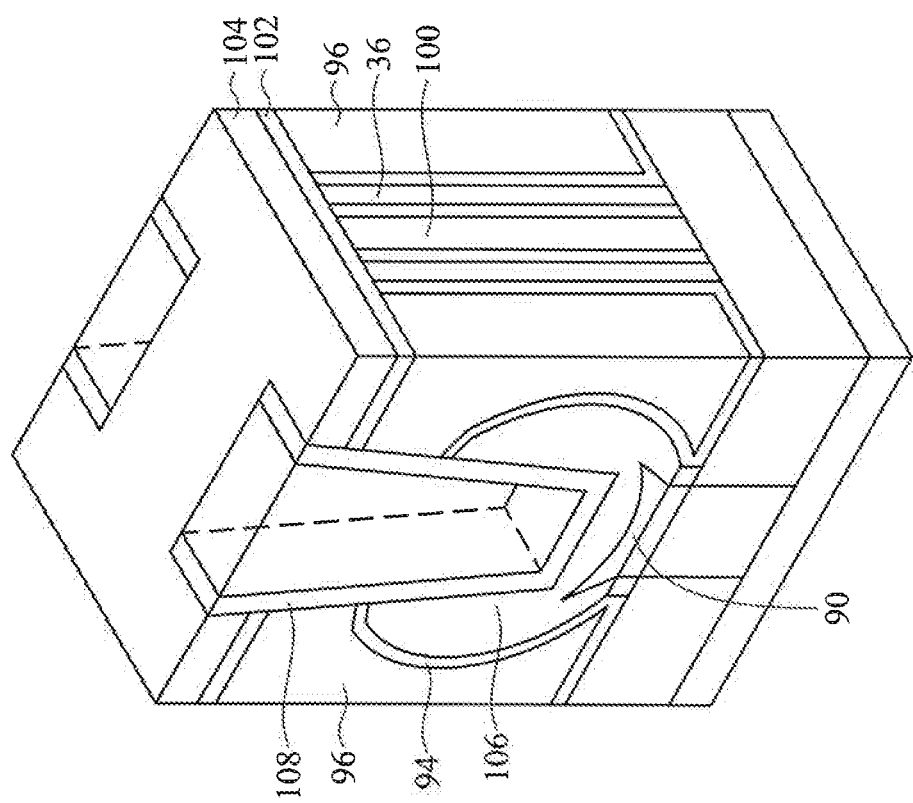

FIGS. 28A-B depict a silicide 106 being formed in the openings from which the dummy material 92 has been removed. In some embodiments, silicide 106 is formed using ALD, CVD or the like. A co-flow of SiH4 may be used to form the silicide 106. The silicide 106 may extend along and contact portions of the ESL 94, the first epitaxial source/drain layer 90, and portions of the spacer 36. For example, in some embodiments the silicide 106 may contact a top surface and sidewalls of the first epitaxial source/drain layer 90. The silicide 106 may be deposited in some embodiments. The silicide 106 may comprise a low resistivity silicide material. In some embodiments, silicide 106 may be formed of TiSi, NiSi, CoSi, or the like.

Next, openings are formed in silicide 106 in which contacts will subsequently be formed. In some embodiments, the openings are formed using suitable photolithography techniques or etching techniques. The openings extend at least partly into the portions of silicide 106 that replaced the dummy material 92, and a bottom surface of the openings are located at least a distance D4 lower than bottom surfaces of the lowest layer of second layers 28, where D4 is greater than or equal to 3 nm, for example in a range of about 3 nm to about 5 nm. As shown in FIGS. 28A-B, bottom surfaces of the openings terminate in the silicide 106. In other embodiments the bottom surfaces of the openings may contact the first epitaxial source/drain layers 90.

Next, a barrier layer 108 is formed in the openings. The barrier layer 108 may include titanium, titanium nitride, tantalum, tantalum nitride, or the like. The barrier layer 108 may be formed using a suitable deposition process, such as ALD, PVD, or the like. Optionally, the barrier layer 108 has a resistivity of about 500 $\mu\Omega$-cm to about 1000 $\mu\Omega$-cm. The resulting structure is shown in FIGS. 28A-B.

FIGS. 29-32 depict embodiments of various contacts for making electrical connections to the source/drain regions of the depicted devices. Contacts formed in accordance with some embodiments penetrate relatively deeply into the source/drain regions (e.g. silicide 106 and first epitaxial source/drain layers 90) compared to contacts formed using conventional methods. As described above in connection with FIGS. 12A, 12B, and 12C, epitaxial source/drain regions formed as described herein (e.g. epitaxial source/drain regions 38) may have relatively short lateral widths, which can reduce the capacitance between the gate and the drain ($C_{GD}$), leading to improved performance. However, the shorter lateral widths may also increase the resistance of the epitaxial source/drain regions ($R_{SD}$), thereby degrading the performance of the device. In some embodiments, contacts as depicted in FIGS. 29-32 may penetrate relatively deeply into the source/drain regions (e.g. silicide 106 and first epitaxial source/drain layers 90), thereby increasing the surface area of contact between the contacts and the source/drain regions. In some embodiments, the surface area between the contacts depicted in FIGS. 29-32 and the source/drain regions may be increased by four times or more compared to contacts formed using conventional methods. Additionally, a material composition of the contacts may be selected to have a low resistivity. Accordingly, the resistance of the contacts ($R_{CSD}$) may be reduced, which may lead to improved performance of the devices.

Figure 29:
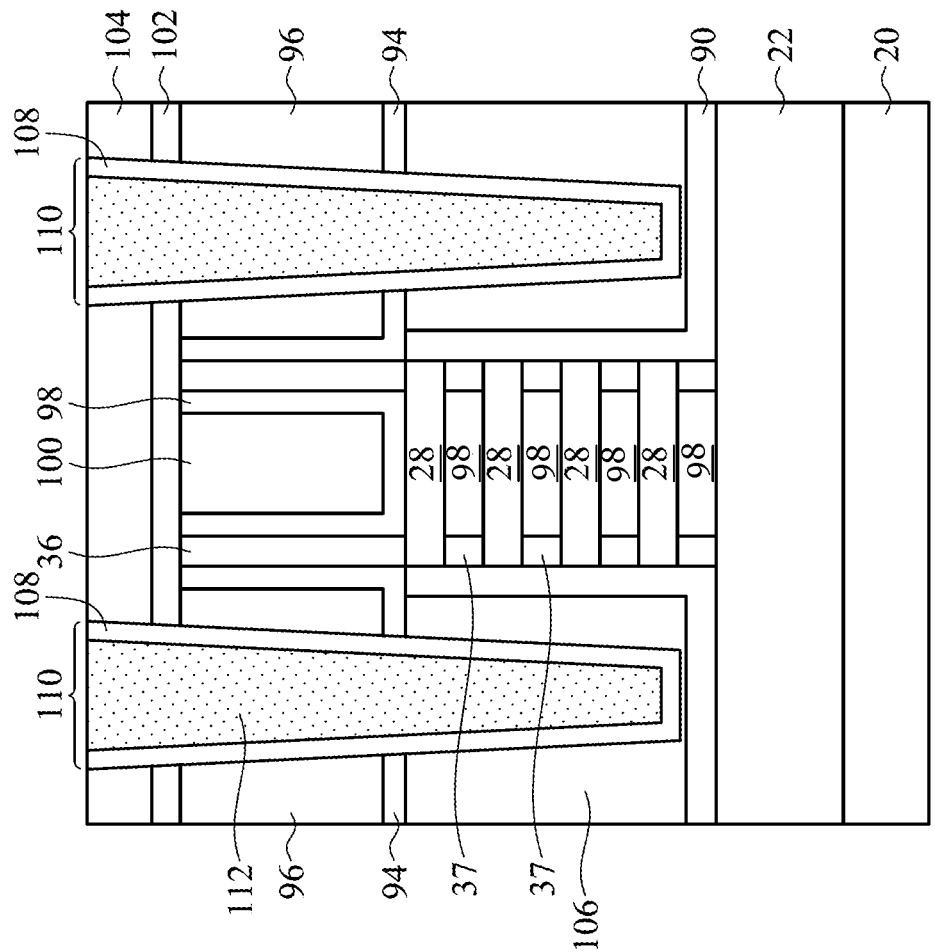
FIGS. 29-36 are cross sectional views in the formation of various semiconductor devices in accordance with some embodiments.

FIG. 29 depicts contacts 110. In FIG. 29 a metal 112 may be formed over barrier layer 108 to form contacts 110, for example using an electroplating or deposition process. Optionally, metal 112 includes one or more low resistivity metals, such as Ir, Rh, W, Co, Ru, or the like. A planarization process, such as a CMP, may be performed to remove excess material from a surface of ILD1 104. The remaining barrier layer 108 and metal 112 form contacts 110.

As shown in FIG. 29, contacts 110 may each have a first region and a second region, where the second region is the portion of the contact 110 that extends through the silicide 106, and the first region is the portion of the contact 110 that overlies the second region. In a contact that is formed using conventional methods, the first region may have a thickness that is greater than a thickness of the second region. In FIG. 29, the thickness of contacts 110 is greater in the second region than in the first region. Further, although not specifically shown in FIG. 29, in the direction that extends along the axis C-C of FIG. 5A, the width of each contact 110 exceeds the width W2 of the second layers 28 (shown in FIG. 14C).

A three dimensional coordinate system X-Y-Z is shown in FIG. 17A. In the X-Z plane of FIG. 17A, and in the second region, the contacts 110 of FIG. 29 may be composed of 30% silicide 106, 20% barrier layer 108, and 50% metal 112. If only the barrier layer 108 and metal 112 is considered, in the second region contacts 110 may be composed 30% of barrier layer 108 and 70% of metal 112. In the X-Z plane of FIG. 17A, and in the first region, the contacts 110 of FIG. 29 may be composed of 20% barrier layer 108 and 80% metal 112.

Figure 30:
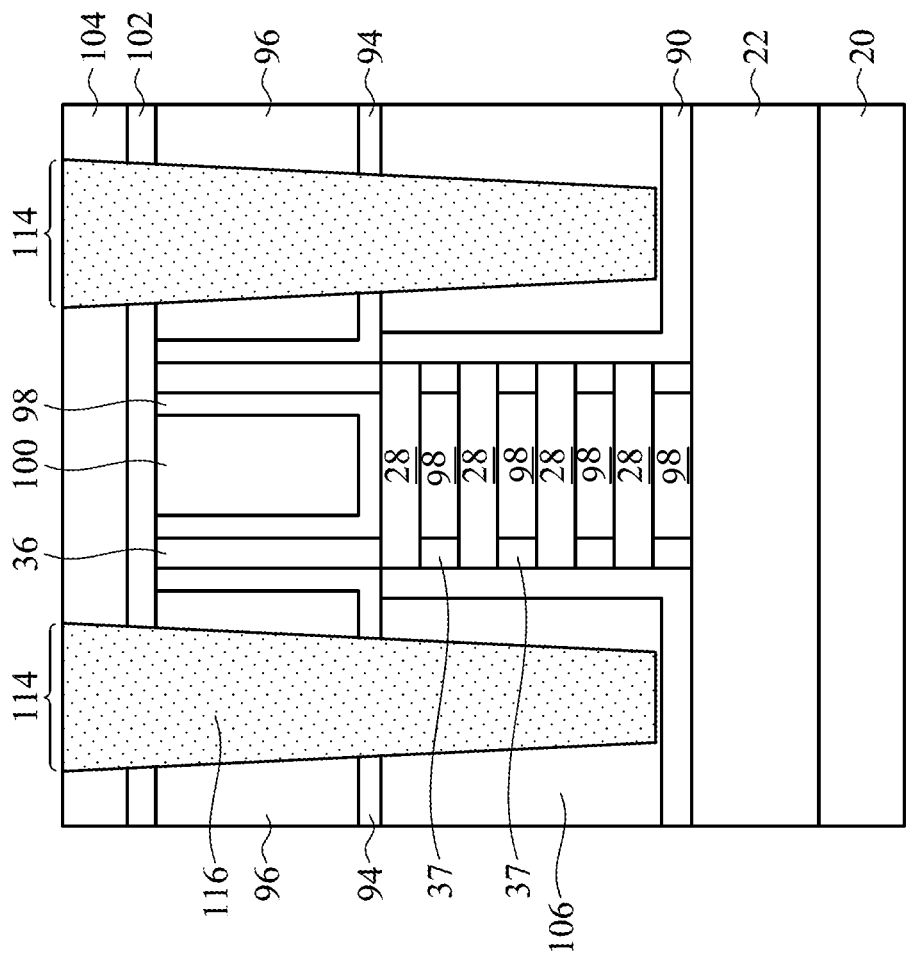

FIG. 30 depicts contacts 114. In the embodiment shown in FIG. 30, barrier layer 108 is not formed. Instead, a metal 116 may be formed in the openings in which the contacts 114 are formed directly over silicide 106. Any suitable metal 116 may be formed. Optionally, metal 116 includes one or more low resistivity metals, such as Ir, Rh, W, Co, Ru, or the like. The metal 116 may be formed by electroplating, or by using a suitable deposition process. Next, a planarization process may be performed, such as a chemical mechanical polishing process. The resulting structure is shown in FIG. 30.

As shown in FIG. 30, contacts 114 may each have a first region and a second region, where the second region is the portion of the contact 114 that extends through the silicide 106, and the first region is the portion of the contact 114 that overlies the second region. In a contact that is formed using conventional methods, the first region may have a thickness that is greater than a thickness of the second region. In FIG. 30, the thickness of contacts 114 is greater in the second region than in the first region. Further, although not specifically shown in FIG. 30, in the direction that extends along the axis C-C of FIG. 5A, the width of each contact 114 exceeds the width W2 of the second layers 28 (width W2 is shown in FIG. 14C).

A three dimensional coordinate system X-Y-Z is shown in FIG. 17A. In the X-Z plane of FIG. 17A, and in the second region, the contacts 114 of FIG. 30 may be composed of 30% silicide 106, and 70% metal 116. If only the metal 116 is considered, in the second region contacts 114 may be composed of 100% metal 116. In the X-Z plane of FIG. 17A, and in the first region, the contacts 114 of FIG. 30 may be composed of 100% metal 116.

Figure 31:
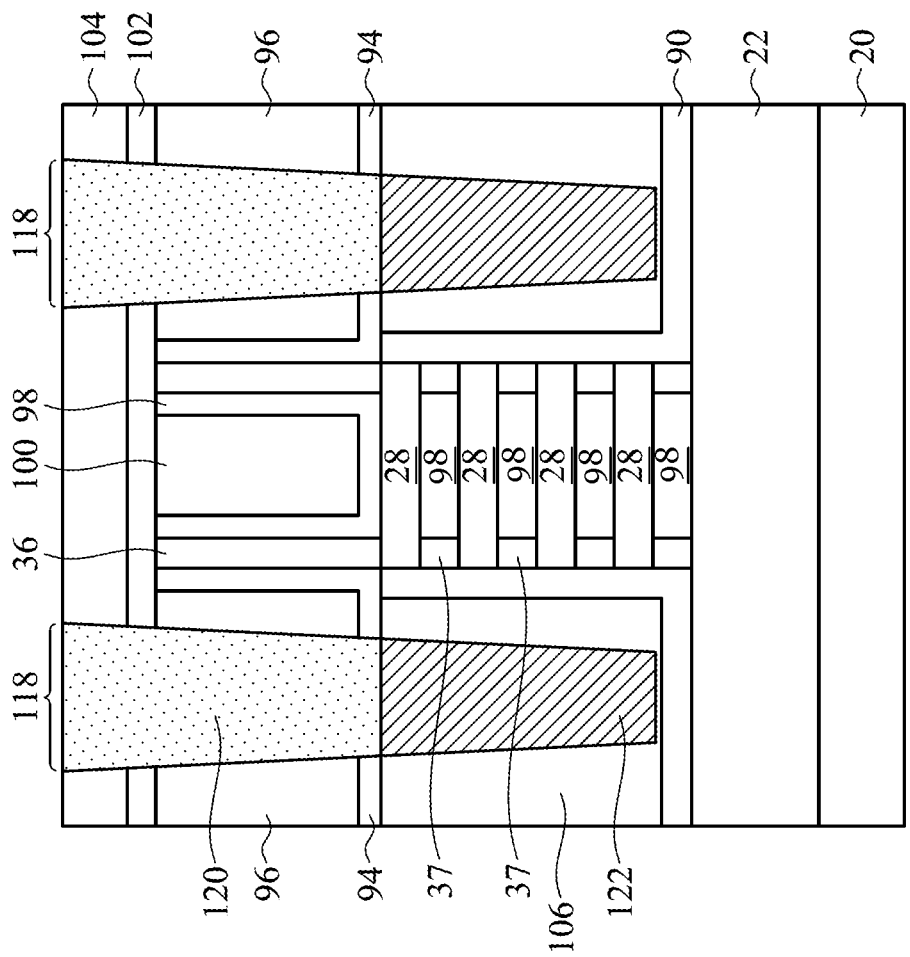

FIG. 31 depicts contacts 118. In the embodiment shown in FIG. 31, barrier layer 108 (shown in FIG. 29) is not formed. In some embodiments, a silicide 122 is deposited in the portions of the openings extending through the silicide 106. As shown in FIG. 31, the silicide 122 fills the openings in the silicide 106, and a top surface of the silicide 122 may be level with a top surface of silicide 106. The silicide 122 may be a low resistivity silicide material. In some embodiments, silicide 122 is formed of TiSi, NiSi, CoSi, or the like. Silicide 122 is formed of a different material than silicide 106 in some embodiments. For example, in some embodiments a resistivity of silicide 122 may be less than a resistivity of silicide 106. Silicide 122 may be formed using ALD, CVD, or the like. In some embodiments $SiH_4$ may be used as a co-flow to form silicide 122. In other embodiments, the openings that are described above in connection with FIGS. 28A-B extend through ILD1 104 and ESL 102 but not through silicide 106, and in these embodiments silicide 122 is not formed. Instead, the lower portion of the contacts 118 are formed by the silicide 106.

Next, a metal 120 is formed directly over the silicide 122 (or silicide 106 if silicide 122 is not formed). The metal 120 may be formed by electroplating, or by using a suitable deposition process. Optionally, metal 120 includes one or more low resistivity metals, such as Ir, Rh, W, Co, Ru, or the like. Next, a planarization process may be performed, such as a chemical mechanical polishing process. The resulting structure is shown in FIG. 31.

As shown in FIG. 31, contacts 118 may each have a first region and a second region, where the second region is the portion of the contacts 118 that extend through the silicide 106, and the first region is the portion of the contacts 118 that overlie the first region. In a contact that is formed using conventional methods, the first region may have a thickness that is greater than a thickness of the second region. In FIG. 31, the thickness of contacts 118 is greater in the second region than in the first region. Further, although not specifically shown in FIG. 31, in the direction that extends along the axis C-C of FIG. 5A, the width of each contact 118 exceeds the width W2 of the second layers 28 (width W2 is shown in FIG. 14C).

A three dimensional coordinate system X-Y-Z is shown in FIG. 17A. In the X-Z plane of FIG. 17A, and in the second region, the contacts 118 of FIG. 31 may be composed of 100% silicide 122 (or 100% of silicide 106 if silicide 122 is not formed). In the X-Z plane of FIG. 17A, and in the first region, the contacts 118 of FIG. 31 may be composed of 100% metal 120.

Figure 32:
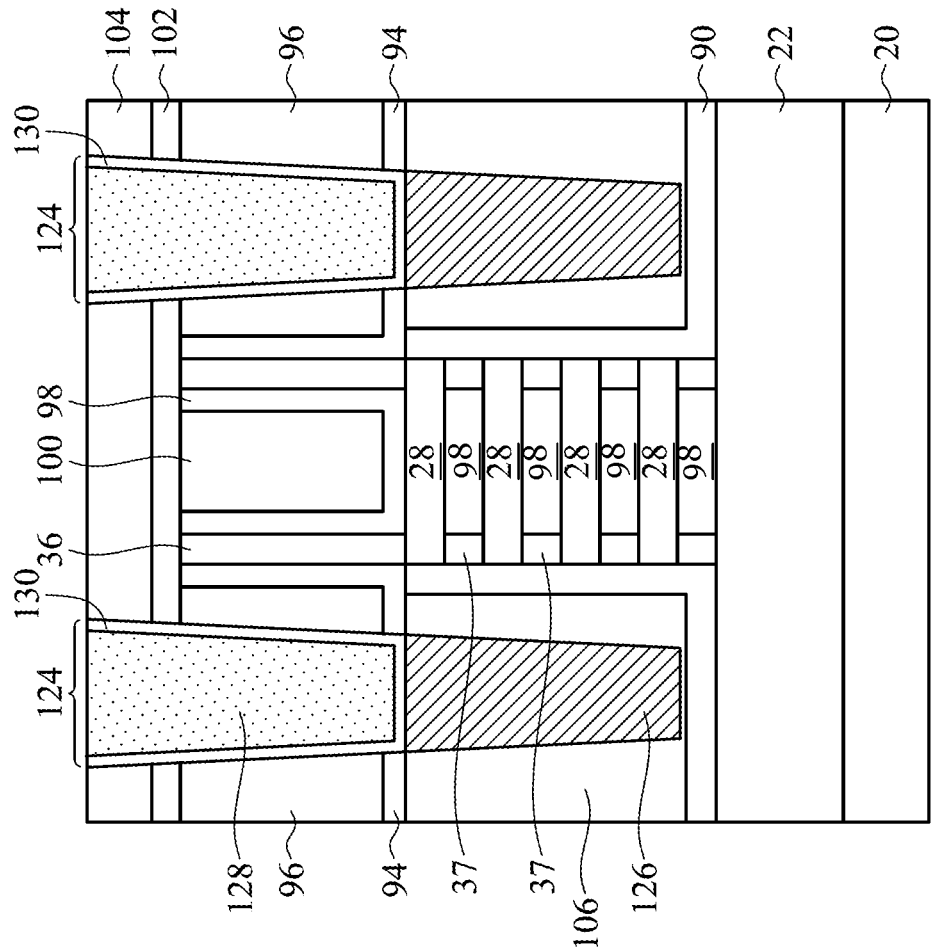

FIG. 32 depicts contacts 124. In the embodiment shown in FIG. 32, barrier layer 108 is not formed. In some embodiments, a silicide 126 is deposited in the portions of the openings extending through the silicide 106. As shown in FIG. 32, the silicide 126 fills the openings in the silicide 106, and a top surface of the silicide 126 may be level with a top surface of a silicide 106. The silicide 126 may be a low resistivity silicide. Silicide 126 may have a different material composition than the material composition of silicide 106. For example, a resistivity of silicide 126 may be lower than a resistivity of silicide 106. In some embodiments, silicide 126 may be formed of TiSi, NiSi, CoSi, or the like. Silicide 126 may be formed using ALD, CVD, or the like. In some embodiments, $SiH_4$ co-flow may be used to form silicide 126. In other embodiments, the openings that are described above in connection with FIGS. 28A-B extend through ILD1 104 and ESL 102 but not through silicide 106, and in these embodiments silicide 126 is not formed. Instead, the lower portion of the contacts 124 are formed by silicide 106.

Next, a barrier layer 130 may be formed along sidewalls of the openings and along a top surface of the silicide 126 (or silicide 106 if silicide 126 is not formed). In some embodiments, the barrier layer 130 may be formed using a suitable deposition process, such as ALD, PVD, or the like. The barrier layer 130 may include any suitable material. In an embodiment, the barrier layer 130 is formed of TiN. Optionally, the barrier layer 130 has a resistivity of about 500 µΩ-cm to about 1000 µΩ-cm. Next, metal 128 is formed over the barrier layer 130. The metal 128 may be formed by electroplating, or by using a suitable deposition process. Optionally, metal 128 includes one or more low resistivity metals, such as Ir, Rh, W, Co, Ru, or the like. Next, a planarization process may be performed, such as a chemical mechanical polishing process. The resulting structure is shown in FIG. 32.

As shown in FIG. 32, contacts 124 may each have a first region and a second region, where the second region is the portion of the contact 124 that extends through the silicide 106, and the first region is the portion of the contact 124 that overlies the second region. In a contact that is formed using conventional methods, the first region may have a thickness that is greater than a thickness of the second region. In FIG. 32, the thickness of contacts 124 is greater in the second region than in the first region. Further, although not specifically shown in FIG. 32, in the direction that extends along the axis C-C of FIG. 5A, the width of each contact 124 exceeds the width W2 of the second layers 28 (width W2 is shown in FIG. 14C).

A three dimensional coordinate system X-Y-Z is shown in FIG. 17A. In the X-Z plane of FIG. 17A, and in the second region, the contacts 124 of FIG. 32 may be composed of 100% silicide 126 (or silicide 106 if silicide 126 is not formed). In the X-Z plane of FIG. 17A, and in the first region, the contacts 124 of FIG. 32 may be composed of 80% metal 128 and 20% barrier layer 130.

In each of FIGS. 29-32, bottom surfaces of the contacts 110, 114, 118, and/or 124 are respectively located at least 3 nm below a bottom surface of the lowest layer of second layers 28, for example in a range of about 3 nm to about 5 nm below the bottom surface of the lower layer of second layers 28. When the bottom surfaces of the contacts 110, 114, 118, and/or 124 are respectively located at least 3 nm below a bottom surface of the lowest layer of second layers 28, a reduction in the source/drain contact resistance $R_{CSD}$ described herein may be achieved.

Other embodiments are possible. For example, FIGS. 33 through 36 depict embodiments in which contacts are formed in merged epitaxial source/drain regions 140. The cross sections depicted in FIGS. 33 through 36 are of a cross section that is parallel to cross section "C" shown in FIG. 5A, but moved along the fin to a location that intersects a source/drain region. The merged epitaxial source/drain regions 140 depicted in FIGS. 33 though 36 may be included in semiconductor devices having a superlattice 24 as described herein, or in other devices having no superlattice 24 (for example finFET devices having continuous fins). In the embodiments shown in FIGS. 33 through 36, the contacts penetrate more deeply into the merged epitaxial source/drain regions 140 compared to conventional contacts. Accordingly, the area of the contacts in the merged epitaxial source/drain regions 140 is increased, and the resistance of the source/drain contacts ($R_{CSD}$) is decreased, which may increase the performance of the devices.

Figure 33:
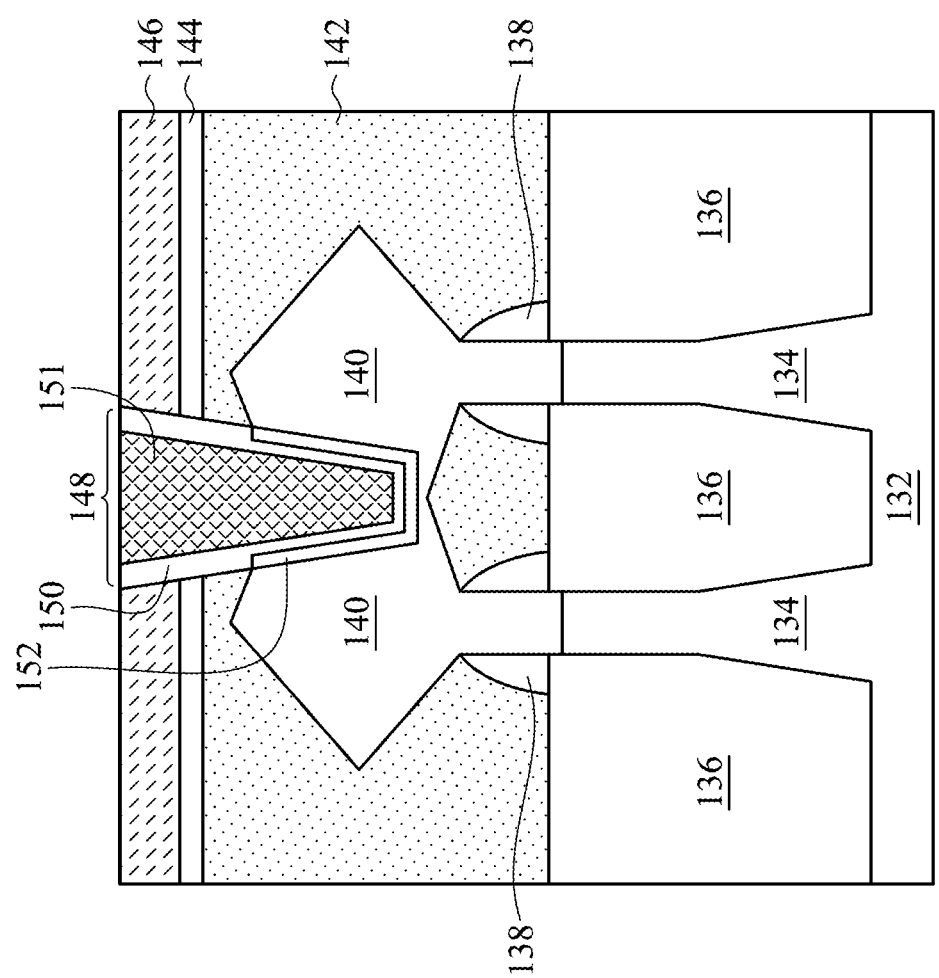

In FIG. 33, fins 134 are patterned in a substrate 132, using the same or similar processes as described in connection with FIGS. 3A-C. The details thereof are incorporated by reference. The substrate 132 may be the same as, or similar to, substrate 20 described above. The fins 134 may be patterned by any suitable method. For example, the fins 134 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Insulating material 136 is formed over the substrate 132, where insulating material 136 separates adjacent fins 134. Insulating material 136 may be the same as, or similar to, insulating material 30 described above, and the details thereof are incorporated by reference. Spacers 138 are formed over insulating material 136. Spacers 138 may be the same as, or similar to, spacers 36 described above, and the details thereof are incorporated by reference. Merged epitaxial source/drain region 140 is formed over fins 134 and spacers 138. Merged epitaxial source/drain region 140 may be similar to epitaxial source/drain regions 38, and the details thereof are incorporated by reference. However, as shown in FIG. 33, two adjacent epitaxial source/drain regions may be formed in a manner that the two adjacent epitaxial source/drain regions merge to form merged epitaxial source/drain region 140. Although one merged epitaxial source/drain region 140 is shown in FIGS. 33 through 36, in some finFET devices a pair of merged epitaxial source/drain regions 140 may be formed on opposite sides of a channel region as described in connection with FIGS. 12A-C above. An ILD0 142 is formed over the merged epitaxial source/drain region 140. ILD0 142 may be the same as, or similar to, ILD0 40 and/or ILD0 96, and the discussion thereof is incorporated by reference. An etch stop layer (ESL) 144 is formed over ILD0 142. ESL 144 may be the same as, or similar to, ESL 43 and/or ESL 102, and the discussion thereof is incorporated by reference. An ILD1 146 is formed over ESL 144. ILD1 146 may be the same as, or similar to, ILD1 46 and/or ILD1 104, and the discussion thereof is incorporated by reference.

After ILD1 146 is formed, an opening (not shown in FIG. 33) is formed in which contact 148 will be formed. The opening may be formed using any suitable process, such as the processed described in connection with FIGS. 17A-C, and the discussion thereof is incorporated herein. The bottom of the opening terminates within the merged epitaxial source/drain region 140.

FIG. 33 depicts contact 148 for making an electrical connection to merged epitaxial source/drain region 140. A silicide 152 is formed in the opening lining the merged epitaxial source/drain region 140. A metal layer may be deposited in the openings in which the contacts 148 are formed, and an anneal process may be performed to form the silicide 152. Any suitable metal layer may be deposited, such as Ti, Ni, Co, or the like. Next, a barrier layer 150 may be formed. In some embodiments, the barrier layer 150 may be formed using a suitable deposition process, such as ALD, PVD, or the like. The barrier layer 150 may include any suitable material. In an embodiment, the barrier layer 150 is formed of TiN. Optionally, the barrier layer 150 has a resistivity of about 500 µΩ-cm to about 1000 µΩ-cm. Next, a metal 151 is formed over the barrier layer 150. The metal 151 may be formed by electroplating or by using a suitable deposition process. Optionally, metal 151 includes one or more low resistivity metals, such as Ir, Rh, W, Co, Ru, or the like. Next, a planarization process may be performed, such as a chemical mechanical polishing process. The resulting structure is shown in FIG. 33. Contact 148 includes silicide 152, barrier layer 150 and metal 151.

As shown in FIG. 33, contact 148 may have a first region and a second region, where the second region is the portion of the contact 148 that extends through the merged epitaxial source/drain region 140, and the first region is the portion of the contact 148 that overlies the second region. In a contact that is formed using conventional methods, the first region may have a thickness that is greater than a thickness of the second region. In FIG. 33, the thickness of contact 148 is greater in the second region than in the first region.

A three dimensional coordinate system X-Y-Z is shown in FIG. 17A. In the X-Z plane of FIG. 17A, and in the second region, contact 148 of FIG. 33 may be composed of 30% silicide 152, 20% barrier layer 150, and 50% metal 151. In the X-Z plane of FIG. 17A, and in the first region, the contacts 148 of FIG. 33 may be composed of 20% barrier layer 150 and 80% metal 151.

Figure 34:
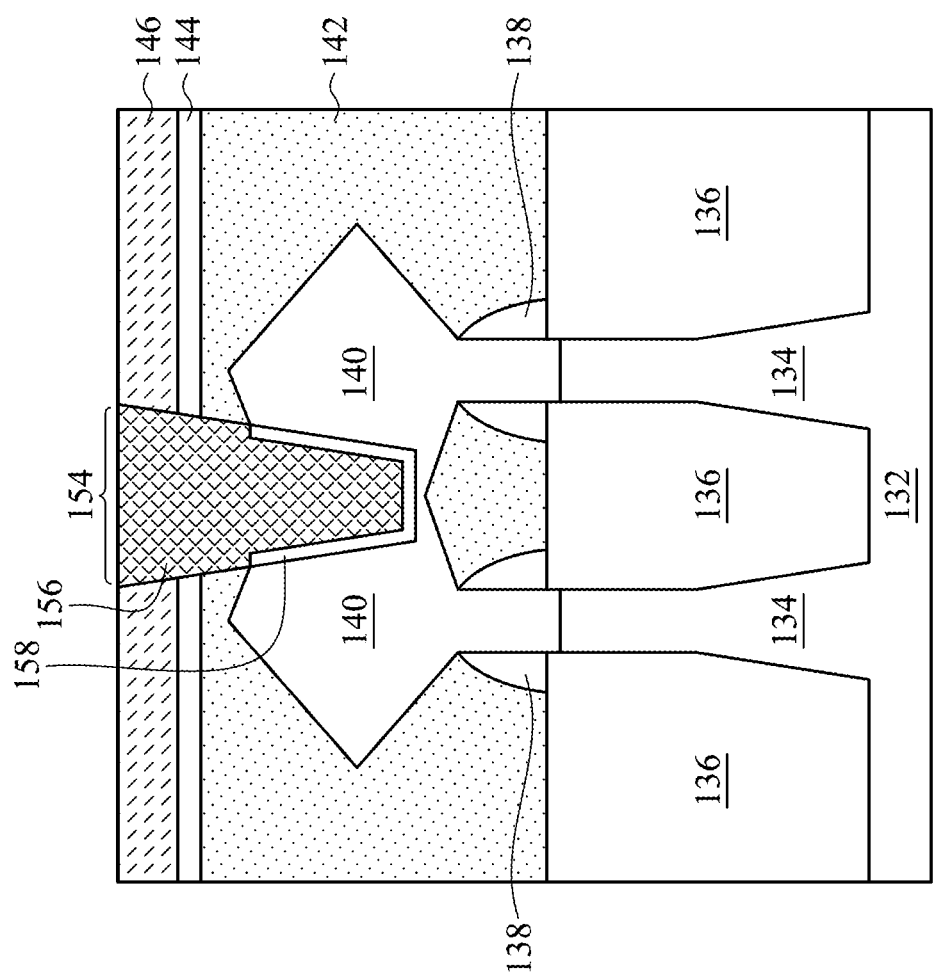

FIG. 34 depicts contact 154 for making an electrical connection to merged epitaxial source/drain region 140. In some embodiments, a silicide 158 is formed lining the opening in the merged epitaxial source/drain region 140. A metal layer may be deposited in the openings in which the contacts 154 are formed, and an anneal process may be performed to form the silicide 158. Any suitable metal layer may be deposited, such as Ti, Ni, Co, or the like. Next, a metal 156 is formed directly over the silicide 158, without any intervening barrier layer. The metal 156 may be formed by electroplating, or by using a suitable deposition process. Optionally, metal 156 includes one or more low resistivity metals, such as Ir, Rh, W, Co, Ru, or the like. Next, a planarization process may be performed, such as a chemical mechanical polishing process. The resulting structure is shown in FIG. 34. Contacts 154 include silicide 158 and metal 156.

As shown in FIG. 34, contact 154 may have a first region and a second region, where the second region is the portion of the contact 154 that extends through the merged epitaxial source/drain region 140, and the first region is the portion of the contact 154 that overlies the second region. In a contact that is formed using conventional methods, the first region may have a thickness that is greater than a thickness of the second region. In FIG. 34, the thickness of contact 154 is greater in the second region than in the first region.

A three dimensional coordinate system X-Y-Z is shown in FIG. 17A. In the X-Z plane of FIG. 17A, and in the second region, the contact 154 of FIG. 34 may be composed of 30% silicide 158, and 70% metal 156. In the X-Z plane of FIG. 17A, and in the first region, the contact 154 of FIG. 34 may be composed of 100% metal 156.

Figure 35:
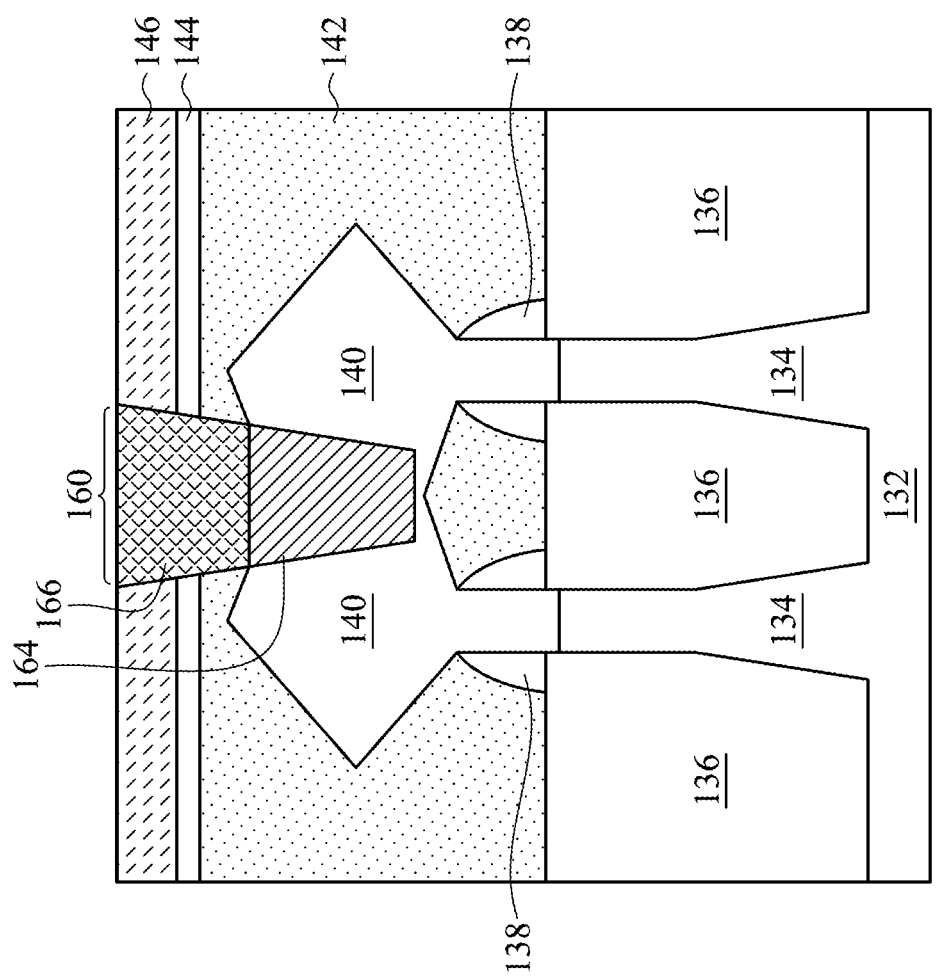

FIG. 35 depicts a contact 160 for making an electrical connection to merged epitaxial source/drain region 140. In some embodiments, a silicide 164 is deposited in the portion of the opening extending through the merged epitaxial source/drain region 140. As shown in FIG. 35, the silicide 164 fills the opening in the merged epitaxial source/drain region 140, and a top surface of the silicide 164 may be level with a surface of the merged epitaxial source/drain region 140. The silicide 164 may include a low resistivity silicide, and in some embodiments may be formed of TiSi, NiSi, CoSi, or the like. Silicide 164 may be formed using ALD, CVD, or the like. In some embodiments, a SiH$_4$ co-flow may be used to form silicide 164. Next, a metal 166 is formed directly over the silicide 164. The metal 166 may be formed by electroplating, or by using a suitable deposition process. Optionally, metal 166 includes one or more low resistivity metals, such as Ir, Rh, W, Co, Ru, or the like. Next, a planarization process may be performed, such as a chemical mechanical polishing process. The resulting structure is shown in FIG. 35. Contact 160 includes silicide 164 and metal 166.

As shown in FIG. 35, contact 160 may have a first region and a second region, where the second region is the portion of the contact 160 that extends through the merged epitaxial source/drain region 140, and the first region is the portion of the contact 160 that overlies the second region. In a contact that is formed using conventional methods, the first region may have a thickness that is greater than a thickness of the second region. In FIG. 35, the thickness of the contact 160 is greater in the second region than in the first region.

A three dimensional coordinate system X-Y-Z is shown in FIG. 17A. In the X-Z plane of FIG. 17A, and in the second region, the contact 160 of FIG. 35 may be composed of 100% silicide 164. In the X-Z plane of FIG. 17A, and in the first region, the contact 160 of FIG. 35 may be composed of 100% metal 166.

Figure 36:
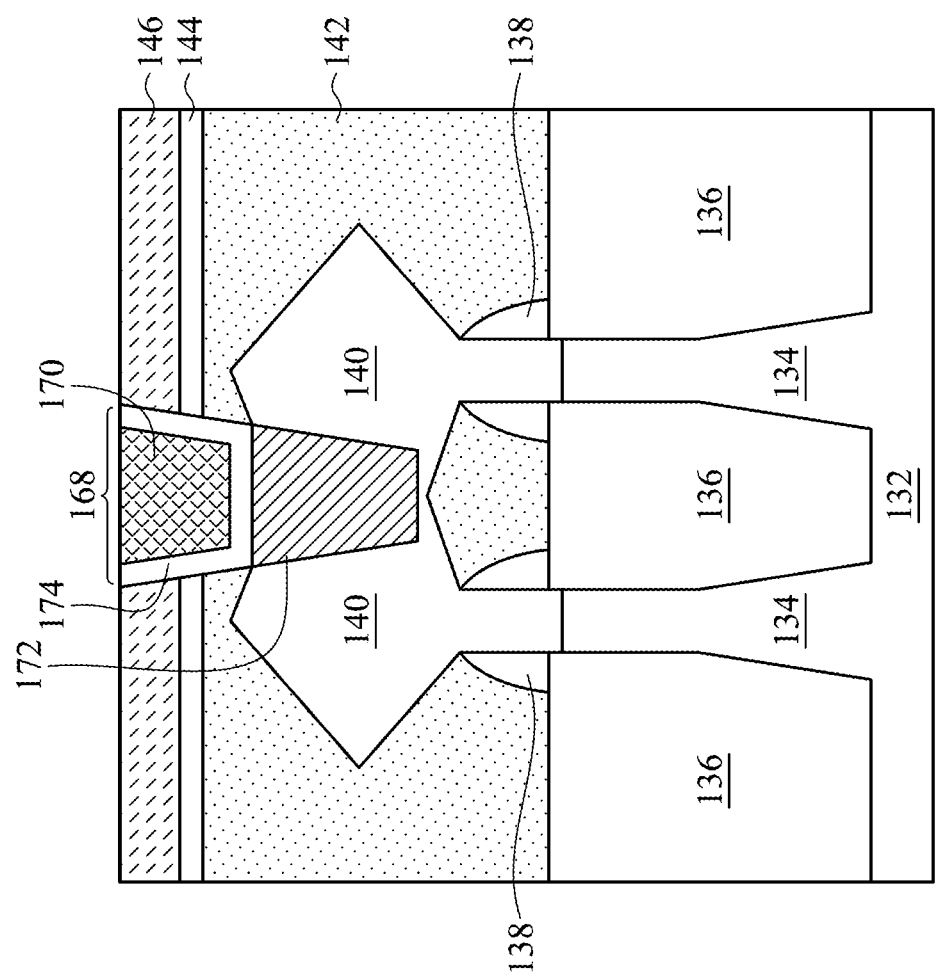

FIG. 36 depicts contact 168 for making an electrical connection to merged epitaxial source/drain region 140. In some embodiments, a silicide 172 is deposited in the portion of the opening that extends through the merged epitaxial source/drain region 140. As shown in FIG. 36, the silicide 172 fills the opening in the merged epitaxial source/drain region 140, and a top surface of the silicide 172 may be level with a surface of the merged epitaxial source/drain region 140. The silicide 172 may be a low resistivity silicide, and may be formed of TiSi, NiSi, CoSi, or the like. Silicide 172 may be formed using ALD, CVD, or the like. In some embodiments, a SiH$_4$ co-flow may be used to form silicide 172. Next, a barrier layer 174 may be formed along sidewalls of the opening and along a top surface of the silicide 172. In some embodiments, the barrier layer 174 may be formed using a suitable deposition process, such as ALD, PVD, or the like. The barrier layer 174 may include any suitable material. In an embodiment, the barrier layer 174 is formed of TiN. Optionally, the barrier layer 174 has a resistivity of about 500 µΩ-cm to about 1000 µΩ-cm. Next, metal 170 is formed over the barrier layer 174. The metal 170 may be formed by electroplating, or by using a suitable deposition process. Optionally, metal 170 includes one or more low resistivity metals, such as Ir, Rh, W, Co, Ru, or the like. Next, a planarization process may be performed, such as a chemical mechanical polishing process. The resulting structure is shown in FIG. 36. Contact 168 includes silicide 172, barrier layer 174, and metal 170.

As shown in FIG. 36, contact 168 may have a first region and a second region, where the second region is the portion of the contact 168 that extends through the merged epitaxial source/drain region 140, and the first region is the portion of the contact 168 that overlies the second region. In a contact that is formed using conventional methods, the first region may have a thickness that is greater than a thickness of the second region. In FIG. 36, the thickness of the contact 168 is greater in the second region than in the first region.

A three dimensional coordinate system X-Y-Z is shown in FIG. 17A. In the X-Z plane of FIG. 17A, and in the second region, the contact 168 of FIG. 36 may be composed of 100% silicide 172. In the X-Z plane of FIG. 17A, and in the first region, the contact 168 of FIG. 36 may be composed of 80% metal 170 and 20% barrier layer 174.

In subsequent processing, an interconnect structure may be formed over the structures depicted herein, and electrical connectors for making external electrical connections may be formed over the interconnect structure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As described herein, contacts are formed for making electrical connections to source/drain regions of semiconductor devices. Contacts formed in accordance with some embodiments penetrate relatively deeply into the source/drain regions compared to contacts formed using conventional methods. Some epitaxial source/drain regions formed as described herein may have relatively short lateral widths, which can reduce the capacitance between the gate and the drain ($C_{GD}$), leading to improved performance. However, the shorter lateral widths may also increase the resistance of the epitaxial source/drain regions and the resistance of source/drain contacts ($R_{CSD}$), thereby degrading the performance of the device. In some embodiments, contacts formed as described herein may penetrate relatively deeply into the source/drain regions, thereby increasing the surface area between the contacts and the source/drain regions. In some embodiments, the surface area between the contacts and the source/drain regions may be increased by four times or more compared to contacts formed using conventional methods. Additionally, a material composition of the contacts may be selected to have a low resistivity. Accordingly, the resistance $R_{CSD}$ of the contacts may be reduced, which may lead to improved performance of the device.

A method is provided in accordance with some embodiments. The method includes forming a fin over a substrate, where a channel region of the fin comprises a plurality of conductive layers. The method also includes epitaxially growing a first source/drain region and a second source/drain region, wherein the channel region of the fin is disposed between the first source/drain region and the second source/drain region. The method also includes depositing a dielectric layer over the channel region of the fin. The method also includes patterning the dielectric layer to form an opening extending through the dielectric layer into the first source/drain region, where a bottom surface of the opening is disposed in the first source/drain region and is closer to the substrate than a bottom surface of a bottom conductive layer of the plurality of conductive layers. The method also includes filling the opening with one or more conductive materials to form an electrical connector. In an embodiment filling the opening with one or more conductive materials comprises: forming a silicide material lining the opening in the first source/drain region; depositing a first material to form a barrier layer over the silicide material and lining the opening; and filling the opening with a metal-containing material. In an embodiment the first material is titanium nitride and a resistivity of the first material is about 500 µΩ-cm to about 1000 µΩ-cm. In an embodiment filling the opening with one or more conductive materials comprises: forming a silicide material lining the opening in the first source/drain region; and filling the opening with a metal-containing material, wherein the metal-containing material contacts the silicide material. In an embodiment filling the opening with one or more conductive materials comprises: depositing silicide in the opening, wherein the silicide fills a portion of the opening that extends in the first source/drain region; and filling the opening with a metal-containing material, wherein the metal-containing material contacts the silicide. In an embodiment a first portion of the electrical connector extends in the first source/drain region and a second portion of the electrical connector overlies the first portion; and the first portion of the electrical connector is 100% formed of the silicide and the second portion of the electrical connector is 100% formed of the metal-containing material. In an embodiment filling the opening with one or more conductive materials comprises: depositing silicide in the opening, wherein the silicide fills a portion of the opening that extends in the first source/drain region; forming a barrier layer over the silicide, wherein the barrier layer contacts the silicide; and filling the opening with a metal-containing material, wherein the metal-containing material contacts the barrier layer. In an embodiment a first portion of the electrical connector extends in the first source/drain region and a second portion of the electrical connector overlies the first portion; and where the first portion of the electrical connector is 100% formed of the silicide and in a plane the second portion of the electrical connector is 80% formed of the metal-containing material and 20% formed of the barrier layer. In an embodiment the bottom surface of the opening is at least 3 nm closer to the substrate than the bottom surface of the bottom conductive layer of the plurality of conductive layers.

A method is provided in accordance with some embodiments. The method includes: etching a fin to form a first opening and a second opening, wherein a channel region of the fin is disposed between the first opening and the second opening; epitaxially growing a first source/drain layer in the first opening and a second source/drain layer in the second opening; forming a first dummy material over the first source/drain layer and a second dummy material over the second source/drain layer; depositing a first dielectric layer extending along sidewalls of the first dummy material and the second dummy material; depositing a second dielectric layer overlying the first dielectric layer; patterning the second dielectric layer to form a third opening and a fourth opening, the third opening exposing the first dummy material and the fourth opening exposing the second dummy material; selectively etching the first dummy material through the third opening to form a first cavity and expose the first source/drain layer, and selectively etching the second dummy material through the fourth opening to form a second cavity and expose the second source/drain layer; depositing first silicide in the first cavity and second silicide in the second cavity; and filling the portions of the third opening and the fourth opening that extend through the second dielectric layer with one or more conductive materials. In an embodiment the first silicide comprises titanium silicide, cobalt silicide, or nickel silicide. In an embodiment filling the portions of the third opening and the fourth opening that extend through the second dielectric layer with one or more conductive materials comprises: depositing a first material to form a first barrier layer lining the portion of the third opening that extends through the second dielectric layer and a second barrier layer lining the portion of the fourth opening that extends through the second dielectric layer; and filling the portions of the third opening and the fourth opening that extend through the second dielectric layer with a metal-containing material, wherein the metal-containing material comprises iridium, rhodium, tungsten, cobalt, or ruthenium. In an embodiment filling the portions of the third opening and the fourth opening that extend through the second dielectric layer with one or more conductive materials comprises: filling the portion of the third opening that extends through the second dielectric layer with a first metal-containing material and the portion of the fourth opening that extends through the second dielectric layer with a second metal-containing material, wherein the first metal-containing material contacts the first silicide and the second metal-containing material contacts the second silicide. In an embodiment the method further includes patterning the first silicide to extend the third opening into the first silicide; patterning the second silicide to extend the fourth opening into the second silicide; after patterning the first silicide, forming a first barrier layer lining the third opening; after patterning the second silicide, forming a second barrier layer lining the fourth opening; filling the third opening with a first metal-containing material; and filling the fourth opening with a second metal-containing material. In an embodiment the method further includes patterning the first silicide to extend the third opening into the first silicide; patterning the second silicide to extend the fourth opening into the second silicide; after patterning the first silicide, filling the third opening with a first metal-containing material, wherein the first metal-containing material contacts the first silicide; and after patterning the second silicide, filling the fourth opening with a second metal-containing material, wherein the second metal-containing material contacts the second silicide. In an embodiment the method further includes forming a spacer extending along a sidewalls of the fin, where the first cavity is defined at least in part by the spacer and the first source/drain layer. In an embodiment the first dummy material comprises aluminum oxide.

A device in accordance with some embodiments includes: a plurality of conductive layers disposed on a substrate, wherein each conductive layer of the plurality of conductive layers is separated from an adjacent conductive layer by a spacer; a first source/drain region and a second source/drain region disposed on opposite sides of the plurality of conductive layers; a dielectric layer overlying the first source/drain region, the second source/drain region, and the plurality of conductive layers; and an electrical contact extending through the dielectric layer and into the first source/drain region, wherein a first surface of the electrical contact is a surface of the electrical contact that is closest to the substrate, a first surface of the plurality of conductive layers is a surface of the plurality of conductive layers that is closest to the substrate, and the first surface of the electrical contact is closer to the substrate than the first surface of the plurality of conductive layers. In an embodiment the first surface of the electrical contact is at least 3 nm closer to the substrate than the first surface of the plurality of conductive layers. In an embodiment a first region of the electrical contact extends through the first source/drain region and a second region of the electrical contact extends through the dielectric layer, and in the second region the electrical contact is formed completely of a same metal-containing material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin over a substrate, wherein a channel region of the fin comprises a plurality of conductive layers;
   epitaxially growing a first source/drain region and a second source/drain region, wherein the channel region of the fin is disposed between the first source/drain region and the second source/drain region;
   depositing a dielectric layer over the channel region of the fin;
   patterning the dielectric layer to form an opening extending through the dielectric layer into the first source/drain region, wherein a bottom surface of the opening is disposed in the first source/drain region and is closer to the substrate than a bottom surface of a bottom conductive layer of the plurality of conductive layers; and
   filling the opening with one or more conductive materials to form an electrical connector.

2. The method according to claim 1, wherein filling the opening with one or more conductive materials comprises:
   forming a silicide material lining the opening in the first source/drain region;
   depositing a first material to form a barrier layer over the silicide material and lining the opening; and
   filling the opening with a metal-containing material.

3. The method according to claim 2, wherein the first material is titanium nitride and a resistivity of the first material is about 500 $\mu\Omega$-cm to about 1000 $\mu\Omega$-cm.

4. The method according to claim 1, wherein filling the opening with one or more conductive materials comprises:
   forming a silicide material lining the opening in the first source/drain region; and
   filling the opening with a metal-containing material, wherein the metal-containing material contacts the silicide material.

5. The method according to claim 1, wherein filling the opening with one or more conductive materials comprises:
   depositing silicide in the opening, wherein the silicide fills a portion of the opening that extends in the first source/drain region; and
   filling the opening with a metal-containing material, wherein the metal-containing material contacts the silicide.

6. The method according to claim 5, wherein a first portion of the electrical connector extends in the first source/drain region and a second portion of the electrical connector overlies the first portion; and
   wherein the first portion of the electrical connector is 100% formed of the silicide and the second portion of the electrical connector is 100% formed of the metal-containing material.

7. The method according to claim 1, wherein filling the opening with one or more conductive materials comprises:
   depositing silicide in the opening, wherein the silicide fills a portion of the opening that extends in the first source/drain region;

forming a barrier layer over the silicide, wherein the barrier layer contacts the silicide; and filling the opening with a metal-containing material, wherein the metal-containing material contacts the barrier layer.

8. The method according to claim 7, wherein a first portion of the electrical connector extends in the first source/drain region and a second portion of the electrical connector overlies the first portion; and wherein the first portion of the electrical connector is 100% formed of the silicide and in a plane the second portion of the electrical connector is 80% formed of the metal-containing material and 20% formed of the barrier layer.

9. The method according to claim 1, wherein the bottom surface of the opening is at least 3 nm closer to the substrate than the bottom surface of the bottom conductive layer of the plurality of conductive layers.

10. A method, comprising:

etching a fin to form a first opening and a second opening, wherein a channel region of the fin is disposed between the first opening and the second opening;

epitaxially growing a first source/drain layer in the first opening and a second source/drain layer in the second opening;

forming a first dummy material over the first source/drain layer and a second dummy material over the second source/drain layer;

depositing a first dielectric layer extending along sidewalls of the first dummy material and the second dummy material;

depositing a second dielectric layer overlying the first dielectric layer;

patterning the second dielectric layer to form a third opening and a fourth opening, the third opening exposing the first dummy material and the fourth opening exposing the second dummy material;

selectively etching the first dummy material through the third opening to form a first cavity and expose the first source/drain layer, and selectively etching the second dummy material through the fourth opening to form a second cavity and expose the second source/drain layer;

depositing first silicide in the first cavity and second silicide in the second cavity; and filling the portions of the third opening and the fourth opening that extend through the second dielectric layer with one or more conductive materials.

11. The method according to claim 10, wherein the first silicide comprises titanium silicide, cobalt silicide, or nickel silicide.

12. The method according to claim 10, wherein filling the portions of the third opening and the fourth opening that extend through the second dielectric layer with one or more conductive materials comprises:

depositing a first material to form a first barrier layer lining the portion of the third opening that extends through the second dielectric layer and a second barrier layer lining the portion of the fourth opening that extends through the second dielectric layer; and filling the portions of the third opening and the fourth opening that extend through the second dielectric layer with a metal-containing material, wherein the metal-containing material comprises iridium, rhodium, tungsten, cobalt, or ruthenium.

13. The method according to claim 10, wherein filling the portions of the third opening and the fourth opening that extend through the second dielectric layer with one or more conductive materials comprises:

filling the portion of the third opening that extends through the second dielectric layer with a first metal-containing material and the portion of the fourth opening that extends through the second dielectric layer with a second metal-containing material, wherein the first metal-containing material contacts the first silicide and the second metal-containing material contacts the second silicide.

14. The method according to claim 10, further comprising:

patterning the first silicide to extend the third opening into the first silicide;

patterning the second silicide to extend the fourth opening into the second silicide;

after patterning the first silicide, forming a first barrier layer lining the third opening;

after patterning the second silicide, forming a second barrier layer lining the fourth opening;

filling the third opening with a first metal-containing material; and filling the fourth opening with a second metal-containing material.

15. The method according to claim 10, further comprising:

patterning the first silicide to extend the third opening into the first silicide;

patterning the second silicide to extend the fourth opening into the second silicide;

after patterning the first silicide, filling the third opening with a first metal-containing material, wherein the first metal-containing material contacts the first silicide; and after patterning the second silicide, filling the fourth opening with a second metal-containing material, wherein the second metal-containing material contacts the second silicide.

16. The method according to claim 10, further comprising:

forming a spacer extending along a sidewalls of the fin, wherein the first cavity is defined at least in part by the spacer and the first source/drain layer.

17. The method according to claim 10, wherein the first dummy material comprises aluminum oxide.

18. A device, comprising:

a plurality of conductive layers disposed on a substrate, wherein each conductive layer of the plurality of conductive layers is separated from an adjacent conductive layer by a spacer;

a first source/drain region and a second source/drain region disposed on opposite sides of the plurality of conductive layers;

a dielectric layer overlying the first source/drain region, the second source/drain region, and the plurality of conductive layers; and an electrical contact extending through the dielectric layer and into the first source/drain region, wherein a first surface of the electrical contact is a surface of the electrical contact that is closest to the substrate, a first surface of the plurality of conductive layers is a surface of the plurality of conductive layers that is closest to the substrate, and the first surface of the electrical contact is closer to the substrate than the first surface of the plurality of conductive layers.

19. The device according to claim 18, wherein the first surface of the electrical contact is at least 3 nm closer to the substrate than the first surface of the plurality of conductive layers.

20. The device according to claim 18, wherein a first region of the electrical contact extends through the first source/drain region and a second region of the electrical contact extends through the dielectric layer, and in the second region the electrical contact is formed completely of a same metal-containing material.

* * * * *